United States Patent
Sadr

(10) Patent No.: US 8,981,908 B2
(45) Date of Patent: *Mar. 17, 2015

(54) RFID SYSTEMS WITH LOW COMPLEXITY IMPLEMENTATION AND PALLET CODING ERROR CORRECTION

(71) Applicant: Mojix, Inc., Los Angeles, CA (US)

(72) Inventor: Ramin Sadr, Los Angeles, CA (US)

(73) Assignee: Mojix, Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/047,989

(22) Filed: Oct. 7, 2013

(65) Prior Publication Data

US 2014/0218172 A1  Aug. 7, 2014

Related U.S. Application Data

(63) Continuation of application No. 11/971,678, filed on Jan. 9, 2008, now Pat. No. 8,552,835, which is a continuation-in-part of application No. 11/553,951, filed on Oct. 27, 2006, now Pat. No. 7,633,377.

(60) Provisional application No. 60/731,629, filed on Oct. 28, 2005, provisional application No. 60/884,197, filed on Jan. 9, 2007.

(51) Int. Cl.
*H04B 7/00* (2006.01)
*H04L 27/06* (2006.01)
(Continued)

(52) U.S. Cl.
CPC ......... *H04L 1/0045* (2013.01); *H03M 13/2957* (2013.01); *H03M 13/3905* (2013.01);
(Continued)

(58) Field of Classification Search
CPC .............. H03M 13/2957; H03M 13/3905; H03M 13/6331; H03M 13/098; G06K 7/10366; H04L 1/0045; H04L 27/0014
USPC ................. 340/10.1, 10.4, 5.61, 572.4, 10.3; 375/340, 262, 341
See application file for complete search history.

(56) References Cited

U.S. PATENT DOCUMENTS 5,040,191 A * 8/1991 Forney et al. ................. 375/263
5,369,404 A * 11/1994 Galton .......................... 341/143
(Continued)

FOREIGN PATENT DOCUMENTS

| JP | 2005136570 A | 5/2005 |
|---|---|---|
| WO | 9429990 A1 | 12/1994 |
| WO | 2005101652 A1 | 10/2005 |

OTHER PUBLICATIONS

International Search Report for International Application No. PCT/US2006/060339, filed Oct. 27, 2006, search completed Jul. 7, 2008, mailed Jul. 21, 2008, 2 pgs.

(Continued)

*Primary Examiner* — Omer S Khan
(74) *Attorney, Agent, or Firm* — KPPB LLP

(57) ABSTRACT

Systems and methods for decoding data transmitted by RFID tags are disclosed. One embodiment of the invention includes an analyzer and equalizer configured to filter an input signal, an estimation block configured to obtain a baseband representation of the modulated data signal by mixing the filtered input signal with the carrier wave, and a coherent detector configured to perform phase and timing recovery on the modulated data signal in the presence of noise and to determine a sequence of data symbols.

16 Claims, 37 Drawing Sheets

(51) Int. Cl.
*H04L 1/00* (2006.01)
*H03M 13/29* (2006.01)
*H03M 13/39* (2006.01)
*H03M 13/00* (2006.01)
*G06K 7/10* (2006.01)
*H04L 27/00* (2006.01)
*H03M 13/09* (2006.01)

(52) U.S. Cl.
CPC ....... *H03M13/6331* (2013.01); *G06K 7/10366* (2013.01); *H04L 27/0014* (2013.01); *H03M 13/098* (2013.01)
USPC ..... 340/10.1; 340/10.4; 340/5.61; 340/572.4; 340/10.3; 375/340; 375/262; 375/341

(56) References Cited

U.S. PATENT DOCUMENTS

| | | | |
|---|---|---|---|
| 5,684,832 A * | 11/1997 | Adachi et al. | 375/262 |
| 5,955,966 A | 9/1999 | Jeffryes et al. | |
| 6,233,290 B1 * | 5/2001 | Raphaeli | 375/341 |
| 6,750,757 B1 | 6/2004 | Gabig, Jr. et al. | |
| 6,836,472 B2 | 12/2004 | O'toole et al. | |
| 7,076,000 B2 | 7/2006 | Rodriguez | |
| 7,418,065 B2 | 8/2008 | Qiu et al. | |
| 7,599,441 B2 | 10/2009 | Ma et al. | |
| 7,633,377 B2 | 12/2009 | Sadr | |
| 8,400,271 B2 | 3/2013 | Sadr | |
| 8,552,835 B2 | 10/2013 | Sadr | |
| 2002/0057729 A1 | 5/2002 | Farbod et al. | |
| 2002/0113736 A1 | 8/2002 | Toutain et al. | |
| 2002/0122472 A1 | 9/2002 | Lay | |
| 2002/0159540 A1 | 10/2002 | Chiodini | |
| 2003/0138055 A1 | 7/2003 | Saito et al. | |
| 2004/0042539 A1 | 3/2004 | Vishakhadatta et al. | |
| 2005/0271165 A1 | 12/2005 | Geraniotis et al. | |
| 2005/0280508 A1 | 12/2005 | Mravca et al. | |
| 2006/0022800 A1 * | 2/2006 | Krishna et al. | 340/10.2 |
| 2006/0094391 A1 * | 5/2006 | Darabi | 455/323 |
| 2006/0103576 A1 | 5/2006 | Mahmoud et al. | |
| 2006/0170565 A1 | 8/2006 | Husak et al. | |
| 2007/0032241 A1 | 2/2007 | Busch et al. | |
| 2008/0186231 A1 | 8/2008 | Aljadeff et al. | |
| 2008/0197982 A1 | 8/2008 | Sadr | |
| 2009/0135800 A1 | 5/2009 | McPherson | |
| 2010/0310019 A1 | 12/2010 | Sadr | |
| 2012/0275546 A1 | 11/2012 | Divsalar | |
| 2013/0147608 A1 | 6/2013 | Sadr | |
| 2013/0202062 A1 | 8/2013 | Sadr et al. | |

OTHER PUBLICATIONS

Supplementary European Search Report for Application No. EP 06850079, International Filing Date Oct. 27, 2006, Search Completed Dec. 12, 2013, 7 pgs.

Written Opinion for International Application No. PCT/2006/060339, filed Oct. 27, 2006, Completed Jul. 17, 2008, Mailed Jul. 21, 2008, 4 pgs.

Chevillat et al., "Decoding of Trellis-Encoded Signals in the Presence of Intersymbol Interference and Noise", IEEE Transactions on Communications, 1989, vol. 37, No. 7, pp. 669-676.

Divsalar et al., "Multiple-Symbol Differential Detection of MPSK", IEEE Transactions on Communications, Mar. 1990, vol. 38, No. 3, pp. 300-308.

EPCGlobal, "EPC standard", Published Jan. 26, 2005, 94 pgs.

Forney, Jr., "Maximum-Likelihood Sequence Estimation of Digital Sequences in the Presence of Intersymbol Interference", IEEE Transactions on Information Theory, May 1972, vol. IT-18, No. 3, pp. 363-378.

Kerpez, "Viterbi Receivers in the Presence of Severe Intersymbol Interference", IEEE Xplore, downloaded on Jan. 21, 2009, pp. 2009-2013.

Makrakis et al., "Optimal Noncoherent Detection of PSK Signals", IEEE Electronics Letters, Mar. 15, 1990, vol. 26, No. 6, pp. 398-400.

Sadr et al., "Generalized Minimum Shift-Keying Modulation Techniques", IEEE Transactions on Communications, Jan. 1988, vol. 36, No. 1, pp. 32-40.

International Search Report and Written Opinion for International Application PCT/US2014/026707, International Filing Date Mar. 13, 2014, Report Completed Jun. 28, 2014, Mailed Aug. 1, 2014, 6 pages.

* cited by examiner

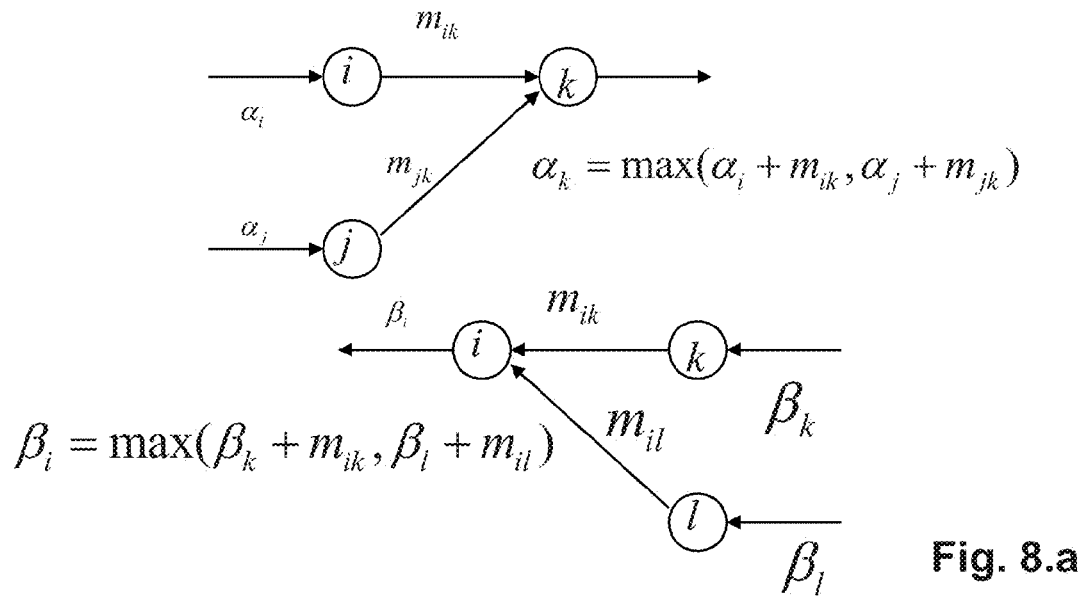
Fig. 8.a
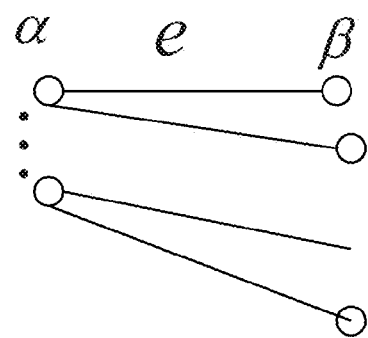
Fig. 8.b

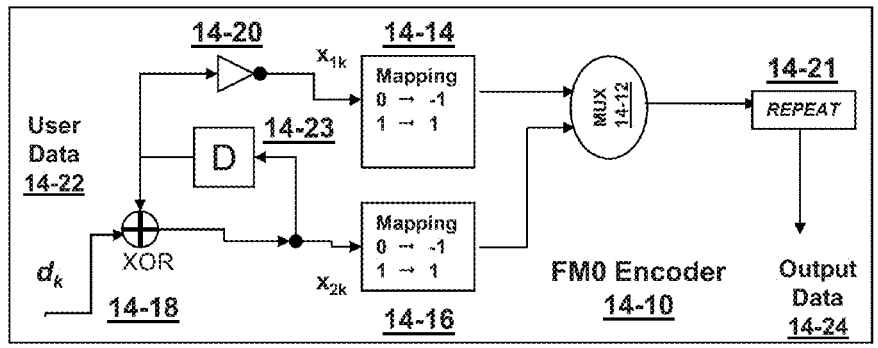
Fig. 14a
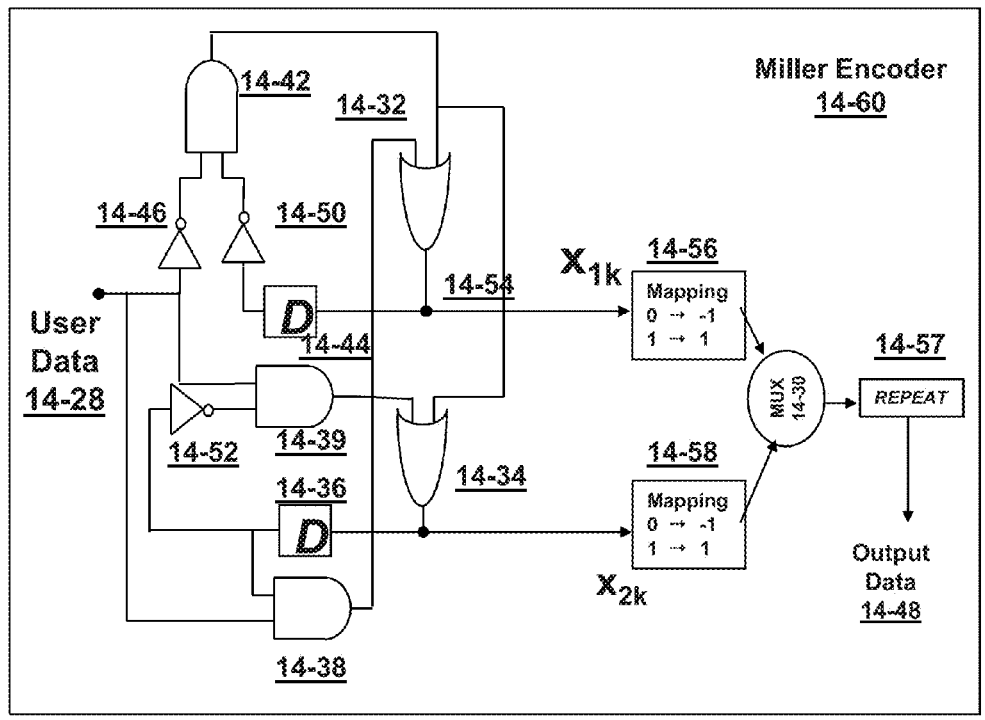
Fig 14.b

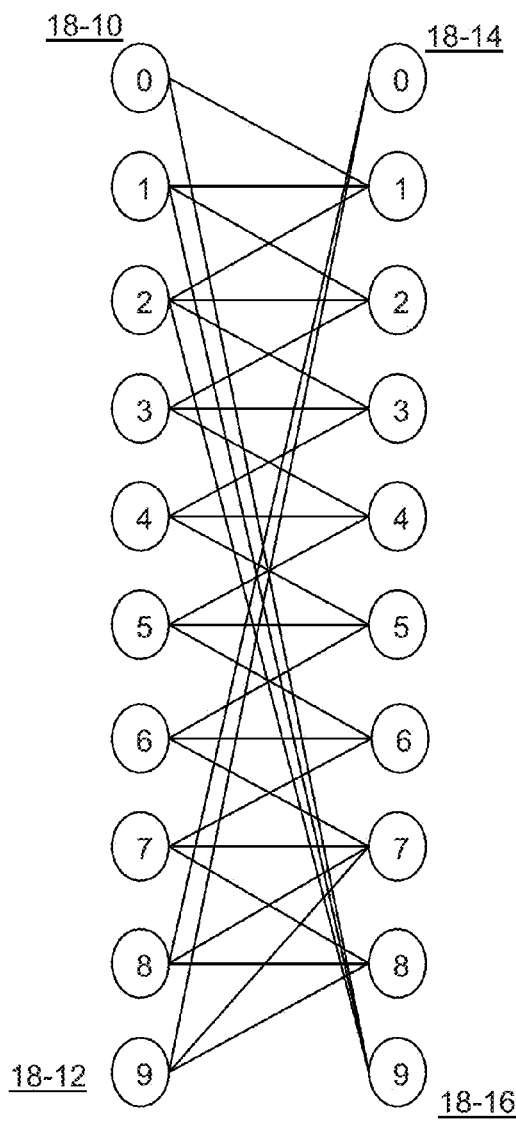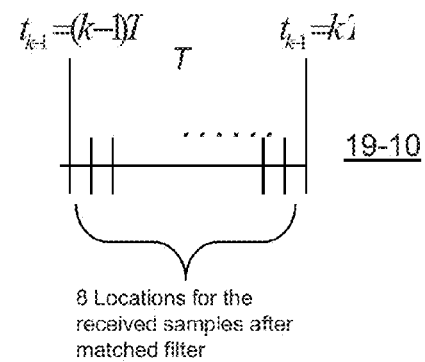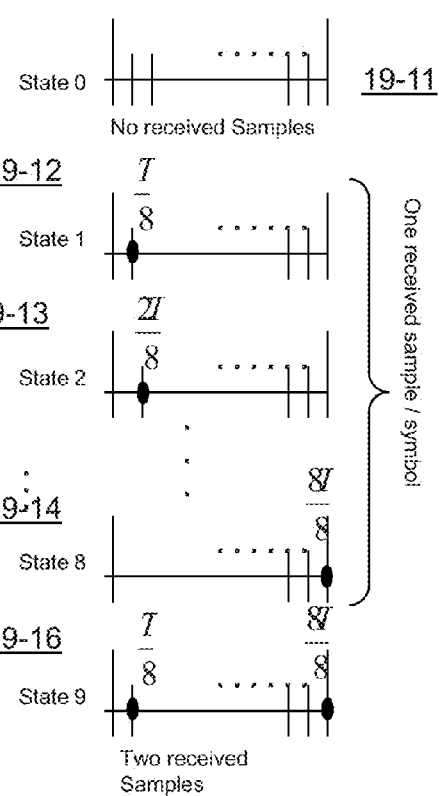
Figure 18
Figure 19

Note: Upwards arrows correspond to Δφ = +1 for forward updates, -1 for backwards.
Downwards arrows are for branches with Δφ = -1/+1 for forward/backward
Horizontal arrows correspond to Δφ = 0.

RFID SYSTEMS WITH LOW COMPLEXITY IMPLEMENTATION AND PALLET CODING ERROR CORRECTION

CROSS REFERENCE TO RELATED APPLICATIONS

This application is a continuation of U.S. patent application Ser. No. 11/971,678, filed Jan. 9, 2008, which is a continuation in part of U.S. patent application Ser. No. 11/553,951 filed Oct. 27, 2006 which claims the benefit of U.S. Provisional Application Ser. No. 60/731,629 filed Oct. 28, 2005. The current application also claims priority to U.S. Provisional Application Ser. No. 60/884,197, filed Jan. 9, 2007. The disclosure of U.S. patent application Ser. No. 11/971,678, U.S. patent application Ser. No. 11/553,951, U.S. Provisional Application Ser. No. 60/731,629, and U.S. Provisional Application Ser. No. 60/884,197 is incorporated herein by reference in its entirety.

BACKGROUND OF THE INVENTION

1. Field of the Invention

This invention is related to transmitter-receiver systems and in particular is related to systems for the detection of signals in difficult environments such as for use in sensory networks and Radio Frequency Identification (RFID) systems.

2. Description of the Prior Art

The detection of signals in difficult environments, such as where the signal to noise ratio is very low and/or the interference from other signals is very high, has always been a substantial problem. In many systems today classical detection theory is used in digital transceivers. In these systems the bit stream embedded in information bearing signal is detected one-bit at a time using a "matched filter" designed to match the signal waveform at the input of the receiver.

What is needed is a robust and powerful method for the detection of extremely weak signals with severe phase and timing ambiguities due to the source characteristics and propagation environment. The proposed system has substantially superior performance than the classical signal detector.

SUMMARY OF THE INVENTION

We describe methods for implementing high performance low-latency reader systems in the context of RFID inventory management systems. Principle elements of the system include a zero-intermediate frequency architecture, a carrier acquisition and cancellation loop, a coarse symbol timing recovery mechanism based on banks of parallel interpolating and correlating filters, a coherent soft-input soft-output carrier phase and timing recovery detector based on a Markov model of a received waveform, a non-coherent soft input hard output data detector, a software programmable low-complexity transmit waveform generator, and a forward error correction encoding scheme for RFID tag data.

All blocks have been designed to provide a high level of performance (in terms of the end goal of detecting signal in the presence of noise) for a given latency constraint. In this case the latency constraint is outlined by the protocol loop imposed by RFID standards for communication from tag to reader to exciter to tag. Often times it is the case that only a few tens of symbols of latency in this loop can be tolerated per specifications given in related standards. One such standard is the EPC Global's Generation II standard (ISO Standard 18000-6c) for radio frequency air interfaces.

One embodiment of the invention includes an analyzer and equalizer configured to filter an input signal, an estimation block configured to obtain a baseband representation of the modulated data signal by mixing the filtered input signal with the carrier wave, and a coherent detector configured to perform phase and timing recovery on the modulated data signal in the presence of noise and to determine a sequence of data symbols.

In a further embodiment, the analyzer and equalizer is configured to filter at least one source of narrowband interference from the input signal.

In another embodiment, the analyzer and equalizer includes a low latency notch filter, where the location of the notch can be moved to eliminate sources of narrowband interference from the input signal.

In a still further embodiment, the notch filter is implemented using a filter bank with an impulse response determined by a set of filter bank coefficients, and the analyzer and equalizer estimates the channel impulse response and uses it to determine the filter bank coefficients.

In still another embodiment, the notch filter is configured to adapt the location of the notch based upon an output of the detector.

In a yet further embodiment, the estimation block receives the carrier wave as an input.

In yet another embodiment, the estimation block is configured to estimate the frequency of the carrier wave.

In a further embodiment again, the estimation block is configured to control a programmable oscillator, and the estimation block is configured to estimate the frequency difference between the transmitted carrier wave and the output of the programmable oscillator and to reconfigure the programmable oscillator to reduce the frequency difference.

In another embodiment again, the coherent detector includes a coherent decoder that determines the sequence of symbols with the maximum a posteriori probability of having been transmitted given the data signal.

In a further additional embodiment, the coherent decoder is configured using a finite state machine to model the observation space.

In another additional embodiment, the finite state machine incorporates symbol phase estimation.

In a still yet further embodiment, the finite state machine incorporates symbol timing estimation.

In still yet another embodiment, the data signal is channel coded, and the coherent decoder includes a soft metric estimator, a de-interleaver, a soft input soft output (SISO) decoder, an interleaver, and a channel code decoder. In addition, the soft metric estimator is configured to calculate initial soft metrics using the data signal and a fixed phase value, timing value and channel state estimated by the channel code decoder during a previous iteration, the de-interleaver is configured to de-interleave an input generated by subtracting the output generated by the interleaver in a previous iteration from the initial soft metrics, the SISO decoder is configured to generate updated soft metrics using the output of the de-interleaver, the interleaver is configured to interleave an input generated by subtracting the output of the de-interleaver from the updated soft metrics, the channel code decoder is configured to estimate a phase value, a timing value and channel state from the output of the interleaver, and the coherent decoder is configured to iterate until the initial soft metrics and the updated soft metrics converge.

In a still further embodiment again, the coherent decoder determines the maximum soft metric and outputs the maximum soft metric, and the coherent decoder uses predetermined probabilities to augment at least some of the maximum soft metrics.

In still another embodiment again, the channel code decoder includes a soft input soft output forward error correction decoder.

In a still further additional embodiment, the sequence of symbols includes a preamble known by the receiver, the coherent detector includes an interpolator that is configured to sample and interpolate the data signal to generate a plurality of streams possessing different symbol rates, the coherent detector includes a correlator that is configured to select a stream using at least the correlation between the stream and the known preamble, and the coherent detector is configured to provide the selected stream to a decoder.

In still another additional embodiment, at least a portion of the sequence of symbols is constrained to a predetermined set of allowed symbol transitions, and the correlator is configured to select a stream using at least the correlation between the stream and the known preamble and the correlation between the stream symbol transitions and the allowed symbol transitions.

A yet further embodiment again includes an exciter in a first location configured to activate an RFID tag, and a receiver in a second location for receiving information from an activated RFID tag. In addition, the exciter and the receiver are configured to communicate via at least one wireless link, and the receiver is configured to provide information to transmit to an activated RFID tag that is responsive to information decoded from signals received from the activated RFID tag to the exciter via the wireless link.

In yet another further embodiment again, the receiver is configured to perform phase and timing recovery on a signal received from an activated RFID tag.

In a yet further additional embodiment, the receiver is configured to decode information received from an activated RFID tag by determining the sequence of symbols with the maximum a posteriori probability of having been transmitted based upon the signal received from the activated RFID tag.

In yet another additional embodiment, the exciter is configured to activate an RFID tag using a signal that includes a carrier wave, and the receiver is configured to estimate the frequency of the carrier wave and to extract the estimated carrier wave from the signal received from an activated RFID tag.

A further additional embodiment again includes a modulation encoder including an RF transmitter, and a digital transmit waveform generator. In addition, the digital transmit waveform generator includes a waveform look up table that contains information concerning the shape of half of the waveform of a plurality of time symmetric waveforms, and the modulation encoder is configured to transmit via the RF transmitter one of the plurality of waveforms by mirroring in time the information concerning the shape of one of the half waveforms contained in the waveform look up table.

In another additional embodiment again, the digital transmit waveform generator further comprises a ramp-up-ramp-down block that is configured to generate a waveform mirroring in time one of the half waveform contained in the look up table.

An embodiment of the method of the invention includes activating the RFID tag using an exciter located in a first location, receiving a message from the RFID tag using a receiver located in a second location, transmitting acknowledgement information from the receiver to the exciter via a wireless link, transmitting a message indicative of the acknowledgement information to the RFID tag using the exciter, and receiving a signal from the activated RFID tag containing the data encoded on the RFID tag using the receiver.

A further embodiment of the method of the invention also includes performing phase and timing recovery on signals received from the activated RFID tag by the receiver.

Another embodiment of the method of the invention also includes determining the sequence of symbols with the maximum a posteriori probability of having been transmitted by the activated RFID tag based upon the signal received from the activated RFID tag.

In a still further embodiment of the method of the invention activating the RFID tag further comprises activating the RFID tag using a signal including a carrier wave.

Still another embodiment of the method of the invention also includes estimating the carrier wave and extracting the estimated carrier wave from signals received from the RFID tag by the receiver and the transmitter.

Another further embodiment of the invention includes an analyzer and equalizer configured to filter an input signal, an estimation block configured to obtain the data signal by extracting the carrier wave from the filtered input signal, and a non-coherent detector configured to perform timing recovery on the modulated data signal in the presence of noise and to determine a sequence of data symbols.

In still another further embodiment, the non-coherent detector includes a non-coherent decoder that selects from the set of all possible symbol combinations for a short sequence the symbol combination that maximizes a non-coherent combining relation.

In yet another further embodiment, the non-coherent combining relation determines the data symbols by selecting the values for $x_{1,i}$ and $x_{2,i}$ that maximize the following metric:

$$\text{Metric} = \left| \sum_{i=k-N+2}^{k+1} (r_{2,i-1} x_{2,i-1} + r_{1,i} x_{1,i}) \right|$$

where:

$r_{1,i}$ is the received component in the first half of a symbol interval after removal of an estimate of the DC value of the received signal; and $r_{2,i}$ is the received component in the second half of a symbol interval after removal of an estimate of the DC value of the received signal $x_{1,i}$ is a hypothesis for the waveform of the first half of a symbol interval resulting from the modulation of the data value i using the modulation scheme used to modulate the data signal onto the carrier wave; and $x_{2,i}$ is a hypothesis for the waveform of the second half of a symbol interval resulting from the modulation of the data value i using the modulation scheme used to modulate the data signal onto the carrier wave.

BRIEF DESCRIPTION OF THE DRAWINGS

FIG. 2b is a model of a SISO implementation of the system shown in FIG. 2a.

FIG. 3b is a loop filter for the carrier offset recovery circuit in FIG. 3a.

FIG. 8a is an illustration of a Single State Trellis Transition

FIG. 8b is an illustration of a Trellis Section.

FIG. 13b is a block diagram of a reader/interrogator of FIG. 13a.

FIG. 14a is block diagram of FM0 encoder for RFID applications.

FIG. 14b is block diagram of Miller encoder for RFID applications.

FIG. 18 shows a first method for a timing trellis section for pulses with time varying duration.

FIG. 19 shows timing tick marks for the method FIG. 18.

DETAILED DESCRIPTION OF A PREFERRED EMBODIMENT

Receiver subsystems may provide enhanced detection of signals where some latency may be tolerated, particularly for use in sensory networks and passive Radio Frequency Identification (RFID) based systems. Such systems may use iterative processing techniques with soft-input-soft-output (SISO) components to combine channel decoding with equalization, demodulation, phase tracking, symbol timing and synchronization and interference cancellation. This is achieved with exchange of probabilities or "soft information" or equivalently the probability of correct detection of transmitted symbols based on the observed vector, at any given state of a finite state machine (FSM) which models the observation space. The evolution of FSM in time domain results into a planar graph referred to here as the "Trellis". In the presence of additive white Gaussian noise (AWGN) with random phase and timing, the performance of the receiver using SISO approaches that of an ideal coherent receiver. In the presence of other channel anomalies such as multipath, fading and jamming, the performance gain is much greater than conventional systems. The SISO decoders described here can also be used for applications where serial or parallel concatenated channel coding methods is employed.

The system disclosed herein may use iterative algorithms that can be applied to a broad range of sensory class of signals and waveforms. Iterative processing techniques with soft-input-soft-output (SISO) components may be used to combine channel decoding with equalization, demodulation, phase tracking, symbol timing and synchronization and interference cancellation. This is achieved with exchange of probabilities or "soft information". When the transmitted sequence is produced from a binary symmetric source (BSS) and in presence of additive white Gaussian noise (AWGN), channel distortion, random phase and synchronization error, the performance of the receiver converges to the ideal coherent receiver for un-coded signal. In presence of other channel anomalies such as multipath, fading and jamming, the expected performance gain is much greater than conventional systems. The overall SISO decoders described here can also be used for applications where serial or parallel concatenated channel coding methods are employed.

Figure 1:
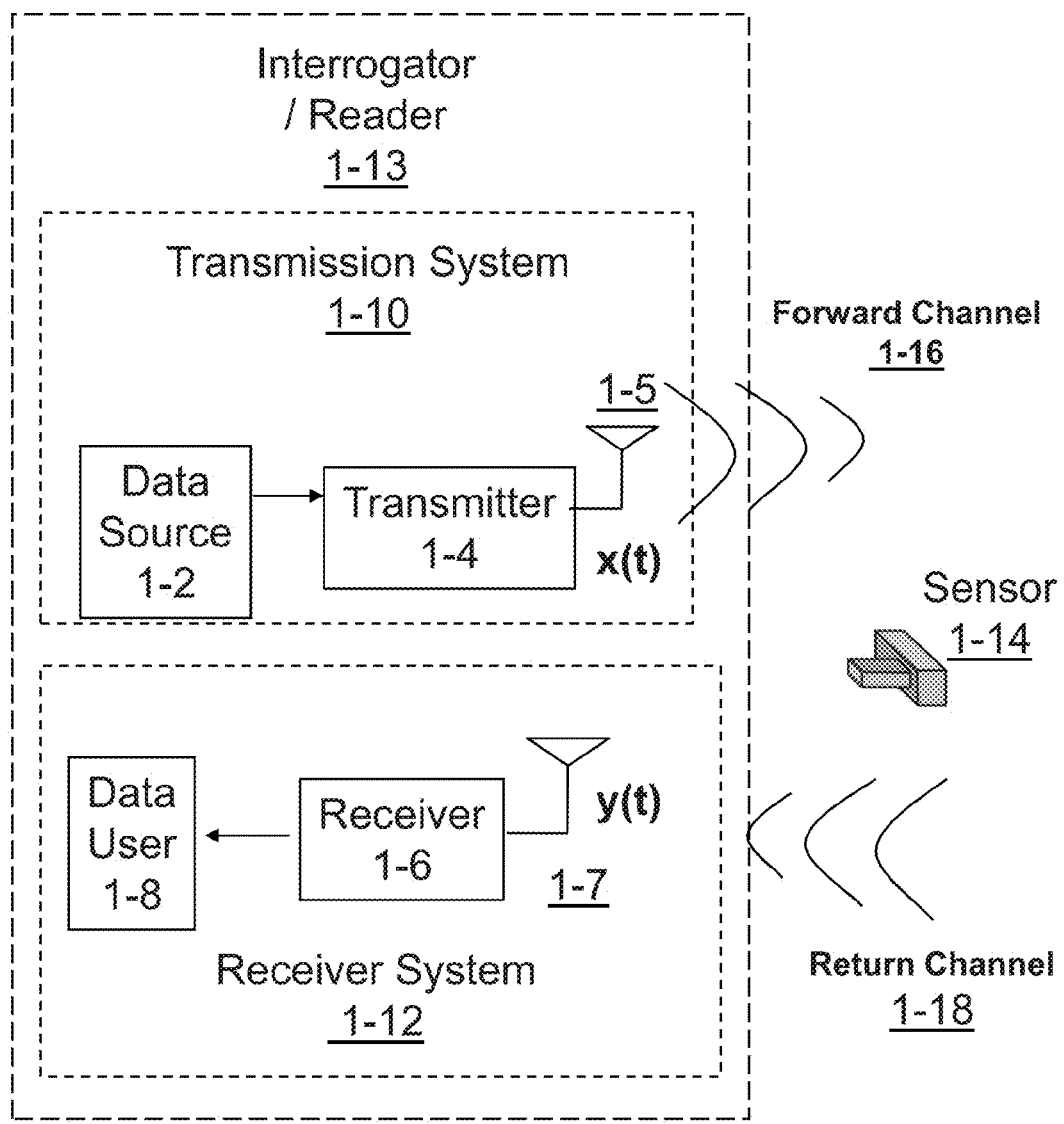
FIG. 1 is a simplified block diagram of an RF transmitter-receiver system and passive sensor.

Referring now to FIG. 1, transmission system 1-10 transmits a signal in forward channel 1-16, such as an RF channel, which is applied to sensor 1-14 which may be an RFID tag. The transmitted signal x(t) in forward channel 1-16 may be modeled as the real part of the complex transmitted signal, that is $x(t)=Real[a(t)e^{j(\omega_c t+\theta)}]$ for $t \in [nT_{sym},(n+1)T_{sym})$; where $T_{sym}$ denotes the symbol time interval, a(t) may be complex or real-valued information bearing signal and $\theta$ denotes the phase of the transmitted signal during the symbol time. This phase can be time varying from symbol to symbol. In passive RFID tag applications, the transmitted and received waveforms are independent, however, the power transmitted from the tag 1-14 depends on the power of the signal from the reader and the tag efficiency to convert its received power to available transmit power back to the reader. In active sensors, the transmitted and received signals are typically mutually independent signals.

Transmission system 1-10 includes data source 1-2 of transmission system 1-10 is used to modulate transmitter 1-4. Antenna 1-5 applies the modulated signal through forward channel 1-16 to the sensor 1-14. Typically in RFID applications the transmitter 1-4 and the data source 1-2 form the interrogator or the reader in RFID networks. Data source 1-2 is used by the reader to embed an address and/or command sequence to the device such as RFID tag 1-14. In backscatter passive RFID tags, the transmitted signal may also embed a sinusoidal signal with a continuous waveform (CW), which may be used to supply power to passive RFID tag. RFID tag 1-14 may then respond back with a data sequence, based on the received command, through the air which is illustrated as the Return Channel 1-18. The main function of the receiver system 1-12 is to detect the data transmitted from the sensor 1-14, in presence of various distortions encountered in the return channel 1-18 such as multi-path and/or natural and man-made interference. Receiver system includes receiving antenna 1-7 which applies the signal received from RFID tag 1-14 to receiver 1-6. The detected data from receiver 1-6 may then be consumed by the user 1-8. In RFID applications the data user is the reader which passes the data to a higher layer protocol for interpretation of the received packet. For passive RFID tags, transmission system 1-10 and receiver system 1-12 may be referred to as "reader/interrogator" 1-13.

The underlying transmitter receiver pair, reader/interrogator 1-13, is shown in FIG. 1. The signal is transmitted over a communication channel with the impulse response h(t) and corrupted with additive white Gaussian noise (AWGN) n(t), the received signal y(t) is modeled as:

$$y(t)=x(t)*h(t)+n(t) \quad (1)$$

where '*' represents the convolution operation.

Figure 2A:
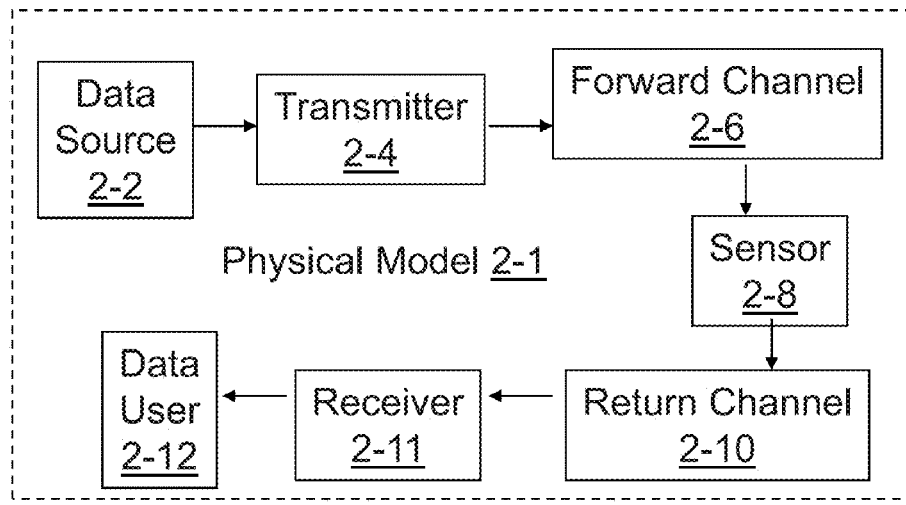
FIG. 2a is a simplified block diagram of an end to end communication system of the type shown in FIG. 1.

Referring now to FIG. 2, an end-to-end communication system physical block diagram model 2-1 for a sensory signal is shown in FIG. 2a and includes data source 2-2 which feeds the modulator in the transmitter 2-4. This signal is applied via forward channel 2-6 to sensor 2-8. Only in the case when the transmitted signal from sensor 2-8 is a partially amplified version of the original signal, the impulse responses is the composite impulse response of the forward and return channel, i.e. $h_f(t)*h_r(t)$. In passive RFID applications, typically the tag may only use the signal from the reader to power itself. The return signal from the tag uses the backscatter modulation to modulate the electronic product code or a response back to the reader, in which case the channel impulse response is only limited to the return channel transfer function 2-10. The receiver 2-11 detects the incoming bit stream and outputs it to the user data 2-12.

In discrete time domain, we represent the sampled version of this complex received signal at time n as for the $k^{th}$ packet or frame as an N-dimensional vector, $$y_k = H_k x_k + n_k \quad (2)$$

Here $y_k$ denotes the received complex vector with dimension N obtained from uniform sampling of the received signal complex signal (after down-conversion) as $y(nT_s)$, where $T_s$ denotes sampling interval, and the aggregate channel transfer function represented as $$H = \begin{pmatrix} h_1 & 0 & \ldots & 0 \\ 0 & h_1 & h_2 & \ldots \\ \vdots & 0 & \ddots & \vdots \\ 0 & 0 & 0 & h_1 \end{pmatrix} \quad (3)$$

Channel response matrix H may be real-or-complex valued constant, or belong to certain class of randomly distributed functions to model in-door or out-door multi-path channel response.

The sequence error probability may be minimized, which is equivalent to maximizing the a posteriori error probability conditioned on the sequence of observation. The estimated transmitted symbols are:

$$\hat{a}_n = \underset{a_n \in \Psi}{\operatorname{argmax}} P(a_n \mid y) \quad (4)$$

where, $\Psi$ represents the input symbol alphabet.
By applying Bayes rule we have $$P(a_k = \alpha \mid y) = \sum_{\forall a \ni a_k = \alpha} \frac{P(y \mid a)}{P(y)} P(a). \quad (5)$$

If $\Psi = \{0,1\}$ then let log likelihood ratio $$\Lambda_1(a_n) = \log \frac{Pr(a_n = 1 \mid y_k)}{Pr(a_n = 0 \mid y_k)}. \quad (6)$$

Using Bayes formula and eliminating Pr(y), we obtain reliability or "extrinsic" information $$\Lambda_1(a_n) = \lambda_1(a_n) + \lambda_2(a_n), \quad (7)$$

where $$\lambda_1(a_n) = \log \frac{Pr(y \mid a_n = 1)}{Pr(y \mid a_n = 0)}$$

represents the "extrinsic information" and $$\lambda_2(a_n) = \log \frac{Pr(a_n = 1)}{Pr(a_n = 0)}$$

represents a priori log likelihood ratio (LLR) values. The sequence $\lambda_1(a_n)$ is calculated in each iteration, and is the function of soft metric calculation block 4-8 shown in FIG. 4. In a SISO decoder, such as decoder 4-2 shown in FIG. 4, the a posteriori probability of each transmitted symbol may be computed and then subtracted from the reliability information to remove the influence of a priori information. The extrinsic information may then be fed back (and de-interleaved if channel encoding is used) for metric calculations for the next iteration, where:

$$\lambda_2(a_n) = \Lambda_2(a_n) - \tilde{\lambda}_1(a_n) \quad (8)$$

$$= \log \frac{Pr(a_n = 1 \mid y)}{Pr(a_n = 0 \mid y)}$$

where tilde (~) denote values from the last decoding state. In presence of unknown random phase and timing, it may be necessary to consider the input and output joint probability distribution functions $Pr(a,\phi,\tau \mid y)$ in which the optimization problem formulated in equation (4) becomes $$(\hat{a}_n, \hat{\phi}_n, \hat{\tau}_n) = \underset{(a_n, \phi_n, \tau_n) \in \Psi}{\operatorname{argmax}} P(a_n, \phi_n, \tau_n \mid y) \quad (8a)$$

where, $\Psi$ represents set of all values that $a_n, \phi_n, \tau_n$ can take.

Figure 2B:
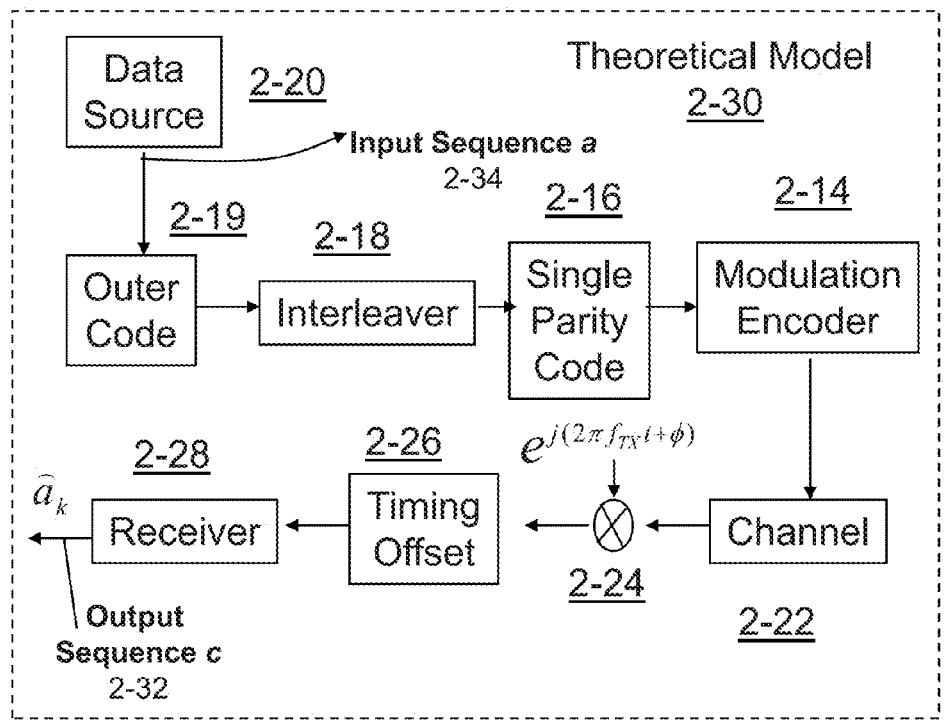

Referring now to FIG. 2b, in theoretical model 2-30, the performance of the overall RFID system may be enhanced by applying a simple and novel channel coding to the user data. This coding technique may include the use of an outer code 2-19, the interleaver 2-18 and a single parity check code 2-16, defined latter which is used to drive the modulation encoder over the channel. As an example, the outer code may be a repetition code (simply taking the input data of size M and repeating it q times where q>1). The input data of size M bits may be partitioned into N equal size subsequences each of size M/N. Each subsequence is copied (repeated) q times (for example say q=3) then permuted by non-identical interleavers each of size M/N, all repeated and permuted subsequences enter a single parity check (SPC) with Nq input and one output. The output sequence of SPC may be of size M/N. The call output sequence may be considered as a parity sequence. Note that for this example the interleaver 2-18 is plurality of interleavers that can be more than one. The N data subsequences and the parity sequence may then be multiplexed to generate a sequence of length M+M/N that enters the modulator encoder namely FM0, Miller, or any other modulator encoder used or to be used in the RFID system. It must be noted that 2-19, 2-18 and 2-16 are optional in the event it is desired to attain a coding gain in RFID systems.

The SISO decoder shown may be considered to be a device that maps an input sequence a to an output sequence c based on a finite state machine. If the coding scheme of 2-19, 2-18 and 2-16 is employed the SISO decoder will be designed to account for the outer code 2-19, interleaver 2-18, single parity code 2-16 and modulation encoder 2-14 when modeling the FSM for data encoder. The SISO decoder is embedded in the receiver 2-28. The outer code 2-19, the interleaver 2-18 and the single parity code 2-16 constitute a channel coding scheme that further take advantage of SISO decoder for the receiver realization in 2-28. A possible method of the channel coding technique for RFID applications is to apply the channel coding method to the RFID tag's identifier prior to writing into its memory, for passive RFID tags types that are written only once and read many times. In the case of write and read many times RFID tags, the encoder (that is 2-19, 2-18 and 2-16) can be implemented in the tag, or the reader can pre-encode the desired stored information when writing into the tag. When the information is retrieved from the tag, that is when the reader reads the tag, the RFID tag transmits the stored information through channel 2-10 back to the reader. The coding gain is realized in this case by virtue of the structure of the stored information in the tag.

In addition, the SISO decoder may jointly estimate a random phase modeled by $\phi$ in the complex multiplier in combiner 2-24 (frequency is estimated in a separated block described below). Timing offset, inherently present in any receiver subsystem and particularly in wireless systems, may be modeled in timing offset 2-26, with multi-path propagation characteristics. For channel model 2-22, a finite state machine may be used to represent the channel with memory as shown in channel matrix in equation (3).

When the data signal received by a receiver is modulated onto a carrier wave, the energy of the carrier wave is usually considerably greater than the energy of the data signal. Detecting the data signal can be facilitated by attempting to mix the received signal down to a zero intermediate frequency. In a number of embodiments, mixing down to a zero intermediate frequency is achieved by mixing the received signal with a signal having the same frequency as the carrier wave (i.e. extracting the carrier wave). Systems in accordance with many embodiments of the invention utilize separate transmitters and receivers that communicate wirelessly. As a result, the wireless receivers are typically not synchronized to the frequency of the carrier wave of the transmitter. A wireless receiver can attempt to estimate the frequency of the carrier wave of a received signal and use the estimate to extract the carrier wave from the received signal.

Figure 3A:
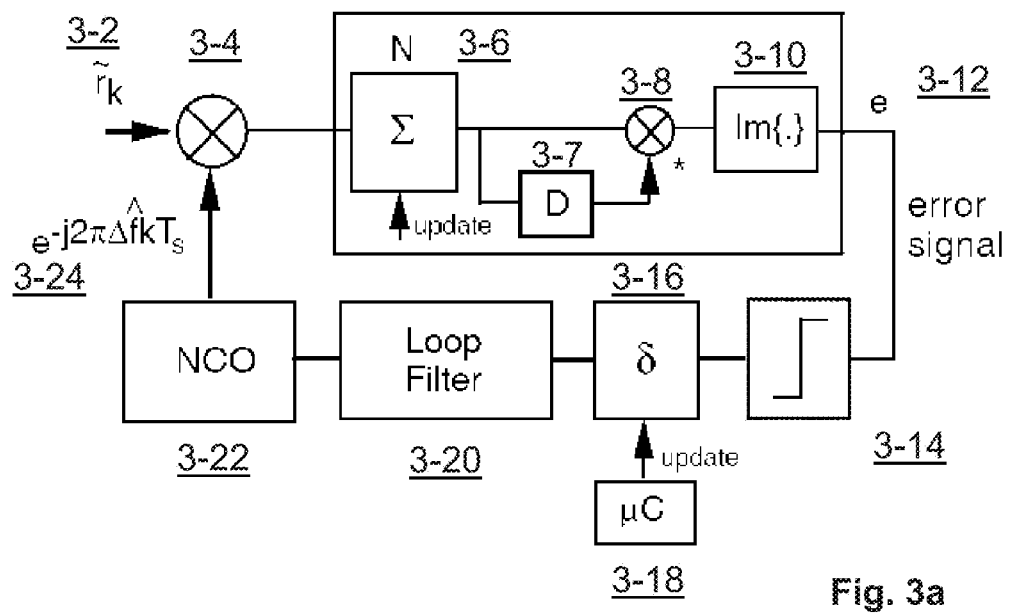
FIG. 3a is a diagram of a carrier offset recovery circuit to enable a zero-if architecture.

Referring now to FIG. 3a, a method of acquiring a carrier signal whose frequency differs from the receiver's assumption of the transmitted carrier by an amount defined as $f_{TX} - f_{RX} = \Delta f$ is illustrated. This situation occurs whenever separate crystal references are used at transmitter and receiver in order to implement a target carrier frequency (a situation that occurs when RFID exciters are not physically wired to an RFID reader).

We note that RFID systems often operate in conjunction with a protocol that creates a data loop from tag to reader to exciter to tag. Another common constraint is that a tag will not allow more than a few tens of symbol times from the point of its last transmission to the point where is receives a response from the reader through the exciter. This implies that latency in the aforementioned loop is an important consideration in RFID system design. Among equally performing techniques, those that provide lower latency are in general superior to those with higher latency. Though it is not always explicitly mentioned, the methods and apparatus of the inventions described herein have been devised to maximize performance for a given latency tolerance.

Figure 3B:
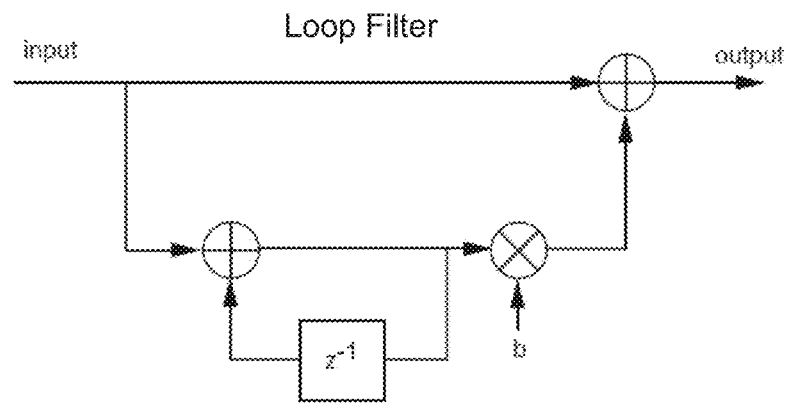

The received signal 3-2 (after having been mixed down by receiver carrier frequency estimate $f_{RX}$) is mixed again by estimate $\Delta \hat{f}$. The result of mixing operation 3-4 is summed over N time instance 3-6, stored in a delay element 3-7 complex conjugated and multiplied 3-8 with the result of the sum over the next N time instances. The imaginary part of this result is taken 3-10 which produces error signal 3-12. The error signal is hard limited to ±1 3-14. This result is then multiplied by a micro-controlled 3-18 programmable constant 3-16. Next, the loop filter of FIG. 3b is applied to the signal. The loop filter has transfer characteristic $$F(z) = 1 + \frac{b}{1 - z^{-1}}$$

(where b is also a programmable constant). The loop filter output is then used to control the rate at which the numerically control oscillator 3-22 oscillates to produce frequency estimate $\Delta \hat{f}$. In other embodiments, the carrier extraction can occur using a single mix down process with a voltage controlled oscillator that has a center frequency tuned to $f_{Rx}$, and which is altered by the loop an amount equal to $\Delta \hat{f}$. In many embodiments, other circuitry is used to estimate the frequency of the carrier wave and to perform carrier wave extraction.

Figure 4A:
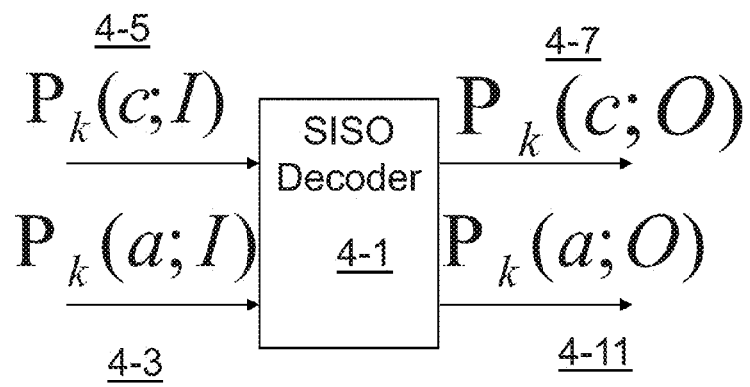
FIG. 4a is a diagram of a SISO decoder as a 4-Port Device.

Referring now to FIG. 4a, a SISO decoder such as SISO decoder 4-1 can be viewed as a four port device. The input to the SISO decoder 4-1 is the joint probability of channel output 4-5 and transmitted symbol sequence 4-3. The output of SISO decoder 4-1 is the joint probability of channel output 4-7 and transmitted symbol sequence 4-11. The input symbol $a=(a_k)$ with $k \in \aleph$ ($\aleph$ is the set of integers) drawn from a finite alphabet $A = \{\tilde{a}_1, \tilde{a}_2, \ldots, \tilde{a}_N\}$ with a-priori probability $\Pr(a)$. Let $c=(c_k)$ and $k \in \aleph$ is the sequence of output drawn from alphabet $C=\{\tilde{c}_1, \tilde{c}_2, \ldots, \tilde{c}_N\}$ with a priori probability $Pr(c)$. The SISO decoder 4-1 accepts at the input the sequence of probability distributions and outputs the sequences of probability distributions, namely: the input probabilities $P_k(a;I)$ in 4-3, $P_k(c;I)$ 4-5 and output probabilities $P_k(a;O)$ 4-11, $P_k(c;O)$ 4-7.

Figure 4B:
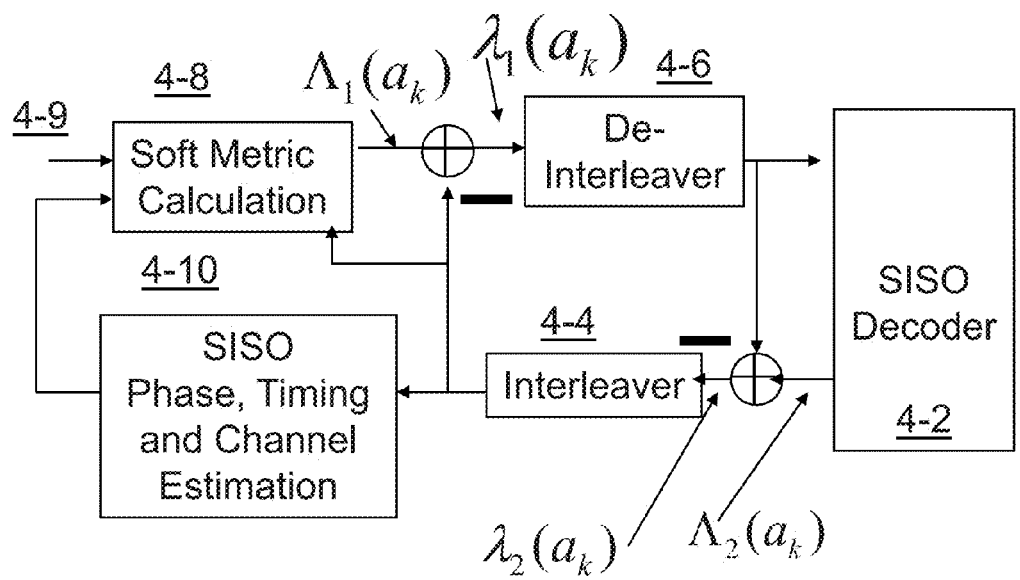
FIG. 4b is a block diagram of SISO processing with interleaving and de-interleaving.

Referring now to FIG. 4b, a SISO decoder 4-2 is illustrated for use when the proposed channel coding scheme is employed. The input to SISO decoder 4-2 is fed by computing equation (8), shown as the input to the de-interleaver 4-6. Input values of the De-interleaver 4-6 and the output of the interleaver 4-4 are the computed values from the last decoding iteration of the SISO decoder. The soft metric calculation may be performed by computing equation (7) in soft metric calculator 4-8 using the observed signal 4-9 and for a fixed phase value, timing and the channel state from step 4-10. The function and structure of the interleaver 4-4 and de-interleaver 4-6 is dictated by the repetition rate of the outer code and discussed below. At the end of each iteration the SISO decoder 4-2 outputs $\Lambda_2(a_n)$ s multiple outputs which may then be subtracted from the output of 4-6 and fed to the interleaver block 4-4 to compute the input metric for the next iteration, used in 4-10 and 4-8. This process may be repeated until the SISO decoder 4-2 converges, at which time the extrinsic information is output for decoding the output stream.

Recursive computation of these input and output joint probability distribution functions, namely: $P_k(a;I)$, $P_k(a;O)$, $P_k(c;O)$ and $P_k(c;I)$ may be made possible by modeling the received symbols as output from a discrete-time finite-state Markov process source. The state of the source at time t is denoted by $S_{\theta}^t$ and its output by Y. A state sequence of the source extending from time t to t' is made possible based on the underlying finite state machine model. The corresponding output forms a first order Markov chain, i.e., $$Pr(S_\theta^{t+1} | S_\theta^t, S_\theta^{t-1}, \ldots, S_\theta^1) = Pr(S_\theta^{t+1} | S_\theta^t) \quad (9)$$

Figure 5:
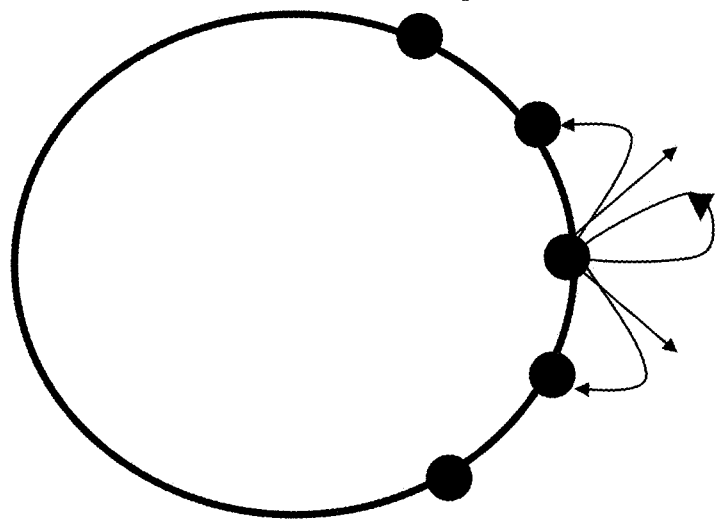
FIG. 5 is an illustration of Quantized Phase Space.

Referring now to FIG. 5, for the purpose of phase sequence estimation and open loop tracking, the phase space may be quantized into $Q^\phi$ equally spaced intervals and denoted as:

$$\Theta^\phi = \left\{0, \frac{\pi}{M}, \frac{2\pi}{M}, \ldots, \frac{(M-1)2\pi}{M}\right\} \quad (10)$$

The phase sequence can be modeled as a random walk around the unit circle, that is a Markov process: $\phi_n = \phi_n + \Delta\phi$ mod $2\pi$, where $\phi_n \in \Theta^\phi$ and $\Delta\phi$ can be modeled as discrete random variable taking values in the quantized phase space from a known probability density function (i.e. quantized Gaussian, Tikhanov or etc.). The probability of such a phase transition may be denoted as $p_{ij}$.

The M distinct states of the Markov source are indexed by the integer m, $m=0, 1, \ldots, (M-1)$ with probability transition matrix:

$$P = \begin{pmatrix} p_{11} & p_{12} & \cdots & p_{1M} \\ p_{21} & p_{22} & & \vdots \\ \vdots & & \ddots & \\ p_{M1} & p_{M2} & & p_{MM} \end{pmatrix} \quad (11)$$

Where $$\sum_{i=1}^{M} p_{ij} = 1$$

and $p_{ij}=p_{ji}$, i.e. matrix is symmetric and doubly Markov.

Figure 6:
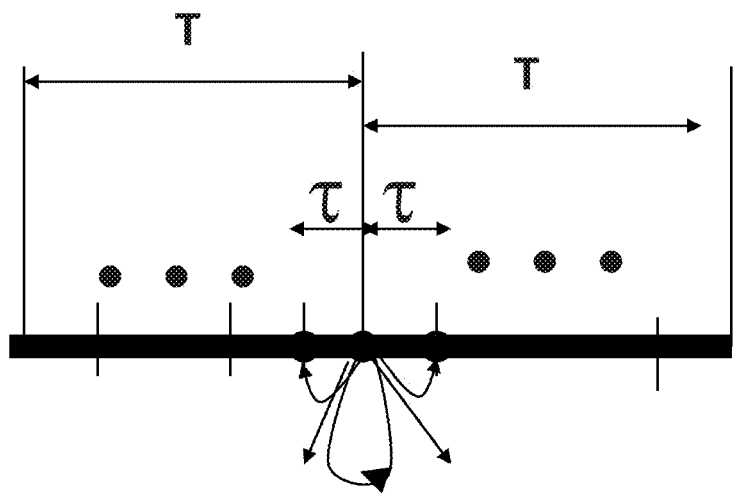
FIG. 6 is an illustration of Quantized Time Domain.

Referring now to FIG. 6, the symbol duration $Q^\tau$ may be quantized into equally spaced intervals for time and synchronization. The timing space may be represented as:

$$\Theta^\tau = \{\tau, \pm 2\tau, \pm 3\tau, \ldots\} \quad (12)$$

Let:

$$\Upsilon = \left\{ \bigcup_{i=1}^{V} (t \in [nT_{sym} \pm i\tau, (n+1)T_{sym} \pm (i+1))\right\}$$

represent the ensemble of all possible symbol timing intervals where V is the cardinality of the set of i such that $$|nT_{sym} \pm i\tau| < \frac{(nT_{sym} - (n+1)T_{sym})}{2}.$$

Then J represents any member of set $\gamma$, i.e. $J \in \gamma$.

For assigning the transition probability matrix P for phase tracking, it is possible to use the classical theory of phased-lock-loops where distribution of state phase error and clock stability from the oscillator can be computed or estimated. Thus matrix P and can be pre-computed based on a single transition probability from one timing state to another. For assigning the transition probability matrix P for symbol timing, a geometric distribution can also be used $$\left(\text{i.e.} \frac{\partial}{M^n}\right.$$

where $\partial$ is a constant such that $$\left.\sum_{n=1}^{M} \frac{\partial}{M^n} = 1\right).$$

Assuming the channel impulse response length of L, at each time instance $k=1, 2, \ldots, N$ the state of the channel is a random variable with the property of the memory present in the system that, given Sk, the state Sk+1 can only assume one of two values corresponding to a +1 or −1 being fed into the tapped delay line at time k. Thus, given a binary input alphabet $\{+1,-1\}$ the channel can be in one of $2^L$ states ri, $i=1, 2, \ldots, 2^L$; corresponding to the $2^L 2L$ different possible contents of the delay elements. This set may be denoted by $\Theta^h$ the set of possible states. Additionally, let $\Theta^e$ represent the set of possible states of modulation encoder or line encoder or differential encoder.

Let the product space $$\Omega = \Theta^e \otimes \Theta^h \otimes \Theta^\tau \otimes \Theta^h \quad (13)$$

represent the space of all possible states of the system, where $\otimes$ denotes the Cartesian product and N the cardinality of $\Omega$.

Figure 7:
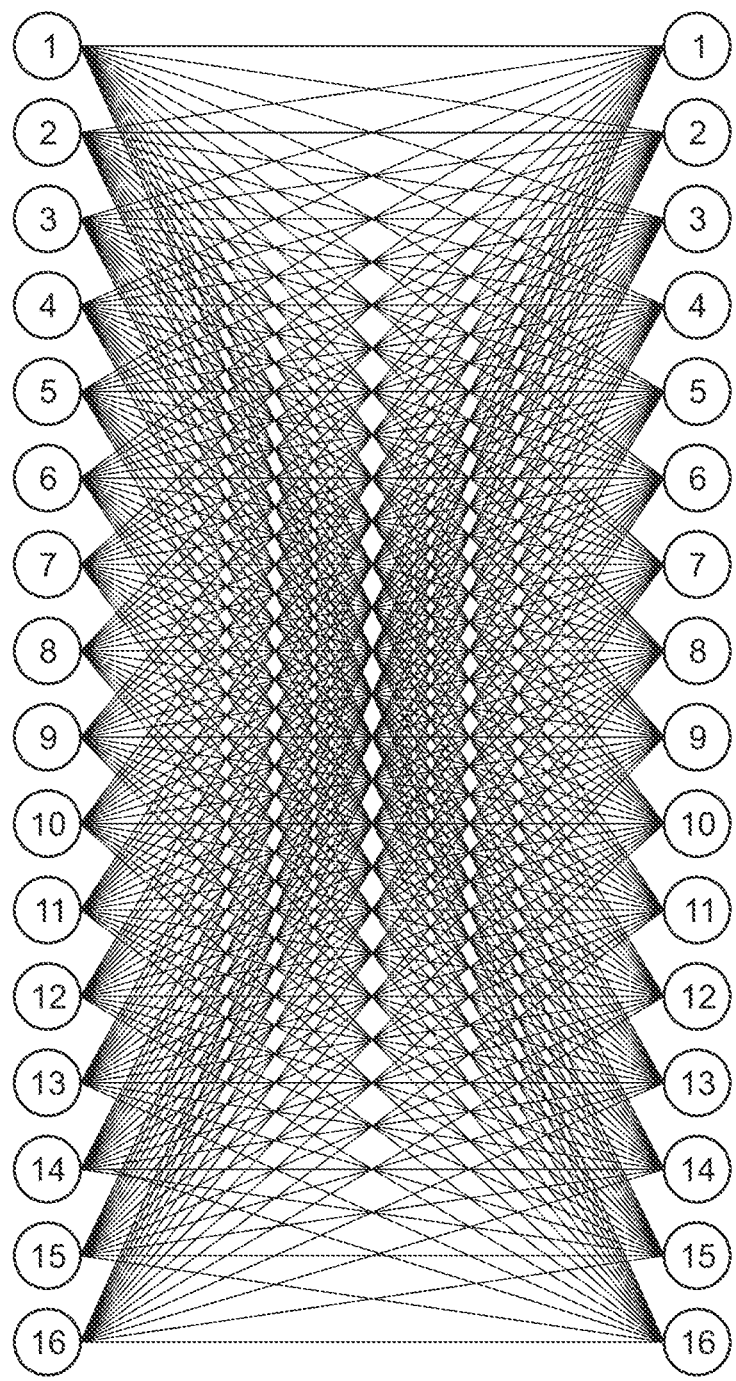
FIG. 7 is an illustration of Example of Trellis Diagram.

Referring now to FIG. 7, the possible evolution of states $S'' \in \Omega$ can thus be described in form of a trellis diagram. An example of such a trellis structure for a 16-state trellis diagram is illustrated in FIG. 7, where there are 16 transitions from each state of the trellis to the other.

The state transitions of the Markov source are governed by the transition probabilities. In which case for the forward and backward log probabilities of the SISO decoder may be defined as follows:

$$\alpha_k(S) = \max_{e:\ S^n(e) \in \Omega} \{\alpha_{k-1}(S^s(e)) + \qquad (14)$$

$$\prod_k (a(e); I) + \prod_k (c(e); I) + \prod_k (c(e); O)\}$$

$$\beta_k(S) = \max_{e:S^n \in \Omega} \{\beta_{k-1}(S^E(e)) + \prod_{k+1} (a(e); I) +$$

$$\prod_{k+1} (c(e); I) + \prod_k (c(e); O)\}$$

∀k=1, . . . , N, where $\Pi_k(c;I) = \log(P_k(c;I))$, $\Pi_k(a;I) = \log(P_k(a;I))$ $\Pi_k(c;O) = \log(P_k(c;O))$, $\Pi_k(a;O) = \log(P_k(a;O))$ (15)

This maximization is over all the edges e connected to a state selected from the ensemble of all possible states connected in the trellis. Equation (14) in log domain can be represented as:

$$\prod_k (c; 0) = \max_{e:\ c(e)=c} \{\alpha_{k-1}(S^s(e)) + \prod_k (a(e); I) + \beta_k(S^E(e))\} + h_c \qquad (16)$$

$$\prod_k (a; 0) = \max_{e:\ a(e)=a} \{\alpha_{k-1}(S^s(e)) + \prod_k (c(e); I) + \beta_k(S^E(e))\} + h_u$$

and initial values $$\alpha_0(S) = \begin{cases} 0 & s = S_0 \\ -\infty & \text{Otherwise} \end{cases}, \qquad (17)$$

$$\beta_n(S) = \begin{cases} 0 & s = S_n \\ -\infty & \text{Otherwise} \end{cases}$$

The quantities $h_c$ and $h_u$ are normalization constants to limit the range of the numerical values of α and β. The set of states $\Xi = \{S_1, S_2, \ldots, S_n\}$ and edges $E = \{e_1, e_2, \ldots, e_k\}$ represent all possible transitions between the trellis states. $S^s(e)$ denotes all the starting states for the transition e∈E to the ending state $S^E(e)$ with input symbol a(e) corresponding to the output symbol c(e).

Referring now to FIG. 8a, the operation for computation of $\alpha_k$ and $\beta_k$ for the binary case is illustrated in FIG. 8a, i.e. two transitions to traverse from state $S_k$ to $S_{k+1}$. In each iteration, the forward and backward log probabilities may be computed by considering the Trellis structure in FIG. 8a, that is $\alpha_k = \max(\alpha_i + m_{ik}, \alpha_j + m_{jk})$ $\beta_j = \max(\beta_k + m_{jk}, \beta_l + m_{jl})$ (18)

In order to compute the extrinsic information for each bit as shown in FIG. 8b, the input bit sequence may simply be written as:

$$\prod_k (a; 0) = \max_{\substack{All\ edges \\ \to a=1}} \{\alpha + m + \beta\} - \max_{\substack{All\ edges \\ \to a=0}} \{\alpha + m + \beta\} \qquad (19)$$

and the extrinsic for the output code is:

$$\prod_k (c; 0) = \max_{\substack{All\ edges \\ \to c=1}} \{\alpha + m + \beta\} - \max_{\substack{All\ edges \\ \to c=0}} \{\alpha + m + \beta\} \qquad (20)$$

The branch metric m is computed as:

$$m = \left(a \prod (a; I) + c_1 \prod (c_1; I) + \qquad (21)\right.$$

$$\left. \ldots + c_r \prod (c_r; I) + \prod (c_1; \phi) + \prod (c_1; \tau)\right)$$

where r represents the index to the selected element of channel symbol output of c.

This establishes the equivalency of the SISO decoder as shown in FIG. 3 and computation of equations (18) through (21).

Figure 9A:
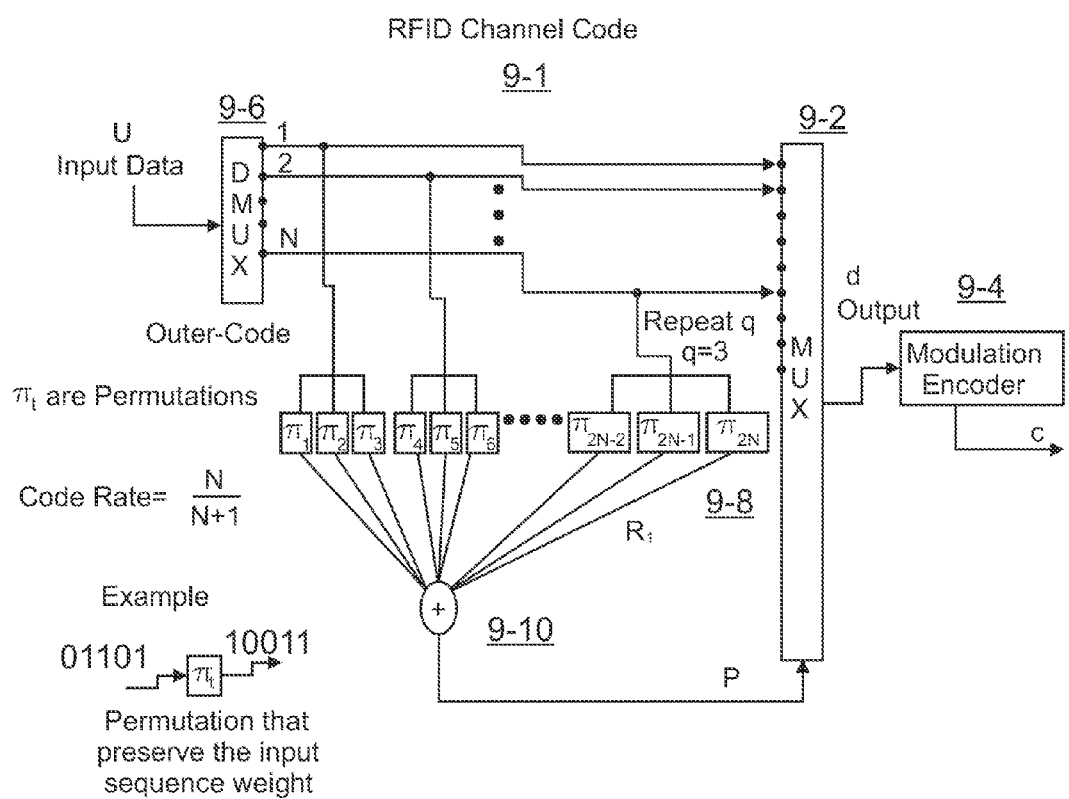
FIG. 9a is a block diagram of Single Parity Check Code (SPC).

Referring now to FIG. 9a, the structure of Single Parity Check (SPC) code is given. The input stream of size M is de-multiplexed in demux 9-6 into blocks of N subsequences of length M/N. Each subsequences optionally are permuted with N interleavers each of size M/N prior to entering MUX 9-8. These "optional" interleavers (e.g., tags) together with interleavers prior to single parity check code can be used to provide security for RFID system. This method provides a highly secure RFID system The N data subsequences as described before are repeated q times and permuted with Nq interleavers. The output of the interleaved blocks are all exclusive OR'ed together in combiner 9-10 to form a single parity check sequence of length M/N which is multiplexed in MUX 9-2 to form a serial output stream. The outputs of multiplexer 9-2 are then fed into the modulation encoder 9-4 (which may be FM0 or Miller code). The interleaver blocks 9-8 in this figure each are designed to preserve the Hamming weight of the input vector at the output of interleaver. The repetition q and the code rate defined in this case as N/(N+1) are design parameters chosen for desired length of the output sequence and coding gain. Presently RFID tag identifiers range anywhere from 24-bits to 2048-bits vectors, that is the output block size of the encoder. The input data U, the input to de-multiplexer 9-6, once encoded forms a vector of length M+M/N.

Figure 9B:
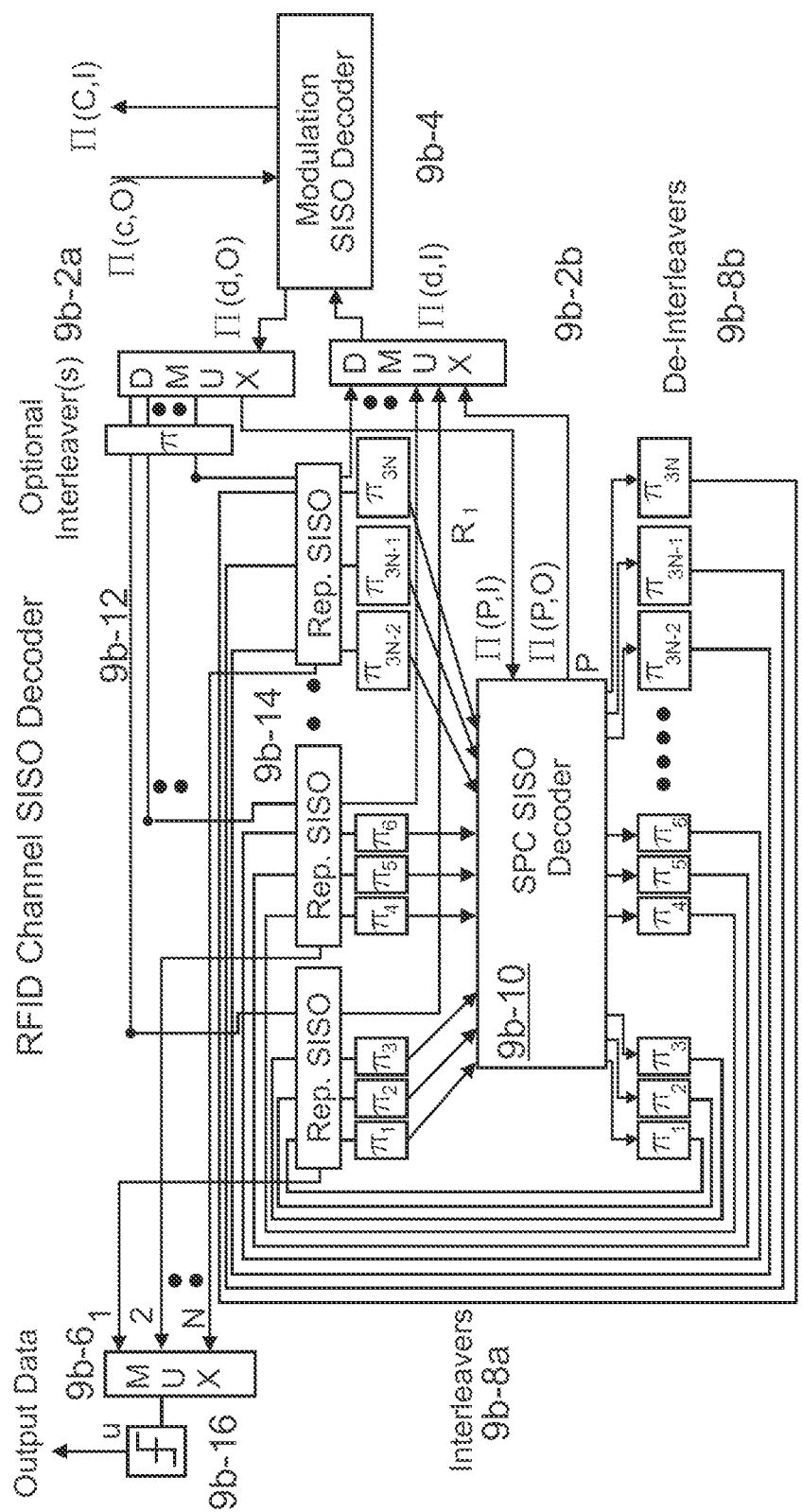
FIG. 9b is a block diagram of an RFID SISO Decoder.
Figure 9C:
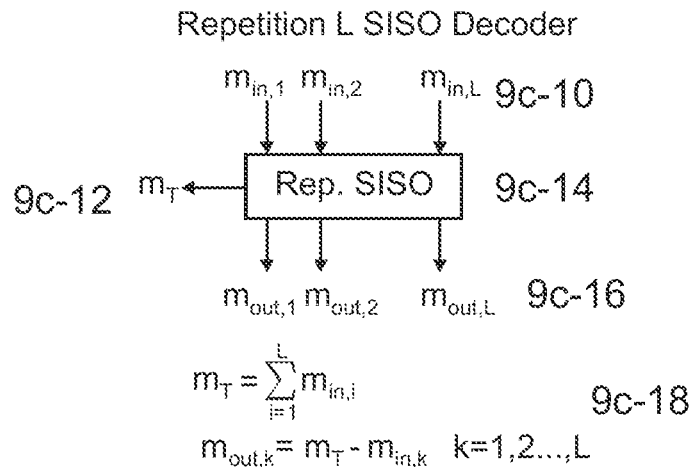
FIG. 9c represents the detailed operation of a SISO decoder for repetition code.
Figure 9D:
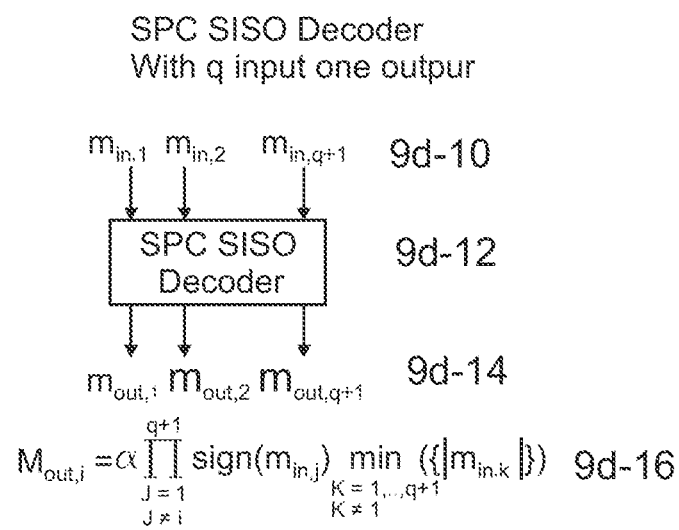
FIG. 9d illustrates the operation of a SISO decoder for SPC.

Referring now to FIG. 9b, the structure of Single Parity Check (SPC) decoder is illustrated as an RFID channel SIS) Decoder. The soft output stream of size M+M/N from SISO modulation decoder is de-multiplexed in demux 9b-6 into blocks of N+1 subsequences of length M/N. The first N subsequences de-interleaved through the "optional" N de-interleavers each of size M/N which were used to provide security for RFID system. Knowing these permutation represent secure keys for RFID system, the N soft data subsequences after the "optional" de-interleavers may be repeated q times and permuted with Nq interleavers. The output of the interleaved blocks are all collected together with soft outputs from DEMUX 9b-2b for parity bits enter to the SISO single parity check decoder in SISO decoder 9b-10 to generate soft outputs. The N+1 soft output subsequences from SISO single parity check decoder each of length M/N enters Nq de-interleavers 9b-8b. The soft output of de-interleavers enters the SISO repetition decoder. The output of the repetition decoder enter the "optional" interleavers. The output of the "optional" interleaver, together with soft output for parity bits from SISO SPC, are multiplexed in MUX 9b-2b to form a serial output stream. The outputs of multiplexer 9b-2b are then fed into the SISO modulation decoder 9b-4 (e.g. FM0 or Miller decoder). This process goes through several iterations. The output and input of SISO for repetition decoder are summed to provide reliability for input subsequences data streams. The N subsequence streams are input to de-multiplexer 9b-6. The output of the demultiplexed processes are input to hard decision device 9-16 to generate decoded bit stream U. The detailed operation of SISO decoder for repetition code is shown in FIG. 9c in steps 9c-10, 9c-12, 9c-14, 9c-16 and 9c-18. The detailed operation of SISO decoder for SPC is shown in FIG. 9d in steps 9d-10, 9d-12, 9d-14 and 9p-16.

Figure 10:
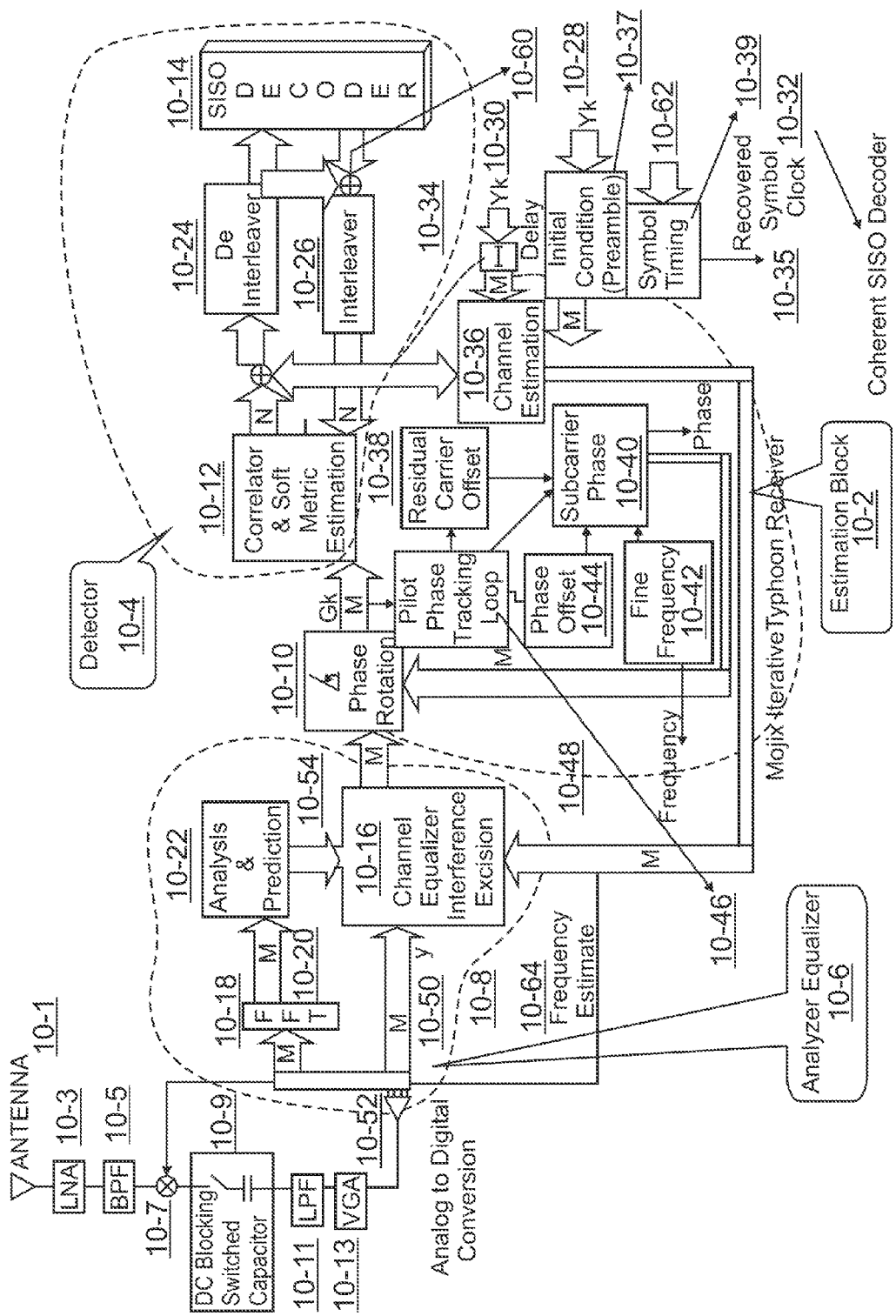
FIG. 10 is a block Coherent SISO Decoder.

Referring now to FIG. 10, coherent SISO receiver 10-10 is disclosed. In this case the extrinsic and intrinsic and branch metrics respectively are represented by the set of equations in equations (18) to (21). Callouts indicate the function of each processing subsystem, the analyzer and equalizer block diagram is shown in 10-6, the estimation block in 10-2 and the detector in 10-4. The input signal may have traversed airspace or a wired infrastructure to reach the receiver, there is no limitation in terms of the transport mechanism into the system. In the particular embodiment shown, an air interface antenna 10-1 passes received energy through a low-noise amplifier 10-3 and then through a bandpass filter 10-5. Next, a mixer 10-7 downconverts the signal from radio frequency to baseband to implement a zero-if architecture. A key component to this is the switch DC blocking capacitor 10-9. This capacitor, or bank of capacitors, has its switched closed only when a signal of interest is anticipated to be on air. The resulting baseband signal (with DC rejected) then propagates through a low pass filter 10-11 and into a variable gain amplifier 10-13.

The received signal is then converted from an analog to a digital domain 10-52. The resulting digital signal is then fed to the channel equalizer and interference canceller filter bank in input 10-8. In many embodiments, the symbol lengths are sufficiently long that the signal experiences very little frequency dependent fading due to multipath interference. The signal can, however, be corrupted by narrowband sources of interference. In one embodiment, the interference canceling filter consists of a low latency, yet tunable (in terms of rejection frequency), infinite impulse response filter that can be tuned to cancel a source of narrowband interference. In many embodiments, the tunable filter is tuned in based upon the impulse response of the channel. In other embodiments, the tunable filter is adaptive based upon information provided by the SISO decoder 10-14. The output of the equalization and interference canceller filter bank 10-8 is then rotated via a vector phase rotation (vector complex multiplication) 10-10. The output of 10-10 is used to compute the soft metric values which then feeds the SISO decoder 10-14.

The theory of operation of a coherent SISO decoder may be described as follows: the observed vector 10-50 y is obtained from serial to parallel conversion 10-52 of the received signal to form the vector 10-50. The size M indicated in 10-50 is chosen as the length of the samples in the received packet, or for practical consideration, a convenient length for the desired hardware complexity. The signal 10-50 is fed to channel equalizer 10-16 which is composed of a modulated filter bank. The filter bank transfer function is selected for typical deployment scenario to match the propagation environment and use case scenario. In particular the filter bank can be used to excise in-band interference after the interferer(s) has (have) been identified by the signal analysis and prediction block 10-22. The signal from channel equalizer 10-16 is rotated in phase by rotator 10-10 and fed into the correlator and soft metric estimation block 10-12. When channel coding is used, the output of estimation block 10-12 is subtracted from the output of the interleaver as discussed above with regard to FIG. 4 and processing in blocks 4-6 and 4-4. The de-interleaver 10-24 and interleaver block 10-26 are matched to the channel encoder interleaver block used for encoding the data in 9-8, when an optional mode when used. The signal from the de-interleaver 10-24 is fed into the SISO receiver 10-14. After each iteration, the output of the SISO decoder 10-14 is input to the interleaver 10-26 whose output is fed into the channel estimation block 10-36 and to the metric computation block 10-12. The channel estimation block 10-36 decodes the channel impulse response in equation (3) and is used to update the filter bank coefficients in the channel equalizer and interference excision block 10-16. The received vector y 10-50 (also denoted as $Y_k$ where the index k denotes the iteration index in 10-30) is also fed into clocks 10-34, 10-28, 10-39 and 10-37. In delay 10-34, the signal is delayed to match the latency required by each iteration as the input data for the channel estimation block. In 10-37 the observed vector is used to detect the preamble sequence and initialize the symbol timing block 10-39. The symbol timing block 10-39 is updated in each iteration from 10-62 which is the same signal as 10-60, which is the output of the SISO decoder. The output of the symbol timing block 10-39 produces a square wave output 10-35 which is used a reference symbol clock source throughout the system. If there is a residual carrier in the waveform, as in some RFID standards, tracking loop 10-46 is used to extract the CW and compute the phase offset from the ideal carrier frequency in carrier offset block 10-38. If a subcarrier is used, as in some RFID standards, the output of carrier offset block 10-38 is further enhanced by estimating an additional phase offset term from the subcarrier phase, by performing fine frequency tracking in 10-42 and by computing the phase offset in phase offset block 10-44. The frequency estimate from fine frequency block 10-42 may a also be fed back to FFT 10-18 to update the spectral estimate of the signal for the next iteration.

In an optional mode, it may be desirable to additionally also perform frequency domain equalization in each iteration of the SISO decoder as shown in detector 10-4. This functionality may be enabled in the presence of fast frequency fading channels in which the signal may suffer fast fades during a single symbol interval. In an RFID system, these may be caused by conveyor belts, fast moving tunnel highways or moving vehicles. In this case the estimated impulse response state may be fed to the equalizer coefficient estimation block that feeds the FFT block to compensate for fading and multipath effects.

Figure 11:
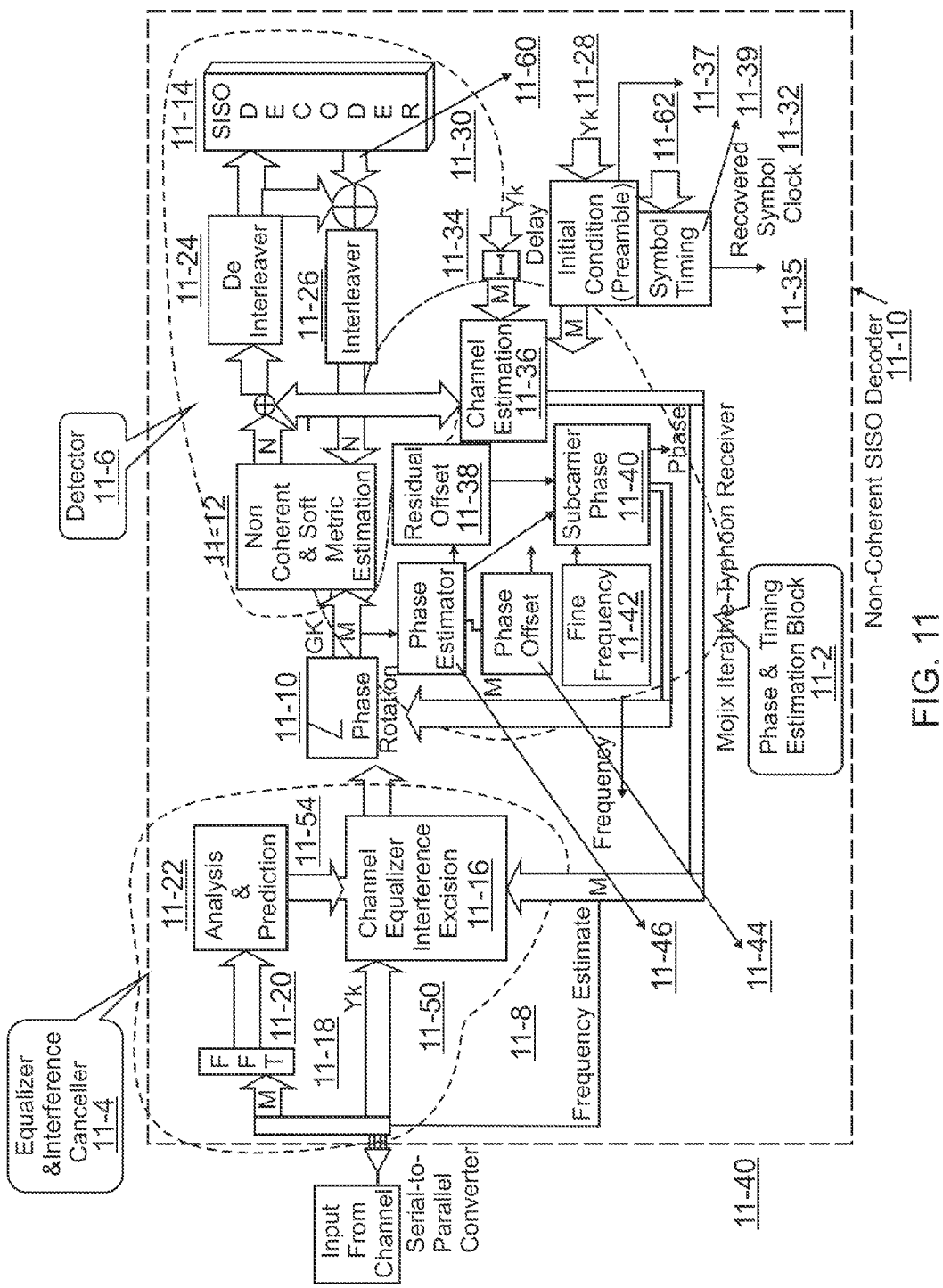
FIG. 11 is a block Non-Coherent SISO Decoder.

Referring now to FIG. 11, non-coherent SISO receiver 11-10 is disclosed. The operation of all the computational blocks, namely, 11-18, 11-20, 11-22, 11-16, 11-10, 11-46, 11-44, 11-42, 11-40, 11-38, 11-36, 11-34, 11-37, 11-39, 11-54, 11-46, 11-40, 11-60, 11-62, are the same as in 10-18, 10-20, 10-22, 10,16, 10-10, 10-46, 10-44, 10-42, 10-40, 10-38, 10-36, 10-34, 10-62, 10-37 and 10-39. The channel equalizer and interference canceller 11-16 is similar to the coherent block 10-16, except the input channel estimates may now be based on the non-coherent estimation bock for which the equations are presented below. The key distinction between the coherent and non-coherent versions of the receiver architecture is in the computation of extrinsic information for branch metric computation, and the amount of phase rotation imposed in phase rotator 11-10. The channel equalizer block 11-16 is similar to the coherent case with the exception that estimates for the channel coefficients are derived from the non-coherent SISO detector. The SISO decoder 11-14 uses a similar trellis to that of the coherent case, except the branch metrics computed in 11-12 are based on non-coherent signal detection theory which is essentially phase invariant in presence of random or unknown phase. In each iteration in block 11-12, equation (33) is computed and/or updated based on the previous iteration of the extrinsic information, that is the output from the SISO decoder's last iteration via equation (21).

In a non-coherent case, the received signal (in absence of multipath the symbol $c_k$ is denoted simply by $x_k$) may be modeled with random or unknown phase as:

$$y_k = A x_k e^{j\phi} + n_k \qquad (22)$$

In an AWGN channel with $n_k$, that is complex zero mean Gaussian noise with variance $\sigma^2$ per dimension, the observed vector's probability distribution function conditioned on a known phase and the transmitted sequence of N symbols is:

$$P(y \mid x, \varphi) = o \cdot e^{-\frac{1}{\sigma^2} \sum_{n=1}^{N} |y_n - A x_n e^{j\phi}|^2} \qquad (23)$$

Where o is a constant and $\sigma$ is the variance of the noise. After some algebraic manipulation we can write (23) as $$P(y \mid x, \varphi) = o \cdot e^{-\frac{A^2}{2\sigma^2} \sum_{n=1}^{N} |x_n|^2} e^{\frac{A}{\sigma^2} Re\left(\sum_{n=1}^{N} y_n^* x_n e^{j\phi}\right)} \qquad (24)$$

Averaging (24) over the uniformly distributed phase over $(0, 2\pi)$ yields:

$$P(y \mid x) = o' \cdot e^{-\frac{A^2}{\sigma^2} \sum_{n=1}^{N} |x_n|^2} I_0\left(\frac{A}{\sigma^2} \left| \sum_{n=1}^{N} y_n^* x_n \right|\right) \qquad (25)$$

where $I_0(.)$ represents the modified zero-th order Bessel function.

Recall $$P(x_i = x \mid y) = \frac{1}{P(y)} \sum_{x: x_i = x} P(y \mid x) \prod_i P(x) \qquad (26)$$

From (25), $$\frac{P(x_i = x \mid y)}{P(x_i = x)} = \qquad (27)$$

$$o' \cdot \sum_{x: x_i = x} \left( e^{-\frac{A^2}{2\sigma^2} \sum_{n=1}^{N} |x_n|^2} \times I_0\left(\frac{A}{\sigma^2} \left| \sum_{n=1}^{N} y_n^* x_n \right|\right) \right) \prod_{l \neq i} P(x_l)$$

Or equivalently, the extrinsic metric may be approximated in equation (27) as $$\prod_i (x_i = x, 0) \approx \max_{x: x_i = x} \left\{ -\frac{A^2}{2\sigma^2} \sum_{n=1}^{N} |x_n|^2 + \frac{A}{\sigma^2} \left| \sum_{n=1}^{N} y_n^* x_n \right| + \sum_{l \neq i} \ln p(x_l) \right\} \qquad (28)$$

For the special case when $x_n$ takes values +1 and −1, then the term $$-\frac{A^2}{\sigma^2} \sum_{n=1}^{N} |x_n|^2$$

can be ignored, since $|x_n|$ is constant.

Next consider a Rayleigh fading channel model, where in equation (22), the magnitude A is Rayleigh distributed and the phase is uniformly distributed over $(0, 2\pi)$ interval. The observed vector's probability distribution function conditioned on a known amplitude and the transmitted sequence of symbols is:

$$P(y \mid x, A) = o \cdot e^{-\frac{1}{2\sigma^2} \sum_{n=1}^{N} |y_n|^2} e^{-\frac{A^2}{2\sigma^2} \sum_{n=1}^{N} |x_n|^2} e^{\frac{2}{2\sigma^2} Re\left(\sum_{n=1}^{N} y_n^* x_n\right)} \qquad (29)$$

Lets assume that the average power of A is $\sigma_f^2$ and taking the expectation with respect to complex random variable A results in $P(y|x) = E_A\{P(y|x,A)\}$.

$$P(y \mid x) = \int \int o \cdot e^{-\frac{1}{2}\left[\frac{\sum_{n=1}^{N} |x_n|^2}{\sigma^2} + \frac{1}{\sigma_f^2}\right]|A|^2 + \frac{2}{\sigma^2} Re\left(\sum_{n=1}^{N} y_n^* x_n\right)} dA \qquad (30)$$

which can be integrated to:

$$P(y \mid x) = c'' \frac{1}{\left[\frac{\sum_{n=1}^{N} |x_n|^2}{\sigma^2} + \frac{1}{\sigma_f^2}\right]} e^{\frac{\frac{1}{2}\left|\frac{1}{\sigma^2} \sum_{n=1}^{N} y_n^* x_n\right|^2}{\left[\frac{\sum_{n=1}^{N} |x_n|^2}{\sigma^2} + \frac{1}{\sigma_f^2}\right]}} \qquad (31)$$

For obtaining the extrinsic information, from equation (31), the following equation applies $$\frac{P(x_i = x \mid y)}{P(x_i = x)} = c'' \sum_{x: x_i = x} \frac{1}{\left[\frac{\sum_{n=1}^{N} |x_n|^2}{\sigma^2} + \frac{1}{\sigma_f^2}\right]} e^{\frac{\frac{1}{2}\left|\frac{1}{\sigma^2} \sum_{n=1}^{N} y_n^* x_n\right|^2}{\left[\frac{\sum_{n=1}^{N} |x_n|^2}{\sigma^2} + \frac{1}{\sigma_f^2}\right]}} \prod_{l \neq i} P(x_l) \qquad (32)$$

which after some algebraic manipulation can be simplified to:

$$\prod_i (x_i, 0) = \qquad (33)$$

$$\max_{x: x_i = x} \left\{ -\ln\left[\frac{\sum_{n=1}^{N} |x_n|^2}{\sigma^2} + \frac{1}{\sigma_f^2}\right] + \frac{1}{2} \frac{\left|\frac{1}{\sigma^2} \sum_{n=1}^{N} y_n^* x_n\right|^2}{\left[\frac{\sum_{n=1}^{N} |x_n|^2}{\sigma^2} + \frac{1}{\sigma_f^2}\right]} + \sum_{l \neq i} \ln P(x_l) \right\}$$

It should be noted that $\Pi_i(x_i, 0)$ is defined as $\ln p(x_i)$

Figure 12:
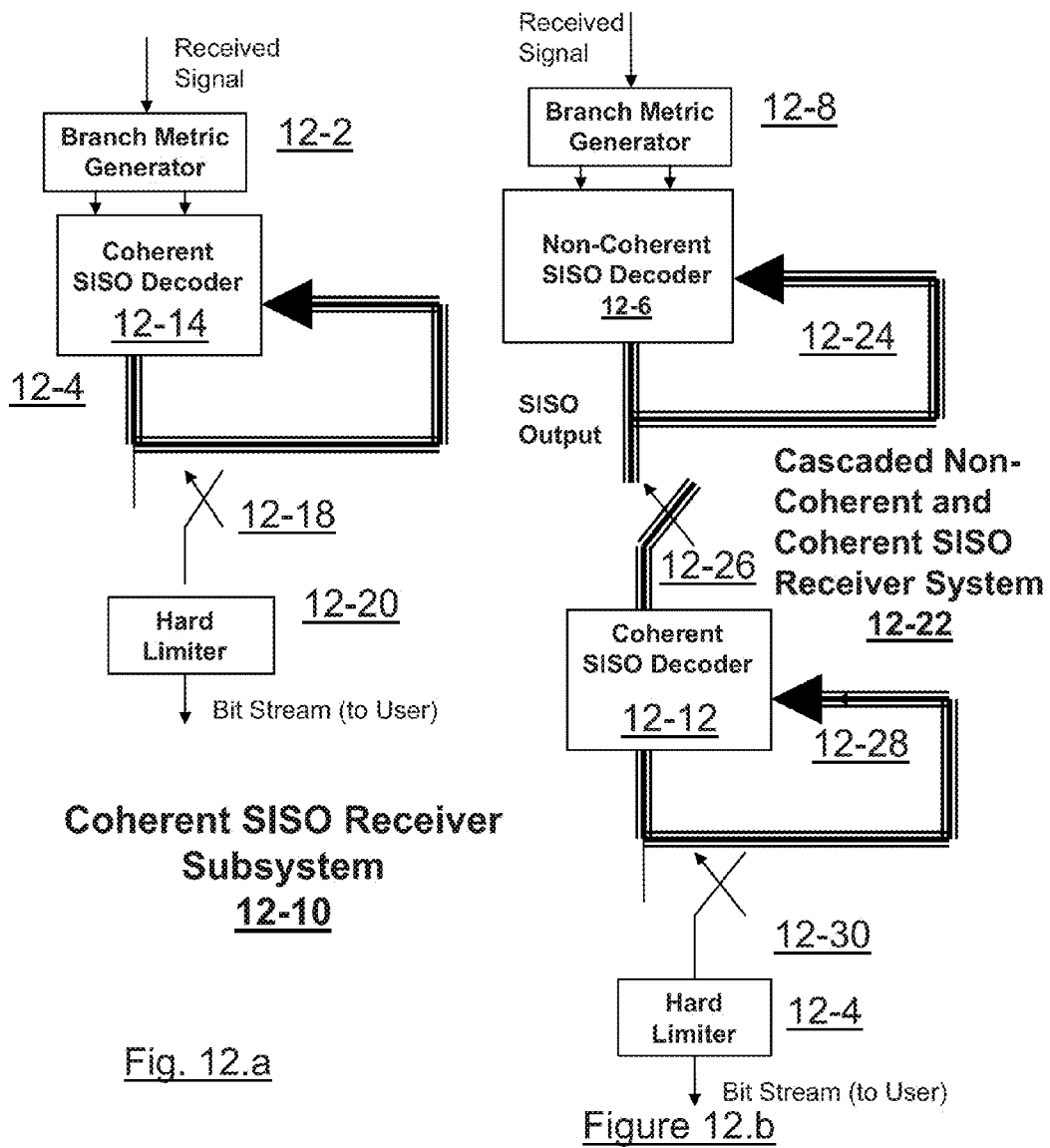
FIG. 12a illustrates a block Cascaded Non-Coherent.
FIG. 12b illustrates a Coherent SISO Decoder.

Referring now to FIGS. 12a and 12b, and in particular FIG. 12b, the operation of an iterative cascaded SISO receiver, with non-coherent and coherent models as described earlier, may be as follows:

Received vector $y_k$ may be initially iterated in the non-coherent SISO receiver until the stopping rule for minimizing the sequence error probability is satisfied. The output of the non-coherent receiver for the estimated symbol sequence, timing, phase and channel response may then used for the initial estimate of these sequences in the subsequent coherent SISO receiver. The SISO decoder of 12-14 and 12-2 are essentially same decoders, except the SISO decoder 12-12 receives its input branch metrics from extrinsic information from the non-coherent SISO decoder 12-6.

Coherent SISO receiver system 12-10 is shown in FIG. 12a in which a received signal is applied to branch metric generator 12-12 which computes the branch metric $m_{ik}$ in equation (18). These branch metrics are computed for each transition for each state of the trellis from one-to-the-other. The branch metrics are input to coherent SISO decoder 12-14. After a sufficient number of iterations (indicated by loop 12-16) in effect minimizing the sequence error probability in each iteration, the decoder slightly improves and reduces the error probability. The switch 12-18 may driven by a fixed or dynamic rule. Typically after five to ten iterations, the SISO decoder output can be sampled and hard quantized. An alternative approach would be to monitor the dynamic range of the extrinsic values and when the values reach steady state (no longer changing or arbitrarily small change), the SISO decoder may be stopped and the output may be hard limited in block 12-20 and decoded.

Referring now to FIG. 12b, cascaded non-coherent and coherent SISO receiver system 12-22 is depicted in which the received signal is used by the branch metric generator 12-8 to output the metric values to the non-coherent SISO decoder 12-6. The difference between 12-2 and 12-8 is that the branch metric values for the non-coherent case are computed by considering the distribution of phase to be random, where in the coherent case the phase is assumed to be known. After a sufficient number of iterations (as shown by loop 12-24), the output of the non-coherent SISO decoder 12-6 is sampled by sample switch 12-26 and applied to coherent SISO decoder 12-12. After a sufficient number of iterations (as shown by sample loop 12-28), the output is applied by sample switch 12-30 to hard limiter 12-4 and then provided to the data user which in RFID application is the protocol layer-2 embedded in the reader system. An option for the stopping rule to close the switches 12-26, 12-28 and 12-30 is to monitor the rate of growth of the accumulated forward and backward metrics in equation (14) in each SISO decoder, and then stop the iteration when the difference between successive iterations is arbitrarily small for all the states in the Trellis.

Figure 13A:
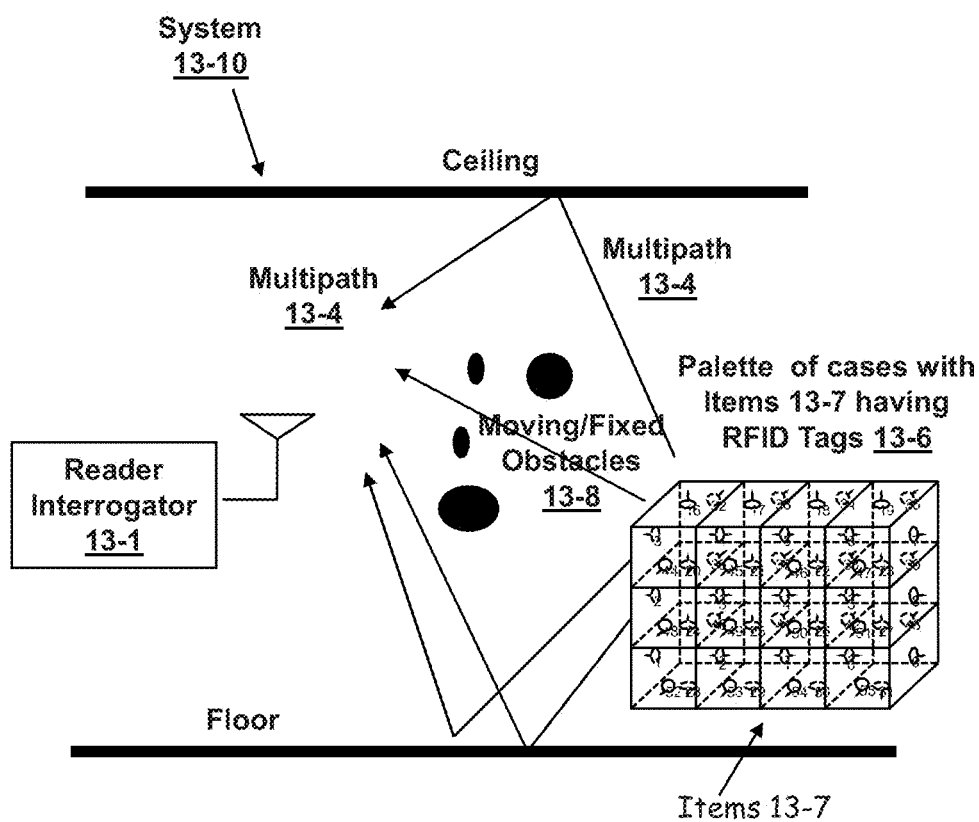
FIG. 13a is a block diagram of an RFID System.

Referring now to FIG. 13a, an implementation of RFID system 13-10 is shown in which plurality of inventory items, such as items 13-7, each of which may include a passive RFID tags 13-6. The reader/interrogator 13-1 emanates a signal to RFID tags 13-6 to respond with their respective identification code referred to as "electronic product codes" (EPC). The RFID tags 13-6 subsequently respond to signals generated by reader 13-1 by backscattering the received signal with their respective EPCs. The signal may be corrupted by multipath 13-4 from the flooring the walls and moving and fixed obstacles 13-8.

Figure 13B:
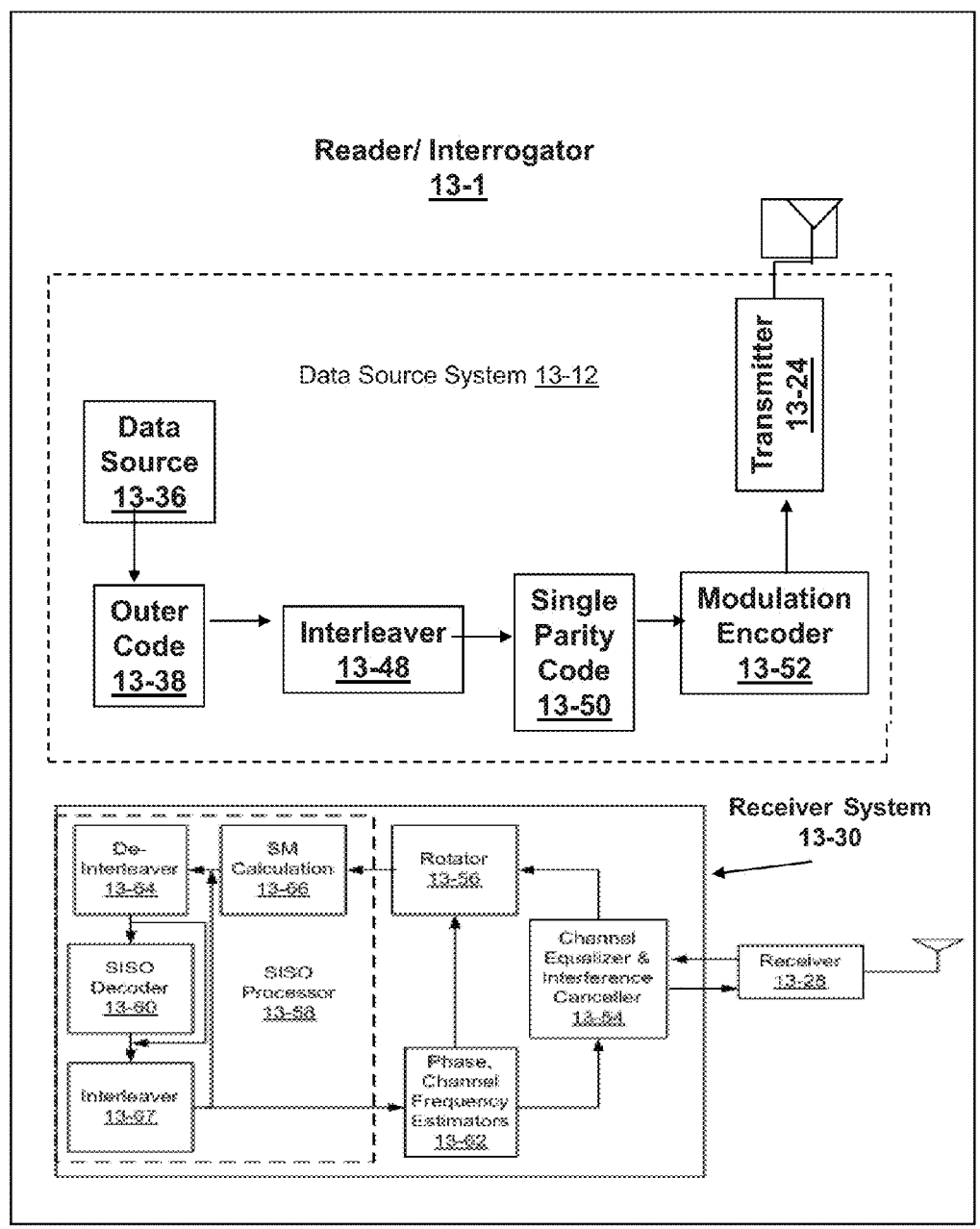

Referring now to FIG. 13b, reader/interrogator 13-1 includes transmitter-antenna subsystem 13-24 which is modulated by data from data source system 13-36 applied to modulation encoder 13-15 and transmits encoded RF signals to RFID tags 13-7. Alternatively, outer coder 13-28, interleaver 13-48 and/or single parity coder 13-50 may be inserted between data source 13-36 and encoder 13-52 in appropriate implementations.

Reader interrogator 13-1 also includes receiver 13-28 which receives reflected signals from RFID tags 7 and applies them to receiver system 13-30 for detection and decoding. The output of receiver system 13-30 provides data to a system user. Various obstacles, including sources of interference and multi-path reflection such as stationary and moving objects 13-8 may be in the path of the transmitted and/or received signals.

System 13-10 may, for example, be deployed in a department store in which items in cases of items with RFID tags 13-6 are displayed for sale. Moving and stationary objects 13-8 may represent shoppers and store personnel moving during the day across the transmission and reception paths as well as relatively stationary objects such as one or more potential reflectors, e.g., including advertising displays or other racks of may be moved or changed on a less frequent basis. System 13-10 may be deployed in order to keep track of inventory items, for example, to detect and prevent attempted shoplifting and/or for other reasons related to inventory control by providing data from reader interrogator 13-1 to a user.

Data source system 13-12 includes data source 13-36 which provides a command or an EPC to the RFID tag 13-7. Channel coding techniques may be used to improve the overall system performance. In the event channel coding is employed, the electronic product code stored in RFID tag 7 is used as the input. The data source may embed the Electronic Product Code (EPC) in pre-coded format by using outer coder 13-38, interleaver 13-48 and single parity coder 13-50 at the time that the stored data is written into the RFID tag. In that event, the model of data source 13-36 simplifies to a table look-up for EPC which, in the case of passive RFID tags, is backscattered (or transmitted) to the interrogator or the RFID reader. It is also noted that it is possible to compress the EPC code in the interrogator prior to application of channel coding, using simple hashing method to decrease the length of the information sequence. Thus, the additional storage in the RFID tag is used to store the resulting parity bits. For example, for a 32-bit EPC code, the sequence can be hashed into a 16-bit code by the interrogator in which case the effective coding rate would be rate one-half, and the remaining 16-bit is used as a parity check sequence. The channel coding method may be used for protection against channel error. The code shown in FIG. 9a is a repetition code in which each data bit is repeated with a fixed number of multiplicity. The number of repetitions of each input bit is a design parameter which determines the overall coding rate of the system. The interleaver 13-48 serves to permutate the encoded data from the outer code output 13-38, such that the Hamming distance of the input sequence is preserved and the output is applied to single parity coder 13-50 and described earlier in FIG. 9a. The output of which is applied to modulation encoder 13-52. The modulator may use various modulation techniques and waveforms defined by various RFID tag or sensory standardization bodies. System 13-10 is applicable to any modulation technique or waveform. That is, modulation encoder 13-52 can be amplitude shift keying (ASK), on-off keying (OOK), frequency modulation (FM) and other modulation schemes without any loss of generality in applying the receiver subsystem in 13-30.

RFID tags 13-7 operate to backscatter or actively transmit the embedded information sequence to the reader or the interrogator to produce the signals received in equation (2). Stationary and moving obstacles 13-8 may cause interference between the signals reflected by one or more of the RFID tags 13-7. The signals received by receiver 13-30 may therefore include channel interference, multi-path reflections and other effects which make detection and discrimination between RFID tags 13-7 difficult with very low signal levels. Additional anomalies may also be present in the communication channel. In an in-door environment such as warehouses, factories and malls substantial scattering due multipath and man-made interference (e.g. drill noise, cordless phones) or natural interferences (e.g. ceiling lighting) may also be present. In an outdoor environment interference and multipath effects may also be present in addition to signal blockage due to foliage and weather effects due to humidity or rain. These channel anomalies and interferences may all be handled by receiver system 13-30.

Receiver system 13-30 serves to detect and discriminate between RFID tags 13-7 by taking advantage of SISO decoding proposed herein. It is assumed that latency in SISO decoding can be tolerated by the users of the system 13-10 or the processing time in system 13-10 is short for real or near real time detection of motion of individual RFID 13-7. That is, reader/interrogator 13-1 processes the signals received by receiver system 13-30 for a relatively long time and is able to distinguish between transmission channels from different RFID tags by learning the signal characteristics. Furthermore, in warehouse, factory and airport deployment scenarios the RFID tags may be moving at high velocity on conveyor belts or moving vehicles while being manipulated. Reader Interrogator 13-1 also compensates for effect of moving RFID tags on the characteristic of the received signal. That is the system 13-10 can tolerate a high level of Doppler shift and still achieve high performance in detection of signals from RFID tags.

Receiver system 13-30 also provides a frequency signal to receiver 13-28 to adjust the transmitted frequency. This frequency adjustment provides a mechanism to both track and adopt the frequency channel used to read and write information into the RFID tag and also support optional waveforms which employ frequency hopping techniques as defined by RFID Standardization Bodies (e.g. ISO, EPC Global).

Receiver system 13-30 processes the received signals in channel equalizer and interference canceller 13-54 which is realized by a bank of adaptive linear phase filter banks with the objective of maximizing the received signal power and minimizing the effect of interference by excision. That is, the frequency response of the filter bank is designed to eliminate narrow band interference while maximizing the signal-to-noise ratios received from the RFID tag. The output of channel equalizer and interference canceller 13-56 is applied to rotator 13-58 which appropriately adjust the phase of the incoming signal in real-time to track the phase of the incoming signal and compensate for the effect of motion, Doppler and phase noise due to imperfection in the environment.

The output of rotator 13-56 is applied to SISO processor 13-58, which includes SISO decoder 13-60, and which serves to input into the soft metric calculator which calculates the intrinsic metric values associated with each transition from one state of trellis structure to the other state (or Bi-partite graph). The output of SISO processor 13-58 is applied to phase, channel and frequency estimator 13-62 which serves to provide an instantaneous phase and frequency estimate of the received signal based on the output of the SISO decoder.

One output of phase, channel and frequency estimator 13-62 is applied to rotator 13-56 and provides the reference for phase compensation of the received signal which may have been caused by motion or other anomalies. A second output of phase, channel and frequency estimator 13-62 is applied to channel equalizer and interference canceller 13-54 and provides the adaptation algorithm with the phase and frequency of variables used to compute the channel equalizer and interference canceller coefficients of the Finite Impulse Response Filter.

The output of user system 13-34 is formed by summing the extrinsic and intrinsic information and then hard quantizing the resulting sum. This value constitutes the detected bit stream from the RFID tag. SISO decoder 13-60 in SISO processor 13-58 also includes soft metrics calculator 13-66, de-interleaver 13-64 and interleaver 13-67 when channel coding as discussed earlier is employed.

In operation of system 13-30, both fine and coarse motion of items 13-6 having RFID tags 13-6 can be accurately detected and observed because the SISO decoder in 13-60 simultaneously estimates the channel response, symbol timing and effectively performs open loop phase tracking.

Referring now to FIGS. 14a and 14b, the FM0 and Miller codes can also be used in passive RFID applications. In FM0 encoder 1410, user data 14-22 is provided to x-or gate 14-18 the output of which is provided to bit mapper 14-16 as well as to simple delay circuit 14-23. The output of delay 14-23 may be provided as a second input to x-or gate 14-18 as well as to inverter 14-20, the output of which is applied to bit mapper 14-14. The two sequences from bit mappers 14-14 and 14-16 are respectively multiplexed into a single stream in multiplexer 14-12 and each repeated once in repeater 14-21 to provide output data 14-24 which is the FM0 encoded data for use by the modulator. FM0 encoder 1410 may be used as a data source, such as data source 2-2 in FIG. 2 or data source 2-20 in FIG. 2b.

In Miller encoder 14-60, delay taps 14-44 and 14-36 are used. The combinatorial logic consists of three inverters 14-46, 14-50, 14-52, two or-gates 14-32 and 14-34, and three and-gates 14-42, 14-36 and 14-38. The output sequence of the combinatorial and delay logic is fed into the signal mapping blocks 14-56 and 14-58 which is multiplexed in 14-30 and repeated in 14-57 to form the output data 14-48 for Miller encoded data for use by the modulators.

Figure 15A:
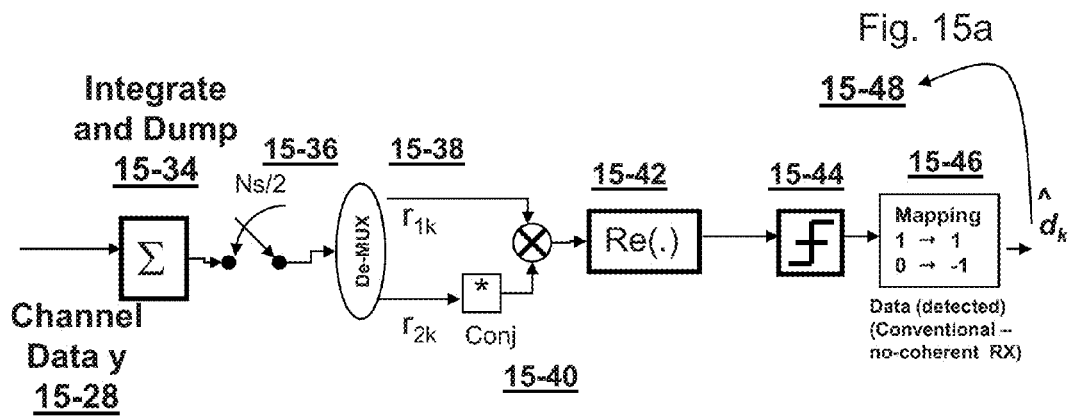
FIG. 15a is a block diagram of classical coherent detector.

Referring now to FIG. 15a, the technique for the coherent detection of FM0 or Miller encoded signal is depicted. The system consists of using the channel data 15-28 and integrating the signal over each symbol period during each half a symbol interval in integrate and dump 15-34 and de-multiplexing the real and imaginary part in demux 15-36 and forming the cross product in step 15-38, taking the real part in block 15-42, hard quantizing the output in quantizer 15-44 and mapping the data into ones and zeros from −1/+1 in data block 15-46. This is the coherent case.

Figure 15B:
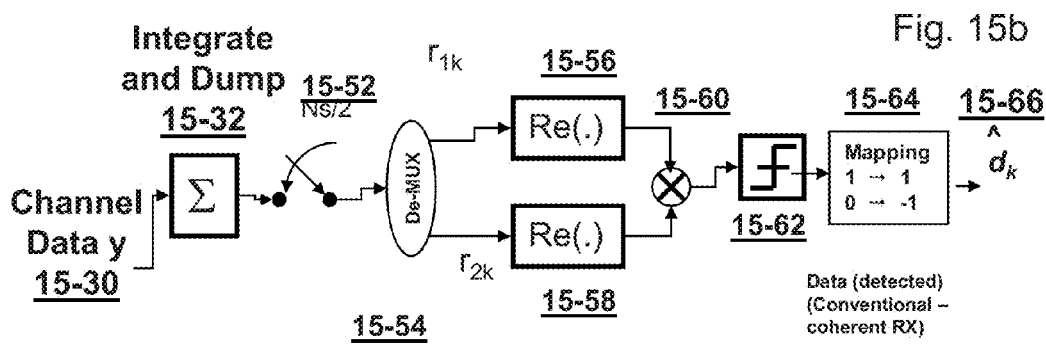
FIG. 15b is a block diagram of classical non-coherent detector.

Referring now to FIG. 15b, a similar operation is performed in non-coherent case in blocks 15-30, 15-32, 15-60, 15-62, 15-64 and 15-52 except only the real part of the signal is used to form the cross product. The output of the non-coherent detector 15-66 and coherent detector is 15-48. $N_s$ denotes the number of sample per symbol, i.e. $N_s = T_{sym}/T_s$ that is the ratio of the symbol time to sampling period.

Figure 15C:
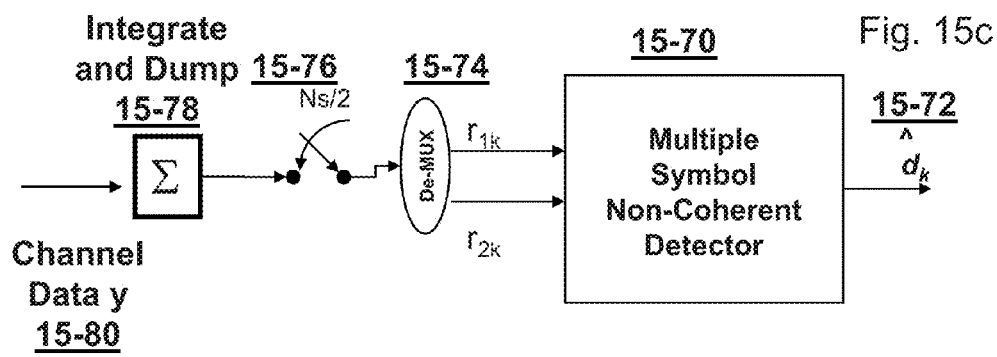
FIG. 15c is a block diagram of a multiple symbol non-coherent detector.
Figure 15D:
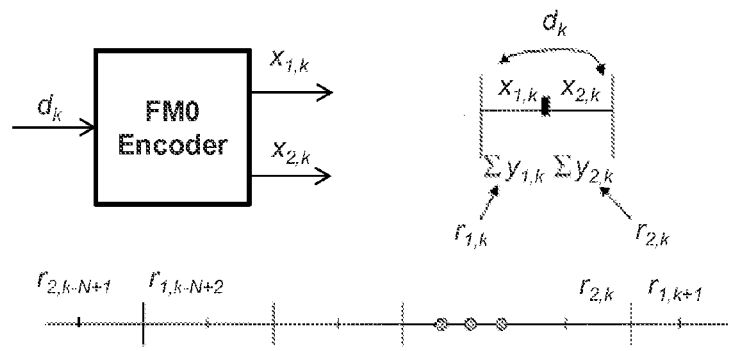
FIG. 15d illustrates the operation of the multiple symbol non-coherent detector of FIG. 15c.

Referring now to FIG. 15c, a block diagram of a multiple symbol detector is shown for the non-coherent detection case. Channel data 15-80 is applied to integrate and dump 15-80 and the real part is determined by block 15-76 and demultiplexed in demux 15-74. The output is applied to non-coherent multiple symbol detector 15-70 to provide output 15-72.

Figure 16:
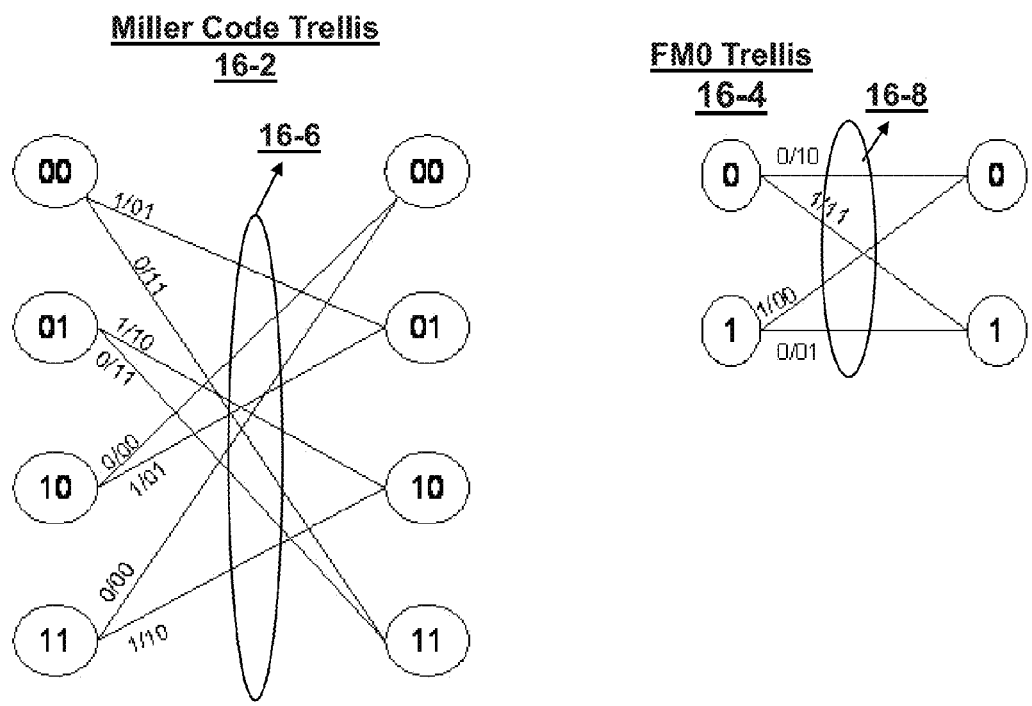
FIG. 16 shows a trellis diagram for FM0 and Miller code.

Referring now to FIG. 16, multiple symbol non-coherent detector (MSNNonCoh) for FM0 is disclosed. In this example, the non-coherent detection is done over a particular sequence of half symbol observations which starts from middle of data interval rather than beginning of data interval. In passive RFID systems, the presence of CW translates into having a DC component. The received signal with FM0 encoding at time i in presence of DC component is:

$$y_{1,i} = (x_{1,i}+c)e^{j\phi} + n_{1,i}$$

$$y_{2,i} = (x_{2,i}+c)e^{j\phi} + n_{2,i}$$

$$i = k-N+2, \ldots, k+1 \quad (33)$$

where c is a dc component, $\phi$ is carrier phase offset (or phase noise). Without loss of generality, it can be assumed that the phase error is constant over duration of a symbol and $n_{1,i}$ and $n_{2,i}$, zero mean complex Gaussian samples with variance $\bullet^2$ per dimension. First the dc value c at the receiver can be estimated as:

$$\hat{c} = \frac{1}{N}\left(\sum_{i=k-N+2}^{k+1}(y_{2,i-1}+y_{1,i})\right) \quad (34)$$

The new observation can be defined as $$r_{1,i} = y_{1,i} - \hat{c}$$

$$r_{2,i} = y_{2,i} - \hat{c} \quad (35)$$

Next the Maximum Likelihood (ML) probability of the modified observation can be computed. The particular observations are:

$$r_{2,k-N+1}, r_{1,k-N+2}, r_{2,k-N+2}, r_{1,k-N+3}, \ldots, r_{2,k}, r_{1,k+1}$$

The conditional probability function can be formulated as:

$$P(r|x,\phi) = \text{constant } e^{-\frac{1}{2\sigma^2}\sum_{i=k-N+2}^{k+1}\{|r_{2,i-1}-x_{2,i-1}e^{j\phi}|^2+|r_{1,i}-x_{1,i}e^{j\phi}|^2\}} \quad (36)$$

Averaging (36) over the carrier phase, the ML function can be approximated with $$P(r|x) \approx I_0\left(\frac{1}{2\sigma^2}\left|\sum_{i=k-N+2}^{k+1}\{r_{2,i-1}x_{2,i-1}+r_{1,i}x_{1,i}\}\right|\right) \quad (37)$$

Since the zero order modified Bessel function is a monotonic function, thus the required metric for the decision is:

$$\text{Metric} = \left|\sum_{i=k-N+2}^{k+1}(r_{2,i-1}x_{2,i-1}+r_{1,i}x_{1,i})\right| \quad (38)$$

The key property of FM0 encoder output 14-24 for RFID application is $$x_{2,i} = d_i x_{2,i-1}$$

$$x_{1,i} = -x_{2,i-1} \quad (39)$$

Replacing (39) in (38) one gets:

$$\text{Metric} = \left|\sum_{i=k-N+2}^{k+1}(r_{2,i-1}-r_{1,i}x_{2,i-1})\right| \quad (40)$$

or $$(\hat{d}_k, \hat{d}_{k-1}, \ldots, \hat{d}_{k-N}) = \arg\max_{d_k, d_{k-1}, \ldots, d_{k-N+2}} \left|(r_{2,k-N+1}-r_{1,k-N+2}) + \sum_{i=k-N+3}^{k+1}(r_{2,i-1}-r_{1,i})\prod_{j=k-N+2}^{i-1}d_j\right| \quad (40a)$$

By expanding the sum for the case of N=3, the optimum decision rule for multiple symbol non coherent detection rule becomes:

$$(d_k, d_{k-1}) = \arg\max_{d_k, d_{k-1}}|(r_{2,k-2}-r_{1,k-1})d_{k-1}+(r_{2,k-1}-r_{1,k})+(r_{2,k}-r_{1,k+1})d_k| \quad (41)$$

In step 15-70, equation (41) is realized and the maximization implemented over all possible data symbols $d_k \in \{+1,-1\}$. Note that this metric is independent of dc offset and can be used even without using (39).

Referring now to FIG. 16, the Trellis diagrams from the encoder structure of FIG. 14 is shown in trellis 16-2 for FM0 and in trellis 16-4 for Miller code. These Trellis diagrams are used for the SISO decoder for application of passive RFID tag standards which employ these encoding techniques. In the presence of random phase and timing, the Trellis diagram may be too large and impractical to be illustrated graphically. That is due to the large number of states and transitions (e.g. 2000 states and 20 transitions per state) which depends on the choice of the cardinality of the sets in equations (10) and (12).

Figure 17:
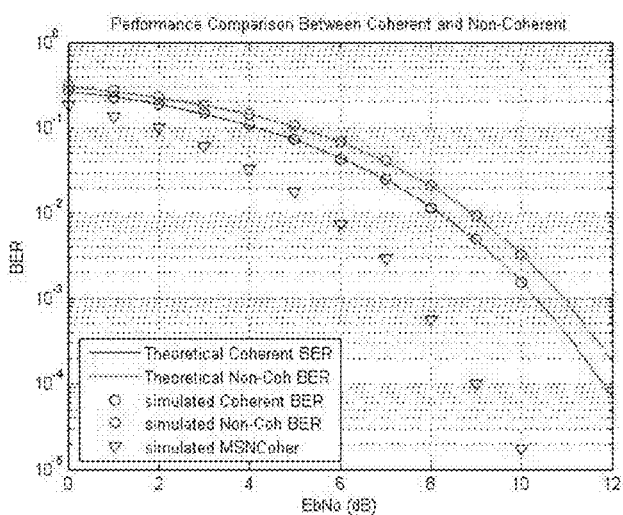
FIG. 17 shows a bit error rate as function of signal-to-noise ratio.

Referring now to FIG. 17, the performance of detectors in FIGS. 15*a*, 15*b* and 15*c* are compared. The theoretical performance of coherent and non-coherent detector over AWGN are also depicted with solid lines and the performance of multiple symbol non-coherent MSNC is simulated and shown by small triangles. It is noted that the performance of the symbol non-coherent detector outperforms the classical non-coherent detector by a factor of 3.5 dB.

In SISO decoder 4-2 a long sequence, typically a packet or a frame, is processed at a time. Hence, the performance is still even superior to that of symbol non-coherent detection in which the Maximum Likelihood detector is considering only three symbols. In applications for system 13-10 are for RFID tag standards in which the tag protocol is amenable to longer latency which results from the SISO decoding. Typical applications of multiple symbol non-coherent detector 15-70 are when the RFID standard requires very strict timing requirements between the tag-to-reader and reader-to-tag packet inter-arrival time. These tight timings requirements typically occur when acknowledgement or replies are required from the reader to the RFID tag or vice versa. In certain circumstances and for certain RFID tag standards, it is also possible to employ both systems 13-10 and 15-70 so that for certain packets types which the system 15-70 is used and system 13-10 may be used for other timing critical packets. Specifically, when detecting the product code itself from the received packet, SISO decoding in 13-10 may be used, but for other packet types which are short replies and handshake, system 15-70 may be used.

Referring now to FIGS. 18 and 19, a typical problem for many digital communication systems is that the baud rate is fixed, i.e. the transmitted pulse duration is fixed. In sensor networks and RFID systems in particular, the transmitted pulses from the tag can change in duration from symbol to symbol. Thus at the reader's receiver, the duration of pulses or the instantaneous time varying baud rate should be tracked. In order to track timing for such applications, a timing trellis may be used.

Assume that the time axis is sampled at time instants $iT_s$, where $1/T_s$ represent the sampling rate. The sampling points at the output of matched filter are depicted by bullets "•" on branch metric per edge of trellis requires variable number of samples. Denote the index of observation sample to state $S_{k-1}$ at time k-1 by $q_i$, then the number of samples required to compute the edge branch metric are $q_i+N(s_i,s_j)$ samples. Where $N(s_i,s_j)$ represent the number of samples required to compute the branch metric from present state $S_{k-1}=s_i$ to next state $S_{k-1}=s_j$, For N=8:

| | | | | |
|---|---|---|---|---|
| N(s0, s1) = 9 | N(s0, s9) = 9 + 7 | N(s1, s1) = 8 | N(s1, s2) = 9 | N(s1, s9) = 8 + 7 |
| N(s2, s1) = 7 | N(s2, s2) = 8 | N(s2, s3) = 9 | N(s2, s9) = 7 + 7 | N(s2 + i, s2 + i − 1) = 7 for i = 1, 2, 3, 4, 5 |
| N(s2 + i, s2 + i) = 8 for i = 1, 2, 3, 4, 5 | N(s2 + i, s2 + i + 1) = 9 for i = 1, 2, 3, 4, 5 | | N(s8, s0) = no samples | |
| N(s8, s7) = 7 | N(s8, s8) = 8 | N(s9, s0) = no samples | N(s9, s7) = 7 | N(s9, s8) = 8 | the time axis in FIG. 19-10. There may be N samples per nominal baud interval. Thus the nominal symbol duration would be $T_+=NT_s$, where T is the nominal symbol duration. Assume the symbol duration from symbol to symbol can increase (as a result for example of changing channel characteristics) by one sample to $T_-=(N+1)T_s$ with probability p, or no change $T=NT_s$ with probability (1−2p), or can decrease by one sample to $T=(N-1)T_s$ with probability p.

Each interval has N tick marks that denote possible positions (in multiples of Ts), where a sample can be taken at the output of the matched filter. From FIG. 19, some intervals have one tick mark as depicted in 19-2, 19-3 and 19-4, some intervals have two tick marks, while some intervals have no tick marks as shown in 19-12. Denote the timing state as Sk which its value corresponds to a tick mark. The state is associated with a time interval ((k−1)T, kT], and can take one of the values in the following set: Sk=s0, s1, . . . , sN, sN+1. State s0 denotes that the kth symbol interval ((k−1)T, kT] is not sampled at all. For example, in FIG. 19, the interval corresponding to Sk=s2 shown in 19-13 is sampled at the second tick from the start of the interval State Sk=si, for 1≤i≤N denotes that the kth symbol interval ((k−1)T, kT is sampled only once at the i-th tick.

Referring now also to FIG. 18, state Sk=sN+1 (for N=8 in FIG. 19) denotes that the kth symbol interval ((k−1)T, kT] is sampled twice. The only way an interval can be sampled twice is if it is sampled at the first and Nth ticks, since we only allowed maximum of one sample variation from symbol to symbol. The constraints prevent any other way of two samples falling in the same interval. There are some restrictions on how the sampling-states Sk can evolve. To represent all valid sampling-state transitions, we form a timing trellis, depicted in FIG. 18. To a branch in the timing trellis, we associate a transition probability Pr(Sk|Sk−1). The transition probabilities can be computed based on parameter p. A key feature of the timing trellis in FIG. 18 is that the branches in the trellis carry a variable number of samples. We will denote the vector of samples taken in the timing interval ((k−1)T, kT] by r k. Note that rk could be an empty vector if no sample is taken in the kth symbol interval.

The timing trellis has N+2 states. The present state $S_{k-1}$ i.e. $S_0$ through $S_9$ (18-12) and next states $S_k$ i.e. states $S_0$ (18-14) through (18-16) are shown in FIG. 18. Lets assume N=8 for clarification and rectangular NRZ pulses. For symbols with nominal duration of 8 samples, the matched filter sums the recent 8 samples. To transition from state $S_0$ to state 1, the matched filter sums nine recent samples and produces observation rk. To transition from state $S_0$ to state 9, the matched filter sums nine recent samples and produces observation $r_k$, and the next seven samples to produce observation rk+1 corresponding to data ak and ak+1 respectively. Each state also should store the most recent index of observation sample. The Referring now to FIG. 20, a folded timing trellis is similar to the method shown in FIGS. 18 and 19, except the number states are less and number of transitions per state is fixed number for all timing states. The time axis may be sampled at time instants $iT_s$, where $1/T_s$ represent the sampling rate. The sampling points at the output of matched filter (end of actual symbol time duration) are depicted by bullets "•" on the time axis in FIG. 19-10. Assume there are N samples per nominal baud interval. Thus the nominal symbol duration is $T_+=NT_s$, where T is the nominal symbol duration. Assume the symbol duration from symbol to symbol can increase by one sample to $T_-=(N+1)T_s$ with probability p, or no change $T=NT_s$ with probability (1−2p), or can decrease by one sample to $T=(N-1)T_s$ with probability p.

Figure 20:
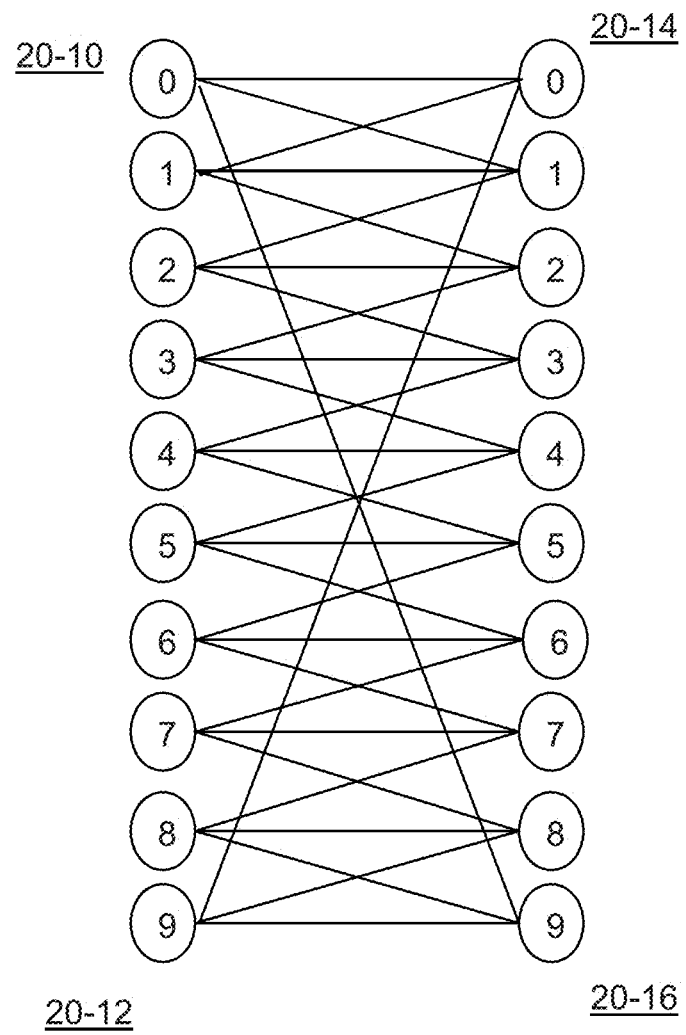
FIG. 20 shows a second method using a folded timing trellis for pulses with time varying duration.

Each interval has N tick marks that denote possible positions (in multiples of Ts), where a sample can be taken at the output of the matched filter. The state is associated with a time interval ((k−1)T, kT], and can take one of the values in the following set: Sk=s1, . . . , sN. State Sk=si, for 1≤i≤N denotes that the kth symbol interval ((k−1)T, kT] is sampled at the i-th tick from the beginning of the interval. There are some restrictions on how the sampling-states Sk can evolve. To represent all valid sampling-state transitions, a timing trellis may be formed as depicted in FIG. 20. To a branch in the timing trellis, a probability Pr(Sk|Sk−1) can be assigned to a transition. The transition probabilities can be computed based on parameter p. A key feature of the timing trellis in FIG. 20 is that the branches in the trellis carry a variable number of samples. The vector of samples taken in the timing interval ((k−1)T, kT] can be denoted by rk.

The timing trellis has N states. Lets assume N=8 for clarification. The present states $S_{k-1}$ i.e. $S_1$ (20-10) through $S_8$ (20-12) and next states $S_k$ i.e. states $S_1$ (20-14) through (20-16) are shown in FIG. 20. Also assume rectangular pulses. For symbols with nominal duration of 8 samples, the matched filter sums the recent 8 samples if there is a transition from present state Si to the next state Si for i=1, 2, . . . , N (for the example in FIG. 20, N=8). For symbols with nominal duration of 8 samples, the matched filter sums the recent 9 samples if there is a transition from present state Si to the next state Si+1 for i=2, 3, . . . , N, and S1 to S8 (for the example in FIG. 20, N=8). For symbols with nominal duration of 8 samples, the matched filter sums the recent 7 samples if there is a transition from present state Si to the next state Si−1 for i=1, 2, . . . , N−1, and from present state SN to S1 (for the example in FIG. 20, N=8). Each state also should store the most recent index of observation sample to compute the branch metric for the next trellis section. Thus the branch metric per edge of trellis requires variable number of samples. Denote the index of observation sample to state $S_{k-1}$ at time k−1 by $q_i$, then the number of samples required to compute the edge branch metric are $q_i+N(s_i,s_j)$ samples. Where $N(s_i,s_j)$ represent the number of samples required to compute the branch metric from present state $S_{k-1}=s_i$ to next state $S_{k-1}=s_j$, For N=8:

| | | |
|---|---|---|
| N(s1, s2) = 7 | N(s1, s1) = 8 | N(s1, s8) = 9 |
| N(si, si − 1) = 7 | for i = 1, 2, 3, 4, 5, 6, 7 | |
| N(si, si) = 8 | for i = 1, 2, 3, 4, 5, 6, 7, 8 | |
| N(si, si + 1) = 9 | for i = 2, 3, 4, 5, 6, 7, 8 | |
| N(s8, s1) = 7 | N(s8, s8) = 8 | N(s8, s7) = 9 |

Figure 21:
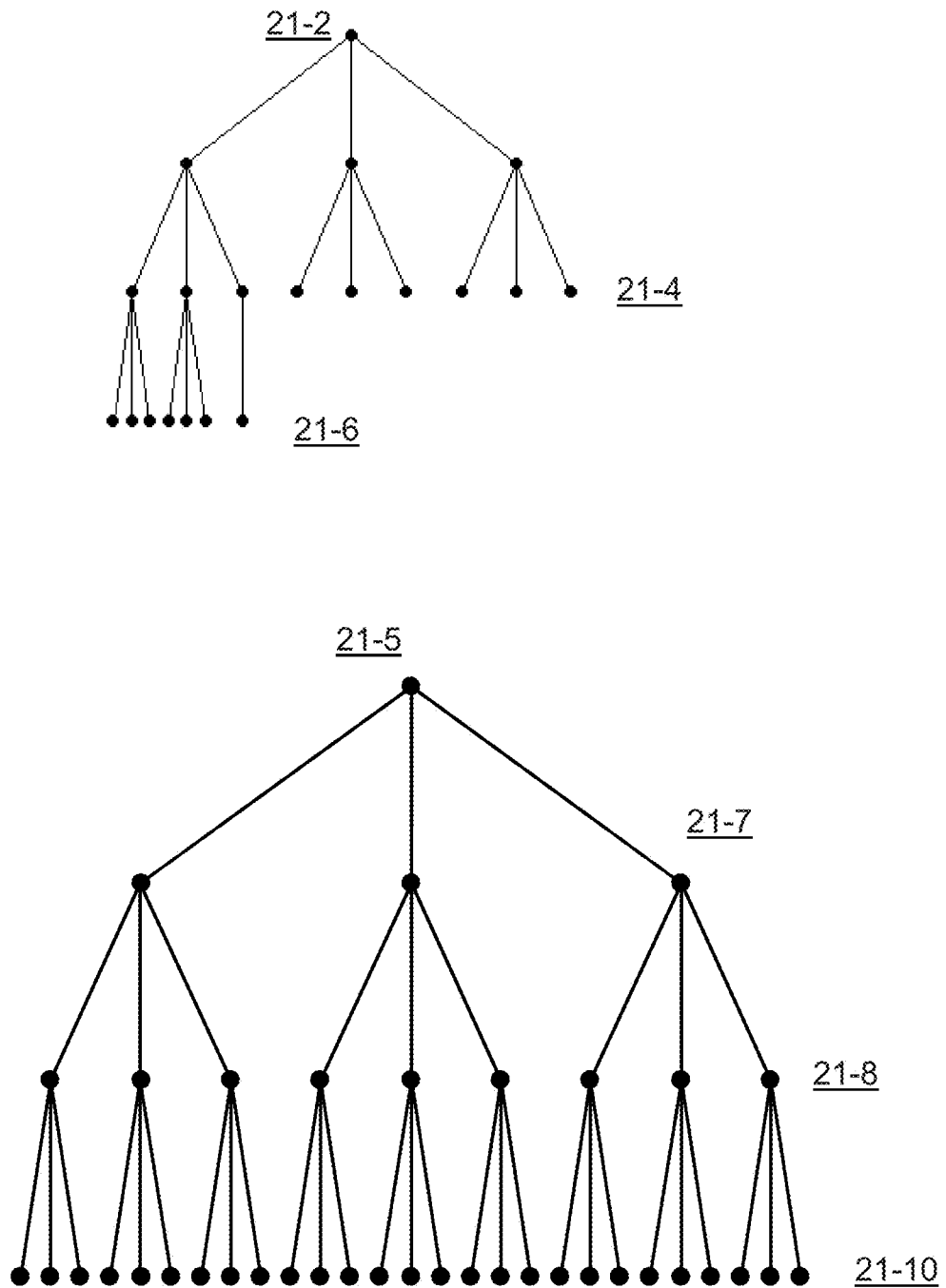
FIG. 21 shows a tree diagram with three transitions per node.
Figure 22:
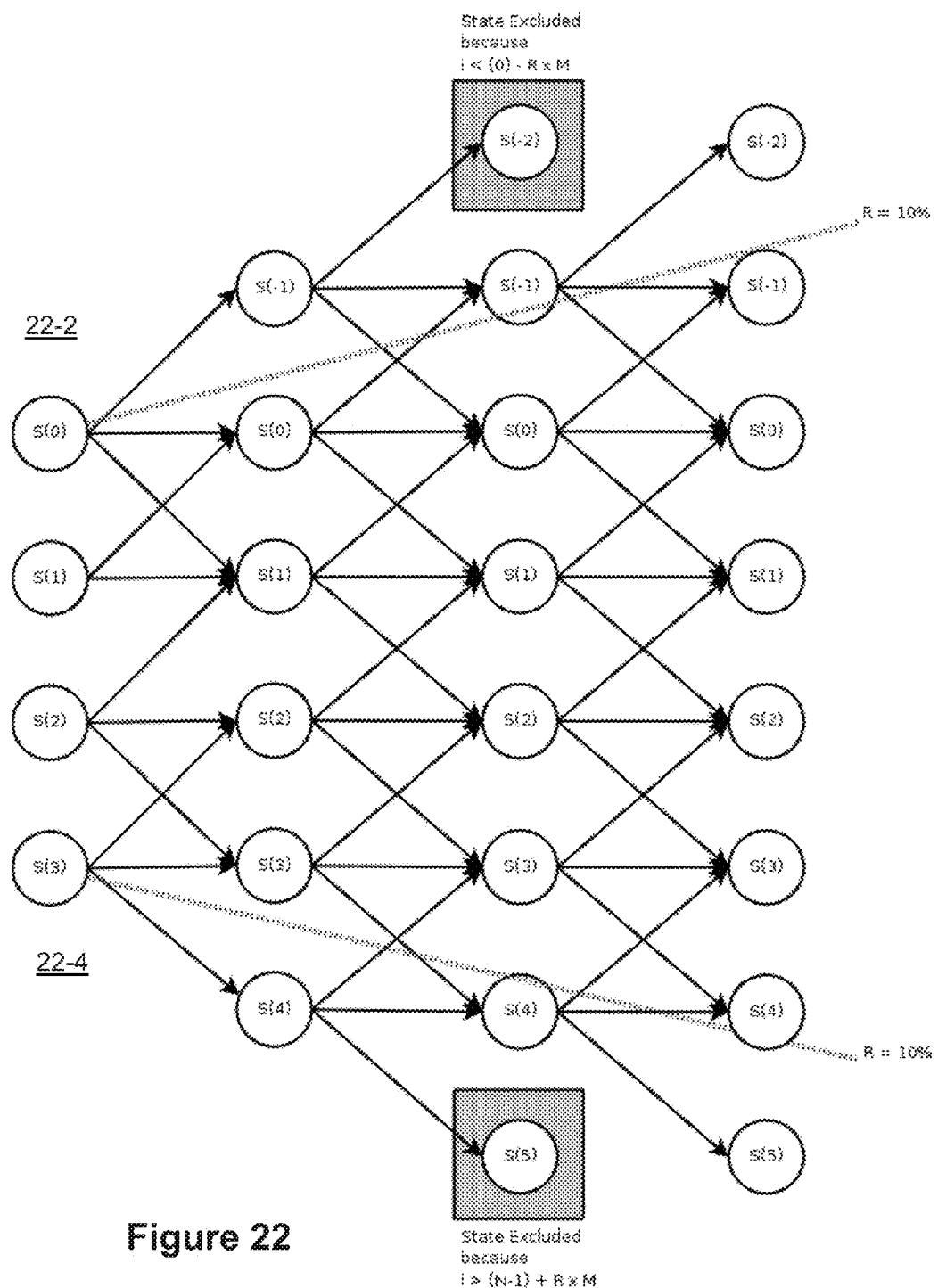
FIG. 22 shows an example of a symbol tree structure method 3 for N=4, and $\Delta max=1$.

Referring now to FIGS. 21 and 22, the symbol timing tree structure is based on a nominal value of N samples per symbol. This means that the granularity of the timing captured will be $1/N \times F_s$ where $F_s$ is the sampling frequency. The rates may be discussed in the $1/F_s$ domain, meaning that rates will be expressed in percentage of the sample rate, and time in samples. To build a structure that can be integrated into the trellis form, an estimate of the first symbol time must be provided that is accurate to one symbol period (±N/2). If the first symbol time cannot be estimated to this accuracy, a separate synchronization sequence may be required. States are labeled $S_{M,i}$ for the ith state in the Mth stage. In the general case, there may be N starting states, labeled from $S_{0,0}$ to $S_{0,N-1}$. Each state $S_{M,t}$ has $2 \times \Delta_{max}+1$ (where $\Delta_{max}$ represents the maximum number of samples from symbol duration can exceed from nominal symbol duration) transitions leading to consecutive states starting at $S_{M+1,t-\Delta max}$ and ending at $S_{M+1,t+\Delta max}$. To further refine the structure, an a-priori estimate of the maximum timing error (expressed in samples per symbol) of R can be used. If N is nominal number of samples per symbol, then R=rN where r is percentage of timing error. The definition of R becomes $\Delta_{max}=\lceil R \rceil$ Which is an integer. This limits the states at any given trellis stage M to states starting at $S_{M,0-\lfloor R \times m \rfloor}$ up to $S_{M,N-1+\lceil R \times M \rceil}$ where $\lceil x \rceil$ is the ceiling of x (the next higher integer), and $\lfloor x \rfloor$ is the floor of x (the next lower integer). This means that at any stage M the state $S_{M,t}$ corresponds to a symbol that starts at sample time M×N+t. An example of this structure for $\Delta_{max}=1$ and N=4 is shown in FIG. 22.

Figure 23:
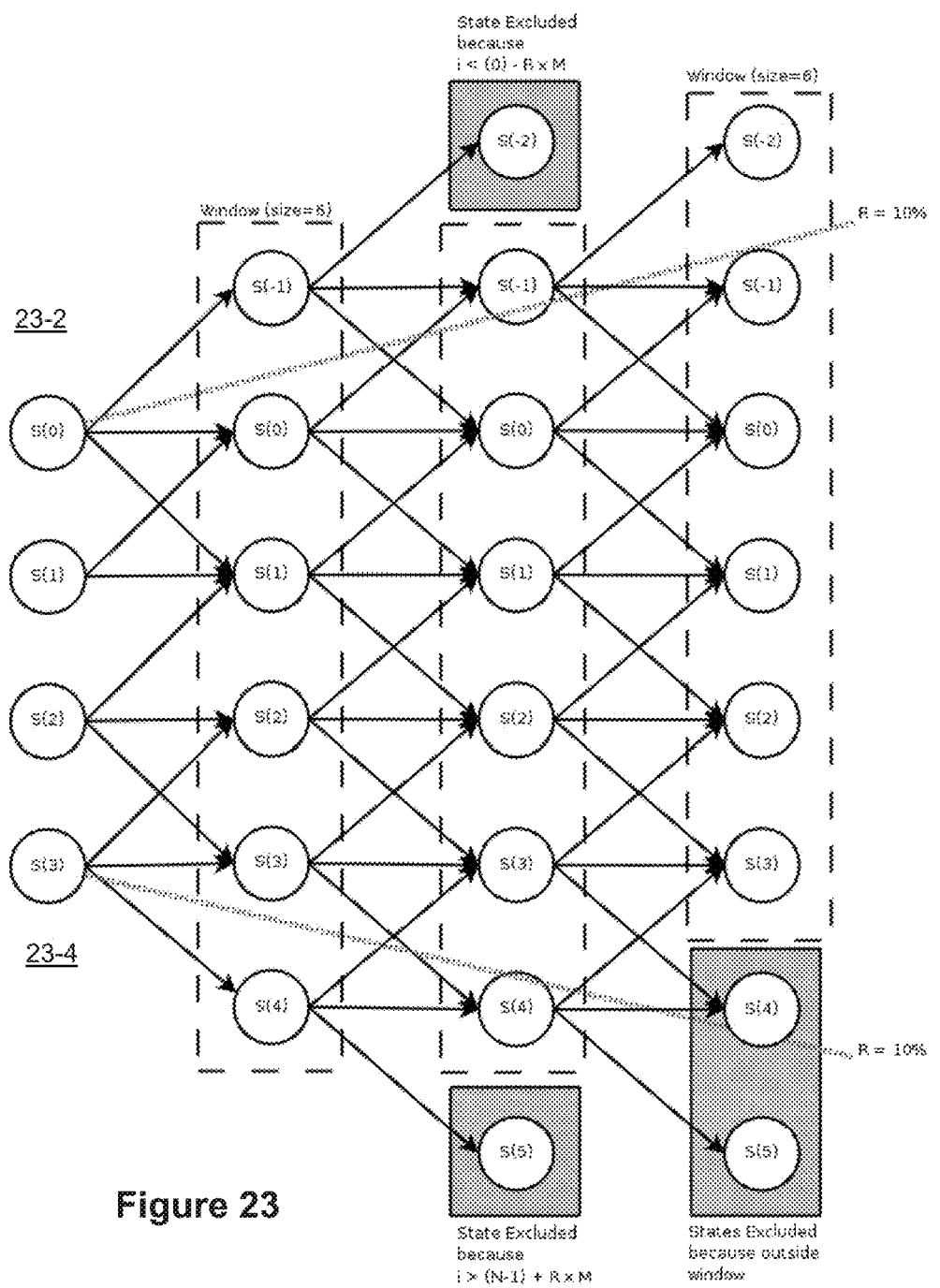
FIG. 23 shows an example of symbol tree with windowed structure method 3 for N=4, and $\Delta max=1$.

Referring now to FIG. 23, a second, derived structure involves using the same tree, but windowing it to limit the number of states is shown as the windowed structure in FIG. 23. For the windowed structure, an additional parameter W may be defined as the size of the window into the tree. In this way, only W states at any trellis stage M are kept where the first state index is defined as $B_M$ (the base state). In order to find $B_M$ at time M+1 the window position may be chosen based on the probability of the states $S_{M,BM}$ through $S_{M,BM+\Delta max-1}$ compared to $S_{M,BM+W-1}$ down to $S_{M,BM+W-\Delta max}$.

The result may be called a 'folded' structure (also simply the 'trellis' structure). In this structure there are precisely N states at each stage M. In order to accomplish this, the tree structure may be folded such that state $S_{M,t}$ is mapped into state $Z_{M,t\%N}$, where % denotes the modulo operator into positive integers (i.e. (−1)%N=N−1). In order to maintain timing in this structure, each state $Z_{M,t}$ has a mapping value $t_m$ that the index of the maximum probability state $S_{M,k}$ that maps into $Z_{M,t}$. At each stage, $t_m$, to transitions from the state are determined.

In all of these timing structures, this trellis may be combined with the data trellis and phase trellis to get a combined set of states $S_{M,t,\phi,D}$. Each transition out of this state has a triplet of values $(\Delta t, \Delta_\phi, b)$ where $\Delta_t$ is the timing change and it takes integer values between $-\Delta_{max}$ and $\Delta_{max}$, i.e. $-\Delta_{max}$, $\Delta_{max}+1, \ldots -1, 0, 1, \ldots, \Delta_{max}-1, \Delta_{max}$, $\Delta_\phi$ is the phase change, and b is the data bit. In the case of any binary waveforms (e.g. FM0 and Miller), the data metric for this state and transition is $$\text{Re}\left\{ e^{-j(\phi+\Delta\phi)} \sum_{i=0}^{N-1+\Delta t} c_{D,b,i} \times r(M \times N + t) \right\}$$

where $c_{D,b,i}=d_{D,b,k} \times (1-\text{off})+d_{D,b,k+1} \times \text{off}$ and $d_{D,b,k}$ is an ideal symbol at the nominal sample rate, where $$k = \left\lfloor i \times \frac{N+\Delta t}{N} \right\rfloor$$

and $$\text{off} = \left( i \times \frac{N+\Delta t}{N} \right) - k.$$

Note that for the 'folded' version, $t_m$ is used in place of t.

In order to capture the timing information with symbol timing that can drift over time, another natural structure of the timing state diagram is a tree structure such as shown in 21-2 where the root node is extended. Assume the nominal timing is N samples per symbol. This means that the granularity of the timing captured from the tree structure will be 1/N. In order to improve the performance of the trellis, this can be limited to an arbitrary rate R. To do this, the states that would fall outside the bounds of the expected drift are eliminated. If the states are numbered for the first stage of the trellis as $S_0$ to $S_{N-1}$ for the first stage, the second stage would be numbered $S_{0-\Delta max}$ to $S_{N+\Delta max}$, and for stage M they would be $S_{0-M\times\Delta max}$ to $S_{N+M\times\Delta max}$. For this Mth stage the states $S_{0-M\times\Delta max}$ up to but not including $S_{0-\lceil R\times M \rceil}$ would be elided and also states above $S_{N-1+\lceil R\times M \rceil}$. Each state in this structure has a $T_s$ associated with it that is M×N+i for state $S_i$ at time M.

In order to reduce the complexity of the structure, either a 'folded' tree or a 'windowed' tree can be used. The 'folded' tree is a tree where node $S_i$ is mapped to $S_{(i+N)\%N}$ and the $T_s$ associated with the node is the $T_s$ associated with the maximum state value between the mapped states. This means that the transitions become symmetric as in a true trellis, but the transitions carry both a metric and a time with them. In a 'windowed' tree structure, an arbitrarily sized window of states is maintained. This window is selected by comparing the probabilities of the edge states. In the case of a windowed tree, one only needs to keep track of $T_s$ for the first state in the window (all other states will be offset linearly from that state). This provides an advantage of smaller storage and simpler implementation.

Combined Metrics for Data and Timing $$\sum_{i=1}^{N+\Delta t} d_{in}(i) \times r(T_s + i)$$

Where r(i) is the sample at time i d(i) is the ideal symbol sampled at the sample rate (for the data state and input data from the trellis)

$d_{in}(i)$ is the interpolated version of ideal symbol.

$T_s$ is the time stored in the state.

$$p = \left\lfloor i \times \frac{N+\Delta t}{N} \right\rfloor$$

$$\text{off} = \left( i \times \frac{N+\Delta t}{N} \right) - p$$

$$d_{in}(i) = d(p) \times (1 - \text{off}) + d(p+1) \times \text{off}$$

An example for is given for the case of N=4, R=10%, M=4 in 22-2 and 22-4.

Figure 24:
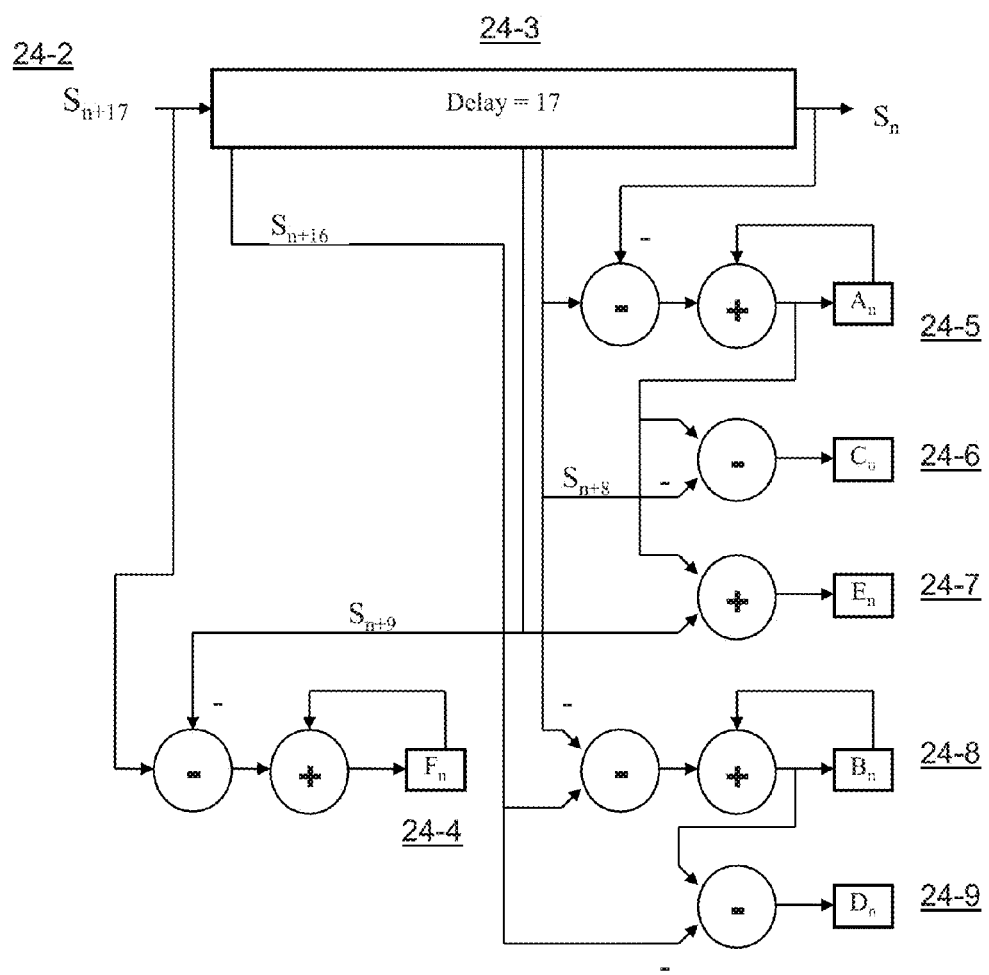
FIG. 24 shows a SISO implementation: Intermediate metric variable computation.

Referring now to FIG. 24, a SISO decoder can be viewed as consisting of four consecutive operations:
1) data metric generation and phase rotation
2) Branch metric generation and forward node update
3) Backward pass node update
4) Extrinsic generation and output Basically, the decoder structure can be viewed as a trellis of nodes arranged in columns. Each column corresponds to one symbol of the data stream to be decoded. The nodes within the columns represent the possible combinations of the relevant parameters for the symbol; in particular, the timing, phase, and symbol states. Each contains a numerical value proportional to the computed probability of the parameters which it represents. For FM0, one can use 512 nodes per column corresponding to the combinations of the 16 possible (quantized) phase states, the 16 possible timing states, and the two possible symbol values (0 and 1). The decoder operates by estimating the probability of each node's combination of parameters using metrics derived from the input data. First, probabilities for the nodes within columns are updated in the forward time direction, and then in reverse working backwards through the trellis. When these updates have been completed, the highest computed probability values through the trellis are chosen for the decoded output.

The inputs to the SISO decoder trellis computation are the data metrics which are derived from the sampled input stream. These are complex numbers, derived from $S_i$ sample values containing both I and Q components. Although there are a total of twelve data metrics which must be computed for each discrete sample time, N, six of these are simply negatives of the others as selected by D, the current data symbol state. The metrics, $M_N(\Delta t, D, d)$, where $\Delta t=\{-1,0,+1\}$ for timing change, $D=\{0,1\}$ for current data state, and $d=\{0,1\}$ for the next symbol value, may be computed from intermediate variables A, B, C, D, E, and F where:

$A = \Sigma S_i$, $(n \le i \le n+7)$=sum of 8 samples starting at time $n$ $B = \Sigma S_i$, $(n+8 \le i \le n+15)$=sum of 8 samples starting at time $n+8$ $C = \Sigma S_i$, $(n \le i \le n+6)$=sum of 7 samples starting at time $n$ $D = \Sigma S_i$, $(n+8 \le i \le n+14)$=sum of 7 samples starting at time $n+8$ $E = \Sigma S_i$, $(n \le i \le n+8)$=sum of 9 samples starting at time $n$ $F = \Sigma S_i$, $(n+9 \le i \le n+16)$=sum of 8 samples starting at time $n+9$ Referring now specifically to FIG. 24, the Intermediate Metric Variable Computation is shown. The FM0 data metrics $M_N(\Delta t, D, d)$, can then be derived from the intermediate variables as follows:

$M_N(0,0,0) = A_N - B_N = M_N(0,1,0)$ $M_N(1,0,0) = A_N - F_N = -M_N(1,1,0)$ $M_N(-1,0,0) = C_N - D_N = -M_N(-1,1,0)$ $M_N(0,0,1) = A_N + B_N = -M_N(0,1,1)$ $M_N(1,0,1) = E_N + F_N = -M_N(1,1,1)$ $M_N(-1,0,1) = A_N + D_N = -M_N(-1,1,1)$

Regarding phase rotation, the node update operation does not use the $M_N$ directly, but rather uses the real portion of the complex data metric vector as rotated by the interpolated phase, $\phi$, for each trellis branch. The rotated data metric is expressed as $R_N(\phi) = \text{Re}[M_N * e^{j\phi}]$. Since there are only sixteen evenly spaced discrete values for the node phase state, the interpolated branch phase can only take on 32 values and the product computation is greatly simplified. This is shown in the table below. Due to symmetry, 16 of the values are simply derived by negation of those calculated $\pi$ radians away. This means that all 32 rotations can be computed using 14 multipliers and 14 adder/subtractors. By sequencing the 6 values for $M_N$ as input into the phase rotator block, all 32 rotations of all twelve metrics may be computed in real-time at the sample rate. The outputs are fed to the node processors for branch metric computation where they are added or subtracted as needed.

Regarding backwards pass data metric storage and sequencing, the rotated data metrics must also be fed to the node update mechanism for the backwards node update pass. This requires either storage of the values computed for the forward pass, or else regeneration from either the data or data metrics. In either case storage memory is necessary. Using a 256-bit packet for purposes of illustration, storage of the rotated data metrics would require: 16×6×16×256=393,216 (16-bit) words of storage. At the other extreme, storage of the interpolated input data stream would require only 2×16× 256=8192 words of storage. While storing the interpolated data alone would save substantial memory, it requires that the metric generation shift-register (as shown above) be run in the reverse direction (from right-to-left), with the stored data fed to it reversed in time, in order to derive the data metrics for the backwards pass. The data resurrected data metric values must the be fed to the phase rotator as before. The $R_N(\phi)$ outputs must, however, be resequenced for presentation to the node processors. Recall that for the data metrics, $M_N(\Delta t, D, d) = -M_N(\Delta t, \sim D, d)$. This allowed the nodes with D=1 during the forward update pass simply to be fed the negatives of the $R_N(\phi)$'s for their D=0 counterparts. During the backwards pass, however, we are indexing the node processors by d instead of D since our source nodes are now later in time. Consequently, the $M_N(\Delta t, D, d)$ are no longer the arithmetic complements for d=0 vs. d=1; and instead the proper $R_N(\phi)$ must be stored, sequenced, and fed to the node processors.

Regarding branch metric generation and node updating, the branch metrics, $B_{XY}$, where X is the originating node within symbol column C, and Y the destination node in column C+1, are calculated as $B_{XY} = d * S_C + R_N(\phi, \Delta t, D, d) + U(\Delta\phi) + V(\Delta t)$ Where
d=the destination data state (i.e. input data bit value)
$S_c$=Soft input value for column C
$R_N(\phi, \Delta t, D, d) = \text{Re}[M_N(\Delta t, D, d) * e^{j\phi}]$, the rotated data metric
$U(\Delta\phi)$=one value for $\Delta\phi=0$, another for $\Delta\phi=+1,-1$
$V(\Delta t)$=one value for $\Delta t=0$, another for $\Delta t=+1,-1$ For FM0, there are 18 branches out of each source node, corresponding to the 3 values for $\Delta\phi$, times the 3 values for $\Delta t$, times 2 values for d. Accordingly there are also 18 branches into each destination node. To update the probability score, $Q_Y$ for a destination node, the $Q_X$ from the source node is added to the branch metric for all input branches leading directly to node Y. The value for the branch with the greatest sum is then selected and stored for $Q_Y$. The associated sample time value, $T_Y$, must also be stored, where $T_Y=T_X+16+\Delta t$ (or for reverse updates: $T_Y=T_X-16-\Delta t$), and $T_X$ is the stored time value from the source node for the selected branch.

Table for Phase Rotation
Data Metric $M_N = x + jy$
$a = \cos(\pi/8), b = \sin(\pi/8)$
$c = \sin(\pi/4) = \cos(\pi/4)$
$d = \cos(\pi/16), e = \sin(\pi/16)$
$f = \cos(3\pi/16), g = \sin(3\pi/16)$

| Angle $\phi$ | $e^{j\phi}$ Real Part | $e^{j\phi}$ Imaginary Part | Real Part of Metric Product |
|---|---|---|---|
| 0 | 1 | 0 | x |
| π/16 | d | e | dx − by |
| π/8 | a | b | ax − by |
| 3π/16 | f | g | fx − gy |
| π/4 | c | c | cx − cy |
| 5π/16 | g | f | gx − fy |
| 3π/8 | b | a | bx − ay |
| 7π/16 | e | d | ex − dy |
| π/2 | 0 | 1 | −y |
| 9π/16 | −e | d | −ex − dy |
| 5π/8 | −b | a | −bx − ay |
| 11π/16 | −g | f | −gx − fy |
| 3π/4 | −c | c | −cx − cy |
| 13π/16 | −f | g | −fx − gy |
| 7π/8 | −a | b | −ax − by |
| 15π/16 | −d | e | −dx − gy |
| π | −1 | 0 | −x |
| 17π/16 | −d | −e | −dx + ey |
| 9π/8 | −a | −b | −ax + by |
| 19π/16 | −f | −g | −fx + gy |
| 5π/4 | −c | −c | −cx + cy |
| 21π/16 | −g | −f | −gx + fy |
| 11π/8 | −b | −a | −bx + ay |
| 23π/16 | −e | −d | −ex + dy |
| 3π/2 | 0 | −1 | y |
| 25π/16 | e | −d | ex + dy |
| 13π/8 | b | −a | bx + ay |
| 27π/16 | g | −f | gx + fy |
| 7π/4 | c | −c | cx + cy |
| 29π/16 | f | −g | fx + gy |
| 15π/8 | a | −b | ax + by |
| 31π/16 | d | −e | dx + ey |

Regarding the data-driven update mechanism, the 16 values output from phase rotation for the rotated data metrics, $R_N=\text{Re}[M_N*e^{j\phi}]$ for D=0; $\phi=0$, π/8, π/4, 3π/8, π/2, 13π/8, 7π/4, and 15π/8, and specified N, d, and $\Delta t$; are fed to the node update mechanism. Since the remaining phase angles can also be derived from these 16 simply by negating the corresponding value n radians away; and since the values of the $R_N$ for D=1 are also just the negatives of those for D=0; each set of the eight $R_N$ values is sufficient for metric generation for the three branches ($\Delta\phi=-1, 0, +1$) from up to 32 source nodes (all nodes of the specified time state N) in the originating symbol column, C. These $R_N$ values may be labeled as negated for specified values of $\phi$ and D as $R_{N\phi D}$. For forward update, the $R_{N\phi D}$ are fed into 32 node processors. These processors compute the branch metrics $B_{XY}$ and sum them with the stored source node values, $Q_X$. The branch sums are passed to 16 branch selection units which compare six input branch values and select the largest for output. Each selection unit corresponds to a specific phase value, $\phi_Y$. The inputs are then the branches where $\phi_Y=\phi_X-(\Delta\phi*\pi/8)$, including the branches for both d=0 and d=1. The outputs of these selection units then feed back to the two node processors of corresponding phase where they are used to update the stored $Q_Y$ value for the destination node. A minimum of ninety-six clocks are required to update each symbol column. For the reverse update direction, the rotated metrics are regenerated starting with the most recent symbol, and proceeding back to the first. The later column nodes (to the right in the trellis) are used for the source values, $Q_X$, and the earlier column to the left are now updated as the $Q_Y$.

Figure 25:
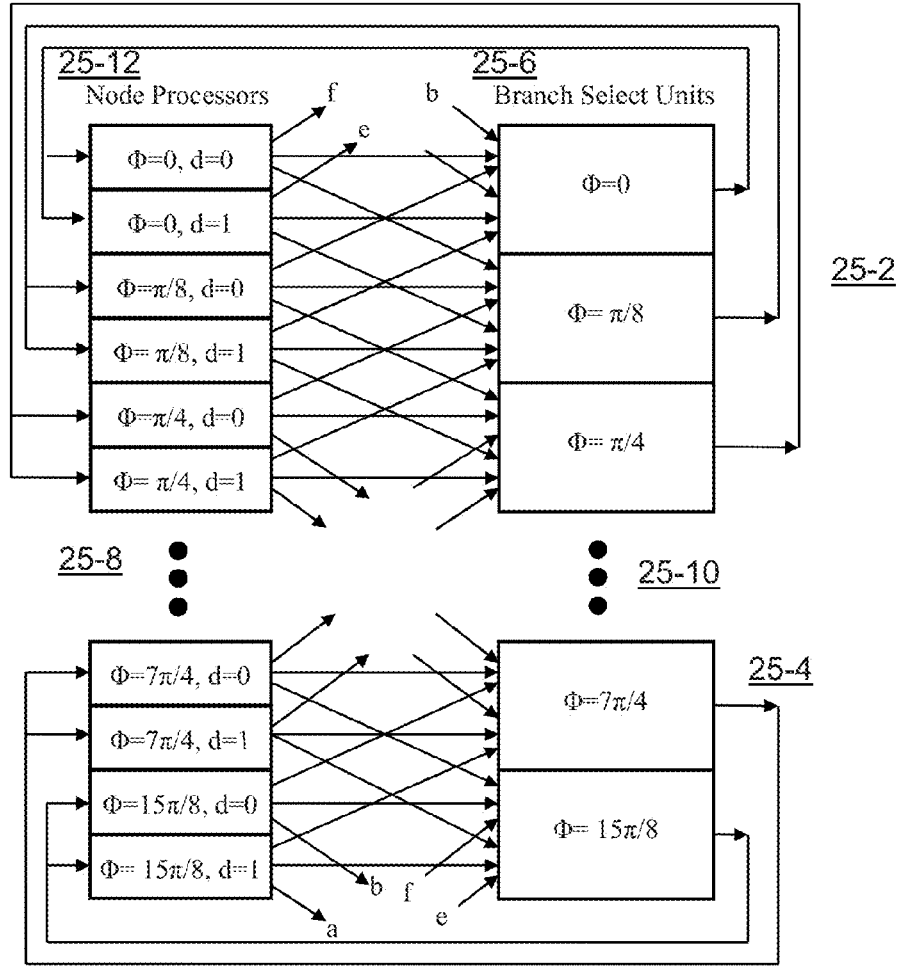
FIG. 25 shows a SISO implementation: Interconnect of node processors and branch select units.

Referring now to FIG. 25, the interconnection of node processors and branch select units are shown. For convenience, upwards arrows to $\Delta\phi=+1$ for forward updates, −1 for backwards updates. Downwards arrows are for branches with $\Delta\phi=-1/+1$ for forward/backward updates. Horizontal arrows are for $\Delta_\phi=0$.

Referring now to a source node processor, the proposed implementation consists of 32 node processors, each assigned to a particular data state value (0 or 1), and phase state (0 to 15). One of the eight $R_N$ values, or its arithmetic complement, as appropriate, are fed into each node processor corresponding to its assigned data and phase state values. Each processor consists of a node memory, a comparator, and four adders. This structure is shown in the diagram below. The node memory stores two values for each node, the probability score Q, and the time code T. Each processor's node memory contains all trellis nodes for a specific data state, D, and for a specific phase state value, $\phi$. It also contains the storage for the nodes in all trellis symbol columns, C, and for all sixteen time state values, N. For a 256 symbol decoder, 16×256=4096 node storage locations would be required. Local storage can be greatly reduced for large message sizes if paging to external memory is implemented.

The adders function to generate three branch metrics on each clock as the six $R_N$'s are fed in sequentially for each N. Therefore, a minimum of 96 clock cycles are required to update a symbol column. The adders serve to sum the various terms for the branch metric values $B_{XY}$ with the source node value, $Q_X$. The value $d*S_C$, being global to all processors, is developed externally. The value for $V(\Delta t)$ is also selected outside and summed with $d*S_C$ to be fed to the node processors as an input. Remaining inputs are the symbol column number C, which is concatenated with the timing sample state N to address a particular node within local storage; the rotated metric value $R_{N\phi D}$, and the two values for $U(\Delta\phi)$.

Referring now to destination node processing, as the $R_{N\phi D}$ (d,$\Delta t$) are fed into the source node processors, sequentially stepping through the six combinations of d and $\Delta t$ for each sample time N, the $B_{XY}+Q_X$ sums are output to the destination nodes for comparison and selection. Since d is fixed at each clock, there are only sixteen destination nodes for the 96 branches generated on each clock. This means there are six potential branches into each destination node at each clock which need to be compared and selected for the maximum. Along with the branch sum, the corresponding time value, $T_X$, from the source node for the winning branch must also be selected and stored. Destination processing can be performed by a seven-input maximum selector. The seventh input is used to compare any previous maximum partial results from the three update cycles required to examine all eighteen of the branches into a destination node. The results of each of these sixteen selectors is shared as input to the two node memories sharing the same time state value, N, but one with D=0, and one with D=1. It should be noted that the destination node $N_Y$ time-state value is not necessarily the same as the source $N_X$ value, but is rather equal to ($N_X+\Delta t$) modulo 16.

Referring now to time divergence, a possible problem with the basic source node processing as shown in the diagram above lies in the way in which the trellis tracks timing. There are several timing variables of interest. T refers to absolute sample time as numbered sequentially from the first data sample. Each node in the trellis also has a fixed 4-bit timing state value, N, ranging from 0 to 15. This 4-bit value always corresponds to the LS 4-bits of the absolute sample time assigned to that particular node. That assigned T can, however, change within the symbol column depending upon $T_{XY}$ value for the branch selected during node update, where $T_{XY}=T_X+\Delta t$. This $T_{XY}$ value should therefore be stored in the node when it is updated. When generating the branch metric values, it may be necessary to compare the stored $T_X$ for the node with the sample time $T_{N\phi D}$, as it is possible for the stored T assigned to a node with timing state N, to be different. This means that with the basic architecture of the diagram, multiple passes may be needed to present the rotated data metric for all node T values at a given N, φ, and D in order to generate all of the branch metrics. This is the reason for the equality comparator and the valid line shown in the diagram. In order to increase parallelism and reduce the number of clock passes required, it is highly desirable to present several possible rotated metrics in parallel to the node processor so that branches for varying T's, but with specified N, can be generated simultaneously. Source node processing architecture for multiple parallel T updates is shown below. Since total divergence is limited by the length of the data packet, and since the LS-4 bits are redundant, it is not necessary that all bits of $I_{XY}$ be stored and compared in the node processor. The additional $R_{N\phi D}$ can be made available by saving the 8 rotated metric values generated for each clock in delay storage of length 96 clocks for each additional $R_{N\phi D}(T)$ to be presented. This requires four 18K block RAM for every two additional values of T, if the RAM is operated at the same clock rate as the branch metric generator.

Figure 26:
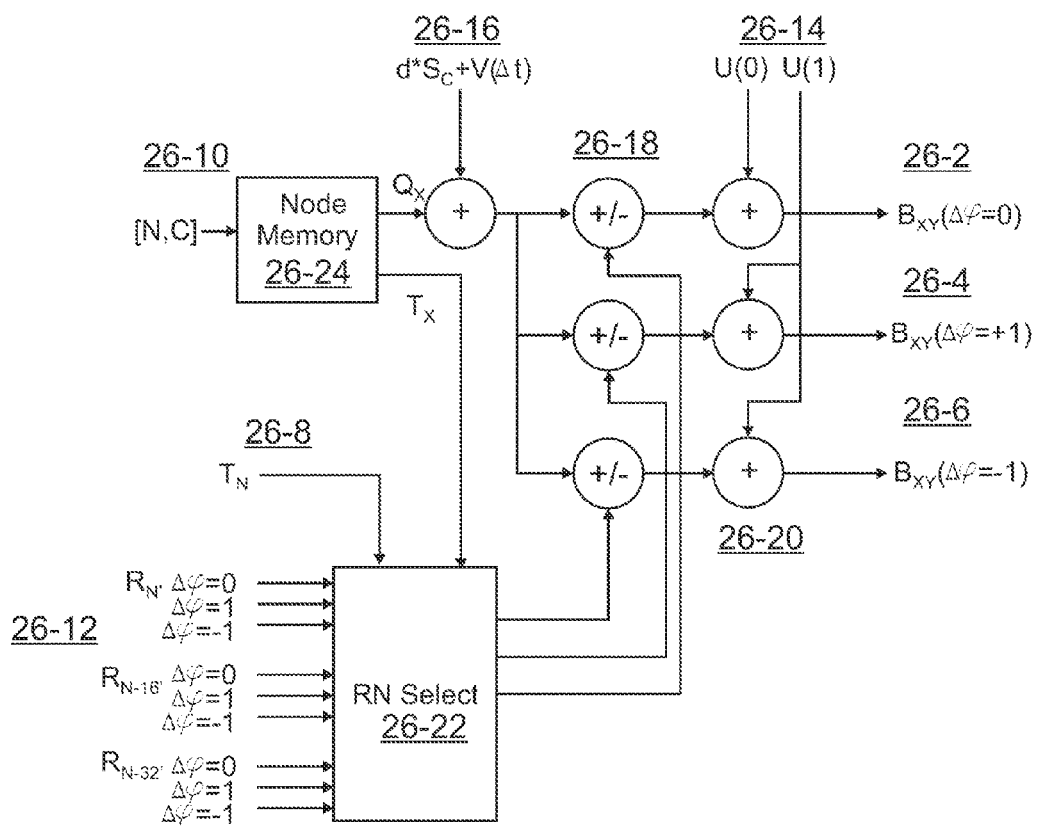
FIG. 26 shows a SISO implementation: Extended parallel source node processing.

Referring now to FIG. 26, the extended parallel source node processing is shown.

Figure 27:
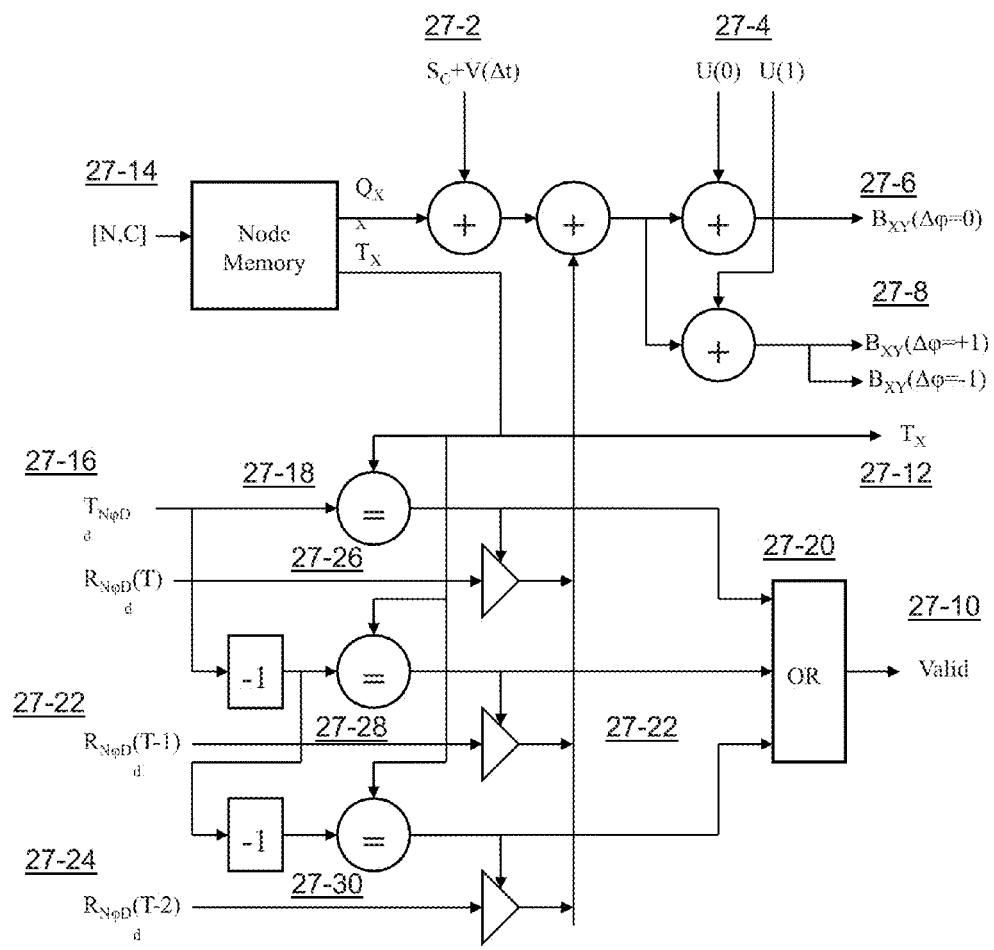
FIG. 27 shows a Forward and Backward processor.

Referring now to FIG. 27, the forward and backward processing is shown.

| φ | Data State | Phase State | Forward $R_{ND}(\phi)$ | Backward $R_{Nd}(\phi)$ |
|---|---|---|---|---|
| 0 | 0 | 0 | $R_{NX}(0)$ | $R_{N0}(0)$ |
| 0 | 1 | 0 | $-R_{NX}(0)$ | $R_{N1}(0)$ |
| π/8 | 0 | 1 | $R_{NX}(\pi/8)$ | $R_{N0}(\pi/8)$ |
| π/8 | 1 | 1 | $-R_{NX}(\pi/8)$ | $R_{N1}(\pi/8)$ |
| π/4 | 0 | 2 | $R_{NX}(\pi/4)$ | $R_{N0}(\pi/4)$ |
| π/4 | 1 | 2 | $-R_{NX}(\pi/4)$ | $R_{N1}(\pi/4)$ |
| 3π/8 | 0 | 3 | $R_{NX}(3\pi/8)$ | $R_{N0}(3\pi/8)$ |
| 3π/8 | 1 | 3 | $-R_{NX}(3\pi/8)$ | $R_{N1}(3\pi/8)$ |
| π/2 | 0 | 4 | $-R_{NX}(3\pi/2)$ | $-R_{N0}(3\pi/2)$ |
| π/2 | 1 | 4 | $R_{NX}(3\pi/2)$ | $-R_{N1}(3\pi/2)$ |
| 5π/8 | 0 | 5 | $-R_{NX}(13\pi/8)$ | $-R_{N0}(13\pi/8)$ |
| 5π/8 | 1 | 5 | $R_{NX}(13\pi/8)$ | $-R_{N1}(13\pi/8)$ |
| 3π/4 | 0 | 6 | $-R_{NX}(7\pi/4)$ | $-R_{N0}(7\pi/4)$ |
| 3π/4 | 1 | 6 | $R_{NX}(7\pi/4)$ | $-R_{N1}(7\pi/4)$ |
| 7π/8 | 0 | 7 | $-R_{NX}(15\pi/8)$ | $-R_{N0}(15\pi/8)$ |
| 7π/8 | 1 | 7 | $R_{NX}(15\pi/8)$ | $-R_{N1}(15\pi/8)$ |
| π | 0 | 8 | $-R_{NX}(0)$ | $-R_{N0}(0)$ |
| π | 1 | 8 | $R_{NX}(0)$ | $-R_{N1}(0)$ |
| 9π/8 | 0 | 9 | $-R_{NX}(\pi/8)$ | $-R_{N0}(\pi/8)$ |
| 9π/8 | 1 | 9 | $R_{NX}(\pi/8)$ | $-R_{N1}(\pi/8)$ |
| 5π/4 | 0 | 10 | $-R_{NX}(\pi/4)$ | $-R_{N0}(\pi/4)$ |
| 5π/4 | 1 | 10 | $R_{NX}(\pi/4)$ | $-R_{N1}(\pi/4)$ |
| 11π/8 | 0 | 11 | $-R_{NX}(3\pi/8)$ | $-R_{N0}(3\pi/8)$ |
| 11π/8 | 1 | 11 | $R_{NX}(3\pi/8)$ | $-R_{N1}(3\pi/8)$ |
| 3π/2 | 0 | 12 | $R_{NX}(3\pi/2)$ | $R_{N0}(3\pi/2)$ |
| 3π/2 | 1 | 12 | $-R_{NX}(3\pi/2)$ | $R_{N1}(3\pi/2)$ |
| 13π/8 | 0 | 13 | $R_{NX}(13\pi/8)$ | $R_{N0}(13\pi/8)$ |
| 13π/8 | 1 | 13 | $-R_{NX}(13\pi/8)$ | $R_{N1}(13\pi/8)$ |
| 7π/4 | 0 | 14 | $R_{NX}(7\pi/4)$ | $R_{N0}(7\pi/4)$ |
| 7π/4 | 1 | 14 | $-R_{NX}(7\pi/4)$ | $R_{N1}(7\pi/4)$ |
| 15π/8 | 0 | 15 | $R_{NX}(15\pi/8)$ | $R_{N0}(15\pi/8)$ |
| 15π/8 | 1 | 15 | $-R_{NX}(15\pi/8)$ | $R_{N1}(15\pi/8)$ |

Extrinsic generation may be performed as the nodes are updated in the reverse direction. A reliability measure is also computed. The extrinsic is computed as $\text{Max}(\alpha_X+B_{XY}+\beta_Y)$ over each column.

It is clear to a person having ordinary skill in this art that the techniques described above may be applied to a communication method or system for processing a modulated signal with random data, and/or phase and/or unknown timing to estimate received data sequences or packetized data. The receiver may use iterative processing with soft-input-soft-output (SISO) components to combine channel decoding with equalization, demodulation, phase tracking, symbol timing, synchronization and interference cancellation as part or in whole. These techniques may be used for any wireless communication systems to model the observation space. These techniques may be used for sensory receiver system for detecting signals in presence of noise and channel distortion utilizing iterative method to detect the signal. A communication system may use these techniques for maximum likelihood sequence estimation which may include lattice, trellis or tree structures or products thereof for joint estimation of phase, timing, data and/or baud rate. Such techniques may also be used in signal detection systems utilizing iterative methods for optimal detection of the signal in the presence of white noise and channel distortion such as those employing in-door wireless channels, out-door wireless channels, both line-of-sight or non-line of sight communications, wire line channel such as copper and fiber wires, underground or underwater sonar, recording channels such as hard disk storage and both volatile and non-volatile memory and/or combinations of any of these channels.

The disclosed techniques are useful in the detection of packetized data with unknown data pulse duration, random phase and unknown data, any combination or thereof. They are useful in digital packet radio systems employing soft-input-soft-output (SISO) decoding methods with or without cascaded iterative decoder and with or without channel encoding/decoding. These techniques may be used in communication systems employing channel coding methods including algebraic block codes, convolution and turbo codes, low density parity check, repeat-accumulate codes, and product codes cascaded with SISO decoders exchanging extrinsic information to optimally decode the user data. Similarly, these techniques may be used in communication systems employing channel coding including coding which can be represented via planar graph such as bipartite, tree or trellis diagram whereby the posteriori probabilities (extrinsic information) of each state can be computed and iteratively improved. Such communication systems may employing belief propagation method to decode the received sequence and exchange extrinsic information with the soft-input-soft-output decoder. A communication system or packet radio timing synchronization may be provided for any modulation scheme such as multi-level phase, position, amplitude in quadrature and in-phase (one or both). Further, such systems may be embedded in portable or stationary devices, in hubs, central office or network edge devices and may be implemented in software, such as a "Software Defined Radio", on special purpose or general purpose host computer and offered as a web service or general purpose signal processing platform.

Figure 28:
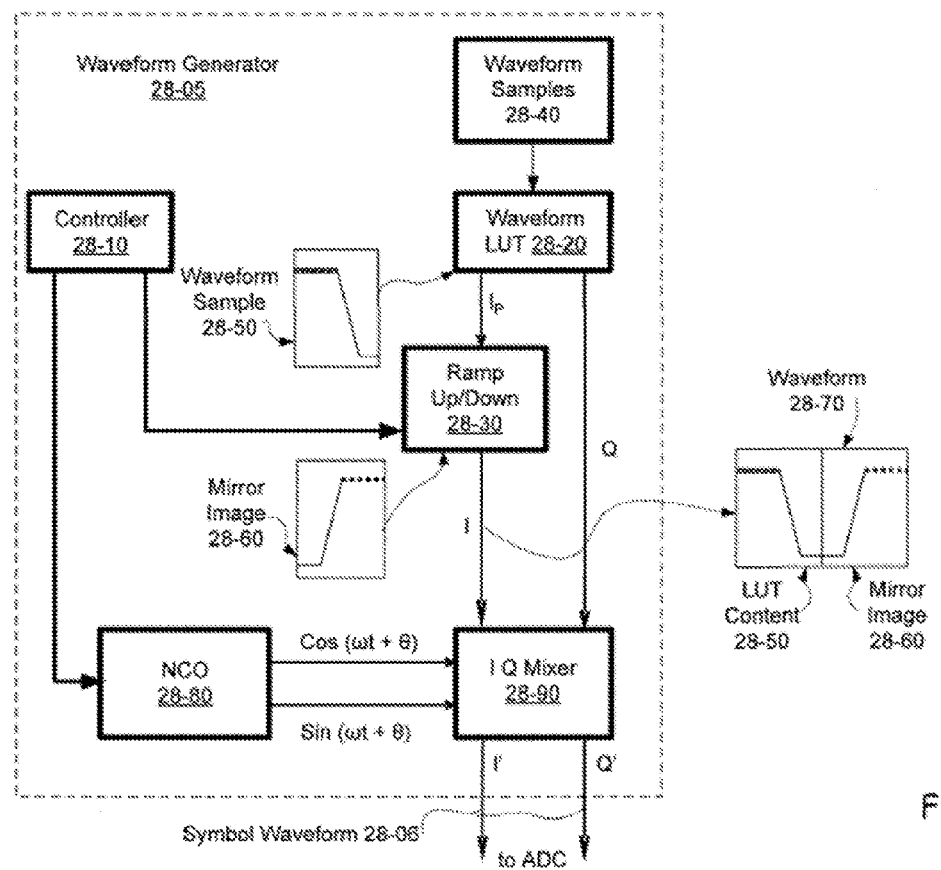
FIG. 28 is a high-level block diagram of a symbol waveform generator.

Referring now to FIG. 28, in a preferred embodiment, a digital transmit waveform generator 28-05 suitable for low complexity implementation may be used to generate an arbitrary symbol waveform 28-07 that is symmetric in time, for example, for use as a waveform generator for RF modulations employed by the EPC Global Specification for RFID Air Interface. For this RFID application, the waveforms may be single-sideband amplitude-shift keying (SSB-ASK), double-sideband amplitude-shift keying (DSB-ASK), and Phase-reversal amplitude-shift keying (PR-ASK).

Referring now to FIG. 28, a high-level block diagram of waveform generator 28-05 is shown. The type of waveform to be generated may be selected by operation of controller 28-10. For RFID applications, the selectable waveforms may be SSB-ASK, DSB-ASK, and PR-ASK. Pulses of 6.25, 12.5 and 25 microseconds are accommodated. The waveform generator 28-05 may be frequency agile so that it can be used with frequency hopping and or FDMA mode of operations. The frequency range and resolution is a function of the logic clock as well as the bit precisions used in the implementation of waveform generator 28-05. An arbitrary phase offset can also be added to the waveform pulse. Frequency and phase may be selected via controller 28-10.

The reduced complexity waveform generation architecture may include a Waveform Look Up Table (LUT) 28-20 and a Ramp-Up/Ramp-Down block 28-30. Portions of waveforms, such as waveform samples 28-40, may be stored in LUT table 28-20. The LUT table 28-20 may store only half of the steady-state portion, i.e. LUT portion 28-50, of sample waveform 28-40. The other half of the waveform, mirror image portion 28-60, may be generated by up-down block 28-30 and therefore need not be stored.

In operation, in response to a control signal from controller 28-10, waveform LUT 28-20 applies the LUT content, such waveform sample 28-50, to ramp-up/down block 28-30 which generates mirror image 28-60, the transient portion of the waveform 28-70, in hardware. When compared to a conventional waveform generator, the memory usage of waveform look up table 28-20 is drastically reduced. This reduction comes from two areas. First, the number of waveform sample points is reduced by more than a factor of 2 because only one half of the waveform sample need be stored. To be precise, the storage may be (½-T_transient/Tsym) of the full waveform, where T_transient is the transient duration and Tsym is the symbol time. More importantly, the sampling spacing of the waveform in LUT 28-20 can be reduced to the transient duration. This is because the ramp-up/ramp-down block 28-30 generates the transient portion (mirror image 28-60) of waveform 28-70 using the higher sampling rate of the waveform generator output.

In RFID applications, the quadrature (Q) channel of the waveform symbol to be generated may be a constant. Hence, ramp-up/ramp-down block 28 may be required for the in phase (I) channel only.

A conventional numerically controlled oscillator (NCO) 28-80 may be used to generate the in-phase and quadrature IF carriers, with the desired frequency and phase offset, in response to controller 28-10. The primary purpose of NCO 28-80 is to shift the IF signal frequency within the desired passband so that the SSB signal can be centered on the nominal carrier frequency, without having to shift the actual fixed frequency plan of the RF up-conversion. The quadrature carriers are fed into the in-phase and quadrature (I-Q) mixer 28-90 to generate the IF waveform, I' and Q', with the appropriate symbol. These signals may be applied to a transmitter ADC.

Figure 29:
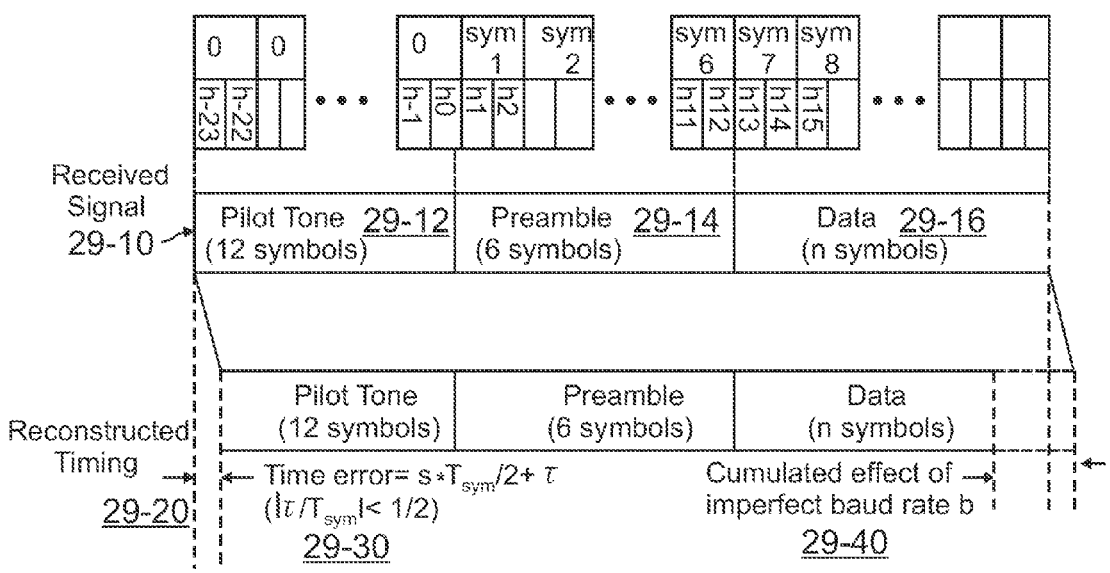
FIG. 29 is an illustration of RFID clock and data burst recovery.

In many embodiments, the symbol rate of the symbols transmitted by an RFID tag can vary. By constraining the symbols that can be transmitted by an RFID tag to a predetermined standard, knowledge of the imposed constraints can be used to estimate the symbol rate of the information transmitted by the RFID tag. Referring now to FIG. 29, an illustration of synchronizing bursty data, with application to an RFID system, is shown. In the RFID standard, received signal 29-10 may consist of a pilot tone 29-12, preamble 29-14, and data 29-16. The pilot tone 291-12 may consist of 12 "zero" symbols and preamble 29-14 may be a fixed pattern of 6 symbols. Data 29-16 may include "n" data symbols to be processed by the data burst synchronizer. Note that n can encompass the whole data sequence but it can also be a subset of the sequence.

Since for the RFID standard FM0 and Miller codes, each symbol may only switch sign in the middle, it is convenient to consider half-symbols, such as half symbols h23 and h22, representing the half symbols or (binary $h_k$'s) of the first "0" in pilot tone 29-12 in FIG. 29. For the FM0 code, every symbol transition also introduces a sign change.

The task of the data burst synchronizer is to reconstruct the timing, such as reconstructed timing 29-20, from received signal 29-10, to facilitate data detection and processing. This task includes finding the start time of the data burst (identified by the end of preamble 29-14) and matching the reconstructed symbol clock frequency with the received symbol clock frequency, or baud rate, of received signal 29-10. If the reconstructed timing 29-20 is not aligned with the received signal, it may have a timing error 29-30 which may consist of s integer and $\tau$ • fractional half-symbols. Here $\tau$ is normalized to the half-symbol time $T_s/2$. Error in the reconstructed baud rate may result in insertion of extraneous, or deletion of desired, data symbols as indicated by the cumulative effect of imperfect baud rate 29-40 illustrated at the end of data 29-16 shown in reconstructed timing 29-20 in the figure.

An asynchronous data burst synchronizer, suitable for digital implementation, may be optimized by maximizing a metric that is a function of the reconstructed sample baud rate and timing error. The metric may be generated by correlating a known data structure with the received data burst signal 29-10, which may include pilot tone 29-12, preamble 29-14, and data 29-16. The optimum received signal timing and clock frequency can be found by correlating a replica of the known portion of the transmit data waveform with a set of timing and clock frequency hypotheses spanning the frequency and timing uncertainty of the arriving signal. The best hypothesis will yield the highest correlation metric. Since every symbol transition introduces a sign change in FM0, the optimum correlator also takes advantage of this information. The following metric may be used for the FM0 code:

$$M(b, \tau, s) = \left| \sum_{k=-23}^{0} r_{k+s}(b, \tau) h_k + \sum_{k=1}^{12} r_{k+s}(b, \tau) h_k \right| + \sum_{k=7}^{n+6} |r_{2k+1+s}(b, \tau) - r_{2k+s}(b, \tau)| \quad (42)$$

where $r_i(b, \tau)$ denotes the reconstructed half-symbol at time i using a baud rate b and the timing hypothesis s+$\tau$, $h_k$ is the binary half-symbols for the pilot and preamble. The first term in equation (42) is the pilot correlation for the 2×12 half-symbols and the preamble correlation for 2×6 half-symbols.

The second term is a correlation of the sign change during the symbol transitions of the FM0 code. This term is not used for the Miller code. Because of the pilot preamble structure as well as the transition operation, the metric (42) is independent of any dc bias.

Figure 30:
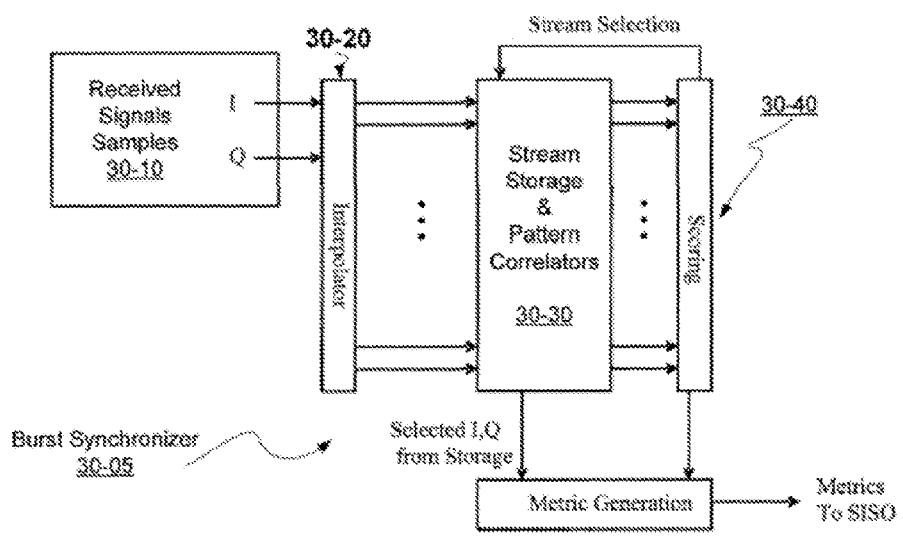
FIG. 30 is a functional architecture of the RFID clock and data burst recovery circuit.

Referring now to FIG. 30, a functional architecture of optimal burst synchronizer 30-05 is shown, based on maximizing the metric in equation (42). The synchronizer first interpolates I and Q samples 30-10 from the receiver analog-to-digital converter (ADC) in interpolator 30-20. After correlating with the fixed pattern including the preamble, an estimate is derived for the baud rate and starting position of the tag response data.

The frequency tolerance specified by the EPC spec for the highest-speed stream (640 kbps) is +/−15%. Interpolator 30-20 develops a sufficient number of streams of signal data samples at baud rates spaced to span the frequency uncertainty range. The interpolator 30-20 performs a linear interpolation of two adjacent input data samples lying closest to the desired sample point in time from the selected baud rate.

I and Q values of each interpolated streams are correlated with the fixed data pattern in stream storage and pattern correlator 30-30. This correlation is performed at the selected sample rate for each interpolated stream. Since the fixed data pattern is +1/−1, the correlation can be accomplished by summing the number of interpolated samples for each half-symbol, and then adding or subtracting these sums depending upon the expected preamble waveform at the corresponding position.

The maximum of the metric of all correlator output is chosen by the scorer 30-40 as the best estimate for preamble position in time and also as the best estimate of the incoming baud rate of the tag response. The interpolated I-Q sample values for the chosen sample rate are then used to compute the data-metrics for SISO processing. These are then fed to a SISO block, as shown above, for example, in FIGS. 2b, 3, 4, 9c, 9d, 10, 11 and 12b.

Figure 31:
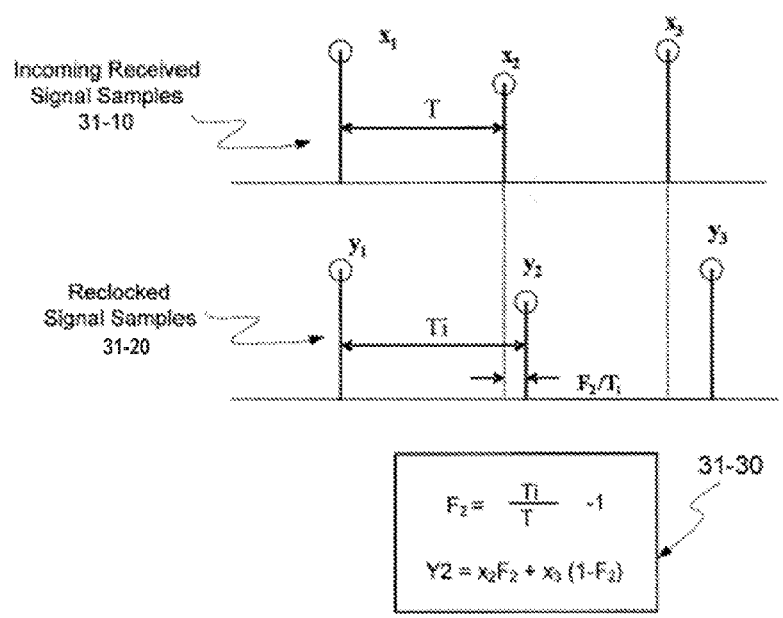
FIG. 31 is an illustration of the interpolator algorithm.

Referring now to FIG. 31, an interpolation algorithm suitable for digital implementation, using a digital differential delay analyzer and two multipliers, for appropriately weighting the nearest input sample values is shown. Interpolator 30-20 generates re-clocked samples 31-20 at the desired rate $1/T_i$ from the incoming received signal samples 31-10 which are at a fixed rate of $1/T$. In this illustration, the reconstructed signal is at a lower sampling rate. An interpolated sample is a weighted sum of the two nearest neighbor of the incoming signal stream. For example, the interpolated signal sample $y_2$ is computed via the weighted sum in computer block 31-30. In general, the interpolation can be accomplished with the recursions:

$$y_{m+1} = F_{m+1} x_p + (1 - F_{m+1}) x_{p+1}$$

$$F_{m+1} = \text{frac}(S_{m+1})$$

$$p = \lfloor S_{m+1} \rfloor$$

$$S_{m+1} = S_m + T_i/T;$$

$$S_1 = 0; F_1 = 0; m = 1, 2, \ldots \quad (43)$$

where $F_m$ is the weighting factor for the closest left incoming sample and $(1-F_m)$ is the weighting factor for the right sample. In equation (43), frac (•) denotes the fractional part of a real value and $\lfloor • \rfloor$ denotes the integer part of a real value. In the digital differential delay analyzer, the ratio $T_i/T$ is added to an accumulator S every $T_i$. Then $F_m$ and p are computed from the accumulated sum as indicated in equation (43) above. The process is similar if the reconstructed symbol clock frequency is higher than the input, except more than a single interpolated sample may need to be generated during an input sample period.

Figure 32:
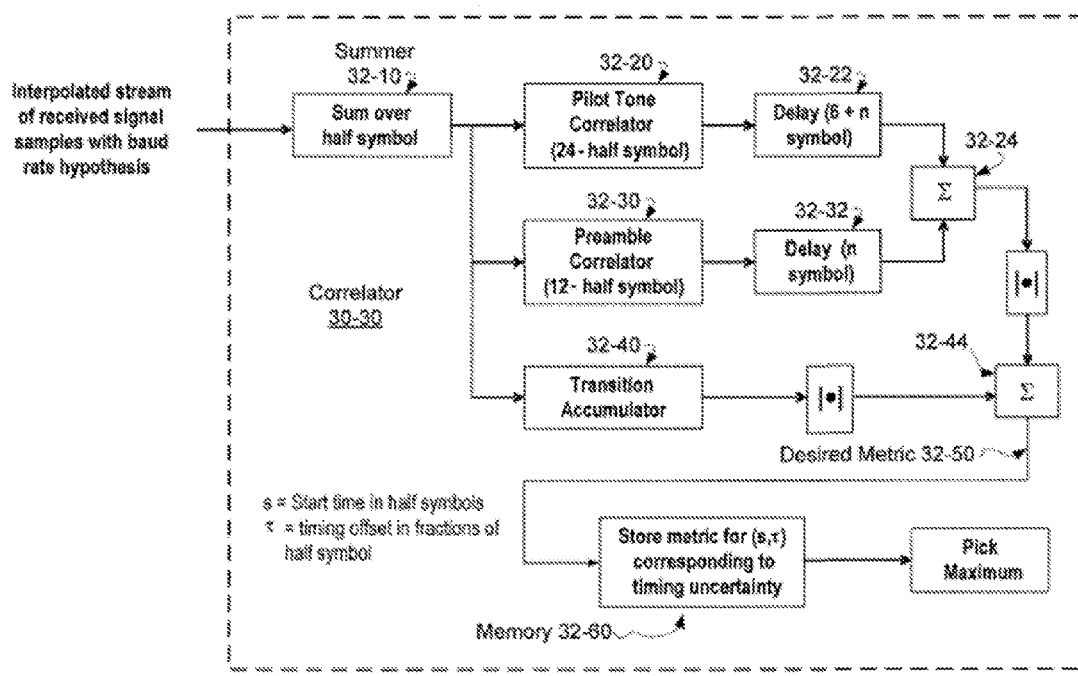
FIG. 32 is a detailed block diagram of the data burst recovery correlator.

Referring now to FIG. 32, a more detailed block diagram of the correlator block 30-30 in FIG. 30 is shown. To reduce the number of computations, the interpolated stream is first summed over a half-symbol worth of signal samples in adder 32-10. The half-symbol sum is then correlated with the pilot pattern 32-20, the preamble pattern 32-30, and for FM0 only, the symbol transition pattern 32-40. The results are properly delay-matched, for example, in 6+n symbol delay 32-22 and n symbol delay 32-32 and summed in adder 32-24 and combined with the output of transition accumulator 32-40 in adder 32-44 to form the desired metric 32-50. Note that since the computation is at the interpolated sample rate, half-symbol correlation corresponding to a different sample start time may be generated every sample clock. Desired metric 32-50 may be stored in memory location 32-60 where s is the start time for half symbols and τ is the start time offset in fractions of a half symbol.

Figure 33:
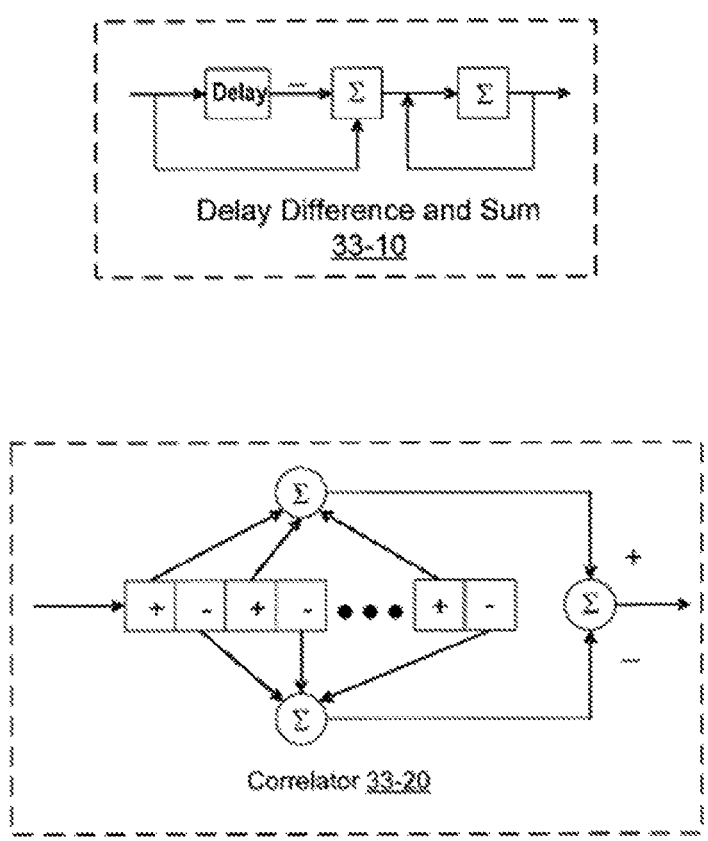
FIG. 33 is a depiction of two applicable digital building blocks for the correlator.

Referring now to FIG. 33, two digital building blocks are shown that could be used to implement the functional blocks illustrated in FIG. 31. The half-symbol summation can be implemented with the difference and sum block 33-10. The delay (in number of signal samples) may be selected to match the half-symbol time. Since the fixed half-symbol pattern is +/−1, the pilot and preamble correlator can be implemented with delay registers and accumulators as shown in correlator 33-20. Here the shift register positions corresponding to +1 fixed pattern are summed separately than those corresponding to −1. Then the −1 intermediate sum is subtracted from the +1 intermediate sum in the last step. The transition correlator can be implemented using the basic structure of difference and sum block 33-10 in which case the delay is set to match a symbol time.

Figure 34:
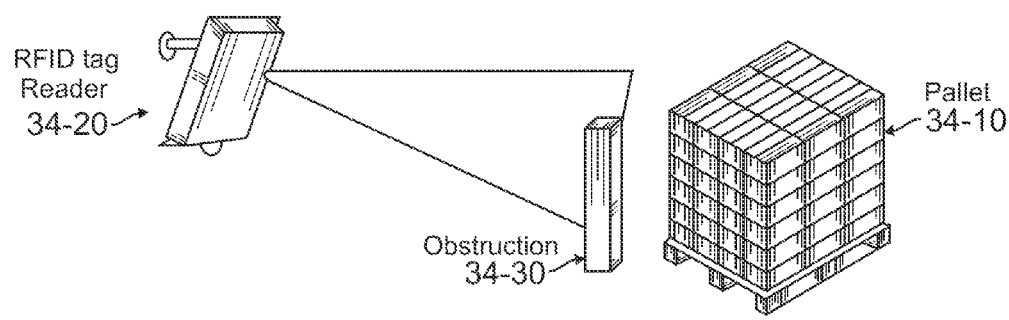
FIG. 34 is an illustration of a pallet code technique for reading RFID tags blocked by obstructions.

Referring now to FIG. 34, an illustration of a pallet code technique used to read RFID tags blocked by obstructions is shown. FIG. 34 illustrates tag blockage in an RFID system such as reading a batch of tags affixed to merchandise sitting on a pallet. The RFID tags on pallet 34-10 are to be scanned by a reader 34-20 but some of the tags are blocked from its view by an obstruction 34-30. The goal is to reconstruct lost data in the blocked tags by reading the remaining non-blocked tags.

A "Pallet code" for reading blocked RFID tags is disclosed herein. Information for each tag in a batch may be shared among all tags in the batch to be read in the form of redundancy provided by the coding scheme. The redundant bits could be stored in the reader and used later to read the tags. Alternatively, the redundant bits could be distributed among the tags by appending the bits to the tag data packet.

Figure 35:
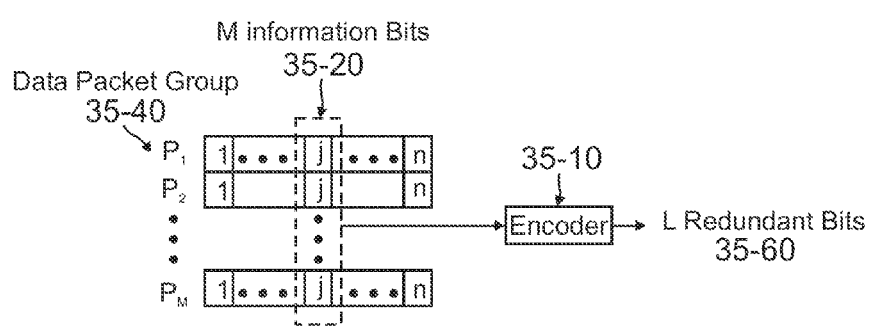
FIG. 35 is an illustration of the encoding of redundant bits for the pallet code.

Referring now to FIG. 35, one implementation of a Pallet code is disclosed. Assume the batch of tags to be read, for example a group of tags on units contained on pallet 34-10, consists of M tags and each tag to be read contains a data packet Pi of n bits as shown in data packet group 35-40 including data packets $P_1$ to $P_M$. The same encoder 35-10 receives M information bits 35-20 from bit position j of each data packet in data packet group 35-40 and produces L redundant bits 34-60. The resulting M·L redundancy bits could be stored in the reader 34-20 or equally shared by the data packets in data packet group 35-40 by appending the additional redundant data to the tag data packet from group 35-40. The decoder in RFID tag reader 34-20 uses the redundant bits to reconstruct data from the tags blocked by obstruction 34-30 shown in FIG. 34.

To conserve bandwidth, it is desirable to limit the L overhead bits to a small number so that the code rate R=M/(M+L) is close to 1, say between 0.7 and 0.99. Yet the code correction capability improves with redundancy. Theoretically, for large M we should be able to correct all blocked packets if the probability of blockage is independent and less than (1−R). The selection of the code rate R is a tradeoff between available bandwidth and expected blockage environment.

If the number of tags M is small, it may be preferable to use short block-length high-rate codes such as BCH or RS codes because of lower decoder complexity. If M is more than 500, high rate LDPC codes may be more attractive. For example, if M=999 and L=111 for a code rate of 0.889, a (4, 36) regular LDPC code could be used.

Figure 36:
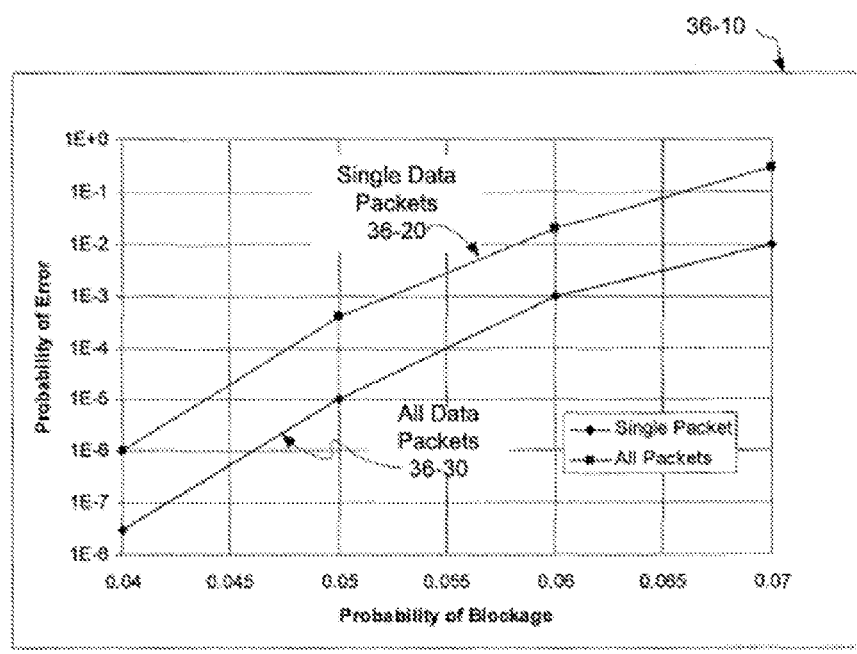
FIG. 36 is a simulation of the Pallet code packet error rate performance.

Referring now to FIG. 36, a simulated performance of this code, using a simple message-passing algorithm, is shown on bipartite graph 36-10 showing the probabilities of error, as a function of the probability of blockage, for single data packets 36-20 and all data packets 36-30. For example, it shows that all tags can be recovered with $10^{-6}$ probability of error if the probability of blockage is 4%. In the simulation, a binary symmetric channel is assumed—the variable nodes in the bipartite graph are either correct (not-blocked) or erased (blocked).

Figure 37:
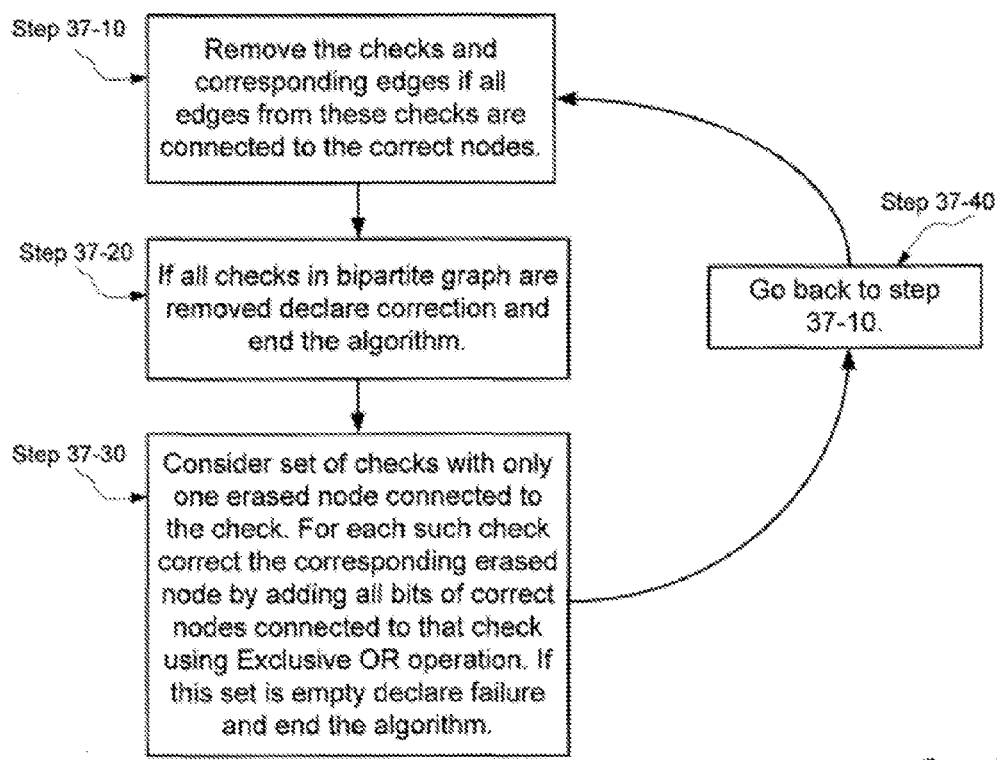
FIG. 37 is an illustration of a simple message-passing algorithm.

Referring now to FIG. 37, the simple message-passing decoding algorithm used in the simulation is shown. In summary, for each such check, correct the corresponding erased node by adding all bits of correct nodes connected to that check using an Exclusive OR operation. If this set is empty, declare failure and end the algorithm. In particular, in step 37-10, the checks and corresponding edges are removed if all edges from these checks are connected to the correct nodes. In step 37-20, if all checks in bipartite graphs are removed, declare correction and end the algorithm. In step 37-30, consider set of checks with only one erased node connected to the check. In step 37-10, the algorithm returns to step 37-10 to process any remaining checks. This algorithm is amenable to low complexity implementation.

What is claimed:

1. A receiver configured to decode a data signal modulated onto a carrier wave, where the data signal has a phase and timing that is ambiguous, comprising:
   an analyzer and equalizer configured to filter an input signal;
   an estimation block configured to obtain a baseband representation of the modulated data signal by mixing the filtered input signal with the carrier wave; and
   a coherent detector configured to perform recovery of the phase and timing of the modulated data signal in the presence of noise and to determine a sequence of data symbols;
   wherein:
      the sequence of data symbols includes a preamble known by the receiver;
      the coherent detector includes an interpolator that is configured to sample and interpolate the modulated data signal to generate a plurality of streams possessing different symbol rates;
      the coherent detector includes a correlator that is configured to select a stream using at least the correlation between the stream and the known preamble; and
      the coherent detector is configured to provide the selected stream to a decoder.

2. The receiver of claim 1, wherein the analyzer and equalizer is configured to filter at least one source of narrowband interference from the input signal.

3. The receiver of claim 2, wherein the analyzer and equalizer includes a low latency notch filter, where the location of the notch can be moved to eliminate sources of narrowband interference from the input signal.

4. The receiver of claim 3, wherein:
   the notch filter is implemented using a filter bank with an impulse response determined by a set of filter bank coefficients; and
   the analyzer and equalizer estimates the channel impulse response and uses it to determine the filter bank coefficients.

5. The receiver of claim 3, wherein the notch filter is configured to adapt the location of the notch based upon an output of the detector.

6. The receiver of claim 1, wherein the estimation block receives the carrier wave as an input to the estimation block.

7. The receiver of claim 1, wherein the estimation block is configured to estimate the frequency of the carrier wave.

8. The receiver of claim 7, wherein:
   the estimation block is configured to control a programmable oscillator; and
   the estimation block is configured to estimate the frequency difference between the transmitted carrier wave and the output of the programmable oscillator and to reconfigure the programmable oscillator to reduce the frequency difference.

9. The receiver of claim 1, wherein the coherent detector includes decoder is a coherent decoder that determines the sequence of symbols with the maximum a posteriori probability of having been transmitted given the modulated data signal.

10. The receiver of claim 9, wherein the coherent decoder is configured using a finite state machine to model the observation space.

11. The receiver of claim 10, wherein the finite state machine incorporates symbol phase estimation.

12. The receiver of claim 10, wherein the finite state machine incorporates symbol timing estimation.

13. The receiver of claim 9, wherein:
   the modulated data signal is channel coded;
   the coherent decoder comprises:
      a soft metric estimator;
      a de-interleaver;
      a soft input soft output (SISO) decoder;
      an interleaver; and
      a channel code decoder;
      the soft metric estimator is configured to calculate initial soft metrics using the modulated data signal and a fixed phase value, timing value and channel state estimated by the channel code decoder during a previous iteration;
      the de-interleaver is configured to de-interleave an input generated by subtracting the output generated by the interleaver in a previous iteration from the initial soft metrics;
      the SISO decoder is configured to generate updated soft metrics using the output of the de-interleaver;
      the interleaver is configured to interleave an input generated by subtracting the output of the de-interleaver from the updated soft metrics;
      the channel code decoder is configured to estimate a phase value, a timing value and channel state from the output of the interleaver; and
      the coherent decoder is configured to iterate until the initial soft metrics and the updated soft metrics converge.

14. The receiver of claim 13, wherein:
the coherent decoder determines the maximum soft metric and outputs the maximum soft metric; and
coherent decoder uses predetermined probabilities to augment at least some of the maximum soft metrics.

15. The receiver of claim 13, wherein the channel code decoder includes a soft input soft output forward error correction decoder.

16. The receiver of claim 1, wherein:
at least a portion of the sequence of data symbols is constrained to a predetermined set of allowed symbol transitions; and
the correlator is configured to select the stream using at least the correlation between the stream and the known preamble and the correlation between the stream symbol transitions and the allowed symbol transitions.

* * * * *

UNITED STATES PATENT AND TRADEMARK OFFICE
CERTIFICATE OF CORRECTION

PATENT NO.        : 8,981,908 B2
APPLICATION NO.   : 14/047989
DATED             : March 17, 2015
INVENTOR(S)       : Ramin Sadr It is certified that error appears in the above-identified patent and that said Letters Patent is hereby corrected as shown below:

In the Claims

Column 40, Claim 9, lines 27 – 28, delete "coherent detector includes" and add --decoder is--.

Signed and Sealed this
Thirtieth Day of June, 2015

Michelle K. Lee
*Director of the United States Patent and Trademark Office*